(12) United States Patent
Song et al.

(10) Patent No.: US 12,512,068 B2
(45) Date of Patent: Dec. 30, 2025

(54) DISPLAY DEVICE

(71) Applicant: Samsung Display Co., Ltd., Yongin-si (KR)

(72) Inventors: Heerim Song, Yongin-si (KR); Soil Yoon, Yongin-si (KR); Cheol-Gon Lee, Yongin-si (KR); Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/657,656

(22) Filed: May 7, 2024

(65) Prior Publication Data

US 2025/0014525 A1 Jan. 9, 2025

(30) Foreign Application Priority Data

Jul. 3, 2023 (KR) ........................ 10-2023-0085488

(51) Int. Cl.
| | |
|---|---|
| *G09G 3/3275* | (2016.01) |
| *G06V 40/13* | (2022.01) |
| *G09G 3/32* | (2016.01) |
| *G09G 3/3233* | (2016.01) |
| *H10K 59/131* | (2023.01) |

(Continued)

(52) U.S. Cl.
CPC ....... *G09G 3/3275* (2013.01); *G06V 40/1318* (2022.01); *G09G 3/32* (2013.01); *G09G 3/3233* (2013.01); *H10K 59/131* (2023.02); *H10K 59/60* (2023.02); *G09G 2300/0426* (2013.01); *G09G 2310/0275* (2013.01); *G09G 2360/14* (2013.01); *H10K 59/65* (2023.02)

(58) Field of Classification Search
CPC ...... G09G 3/3275; G09G 3/32; G09G 3/3233; G09G 2300/0426; G09G 2310/0275; G09G 2360/14; H10K 59/131; H10K 59/65; H10K 59/60; G06V 40/1318
USPC ........................................................ 345/204
See application file for complete search history.

(56) References Cited

U.S. PATENT DOCUMENTS

| | | | |
|---|---|---|---|
| 2016/0284272 A1* | 9/2016 | Her .................... | G09G 3/035 |
| 2018/0342206 A1* | 11/2018 | Zhou ................... | G09G 3/3291 |

(Continued)

FOREIGN PATENT DOCUMENTS

| | | |
|---|---|---|
| CN | 218039210 U | 12/2022 |
| EP | 4 20 2909 A1 | 6/2023 |

(Continued)

*Primary Examiner* — Tom V Sheng
(74) *Attorney, Agent, or Firm* — Womble Bond Dickinson (US) LLP

(57) ABSTRACT

A display device includes a base layer having a display region and a non-display region, a circuit layer on the base layer, and an element layer on the circuit layer and including light emitting elements and light receiving elements corresponding to the display region. The circuit layer includes pixel drive circuits connected to the light emitting elements, sensor drive circuits connected to the light receiving elements, readout lines connected to the sensor drive circuits, first data lines connected to a first group of pixel drive circuits from among the pixel drive circuits, second data lines spaced from the first data lines in a first direction and connected to a second group of pixel drive circuits from among the pixel drive circuits, and data connecting lines electrically connected with the second data lines, respectively, in the display region.

31 Claims, 34 Drawing Sheets

(51) Int. Cl.
   *H10K 59/60*         (2023.01)
   *H10K 59/65*         (2023.01)

(56) References Cited

U.S. PATENT DOCUMENTS

| | | | |
|---|---|---|---|
| 2018/0350303 A1* | 12/2018 | Jin | G09G 3/3233 |
| 2020/0074932 A1* | 3/2020 | Park | G09G 3/3266 |
| 2020/0105849 A1 | 4/2020 | Kim et al. | |
| 2020/0258967 A1* | 8/2020 | Kim | H10K 59/17 |
| 2022/0036826 A1 | 2/2022 | Cha et al. | |
| 2022/0285460 A1 | 9/2022 | Kim et al. | |
| 2022/0406872 A1 | 12/2022 | Cho et al. | |
| 2023/0098891 A1* | 3/2023 | Song | G09G 3/3233 345/207 |
| 2023/0169912 A1* | 6/2023 | Zou | G09G 3/20 |
| 2023/0343290 A1* | 10/2023 | Lee | G06V 40/1318 |

FOREIGN PATENT DOCUMENTS

| | | |
|---|---|---|
| EP | 4 203 051 A1 | 6/2023 |
| KR | 10-2020-0037027 A | 4/2020 |
| KR | 10-2023-0046388 A | 4/2022 |
| KR | 10-2022-0125839 A | 9/2022 |
| KR | 10-2022-0170387 A | 12/2022 |

\* cited by examiner

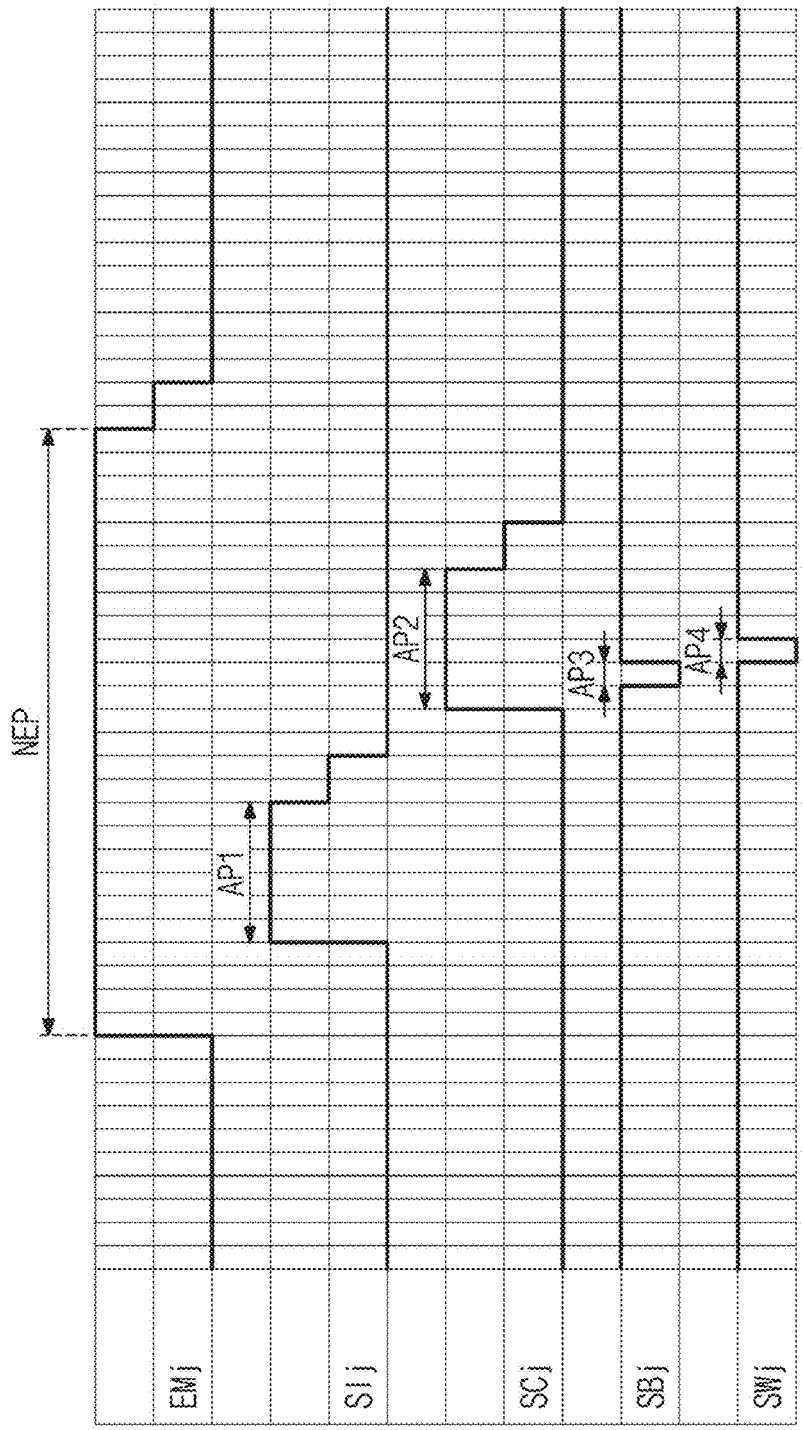

DISPLAY DEVICE

CROSS-REFERENCE TO RELATED APPLICATIONS

The present application claims priority to and the benefit of Korean Patent Application No. 10-2023-0085488, filed on Jul. 3, 2023, in the Korean Intellectual Property Office, the entire disclosure of which is incorporated by reference herein.

BACKGROUND

1. Field

One or more embodiments of the present disclosure described herein relate to a display device in which the area of a non-display region is reduced.

2. Description of the Related Art

A display device provides various functions that enable a user to interact with the display device. For example, the display device may display an image to provide information to the user, or may sense an input of the user. Recent display devices include a function of sensing biometric information of a user.

The biometric information may be recognized by using a capacitive sensing technique for sensing a change in capacitance between electrodes, a light sensing technique for sensing incident light using an optical sensor, and/or an ultrasonic sensing technique for sensing vibration using a piezoelectric element.

SUMMARY

One or more embodiments of the present disclosure provide a display device in which the area of a non-display region is reduced and that has a biometric information recognition function.

According to one or more embodiments, a display device includes a base layer having a display region and a non-display region, a circuit layer on the base layer, an element layer on the circuit layer and including light emitting elements and light receiving elements corresponding to the display region, and a data driver electrically connected to the circuit layer.

The circuit layer includes pixel drive circuits connected to the light emitting elements, sensor drive circuits connected to the light receiving elements, readout lines connected to the sensor drive circuits, first data lines connected to a first group of pixel drive circuits from among the pixel drive circuits, second data lines spaced from the first data lines in a first direction and connected to a second group of pixel drive circuits from among the pixel drive circuits, and data connecting lines electrically connected with the second data lines, respectively, in the display region. The first data lines are connected to the data driver, and the second data lines are connected to the data driver through the data connecting lines.

According to one or more embodiments, a display device includes a display panel including a display region and a non-display region adjacent to the display region, a driver chip connected to the display panel, and a sensor chip connected to the display panel.

The display panel includes light emitting elements, light receiving elements, pixel drive circuits connected to the light emitting elements, sensor drive circuits connected to the light receiving elements, readout lines connected to the sensor drive circuits and the sensor chip, first data lines connected to a first group of pixel drive circuits from among the pixel drive circuits, second data lines spaced from the first data lines in a first direction and connected to a second group of pixel drive circuits from among the pixel drive circuits, and data connecting lines electrically connected with the second data lines, respectively, in the display region.

The first data lines are connected to the driver chip, and the second data lines are connected to the driver chip through the data connecting lines.

BRIEF DESCRIPTION OF THE DRAWINGS

The above and other aspects and features of embodiments of the present disclosure will become apparent by describing in detail embodiments thereof with reference to the accompanying drawings.

FIG. 4B is a waveform diagram for explaining operations of the pixel and the sensor illustrated in FIG. 4A.

DETAILED DESCRIPTION

Figure 1:
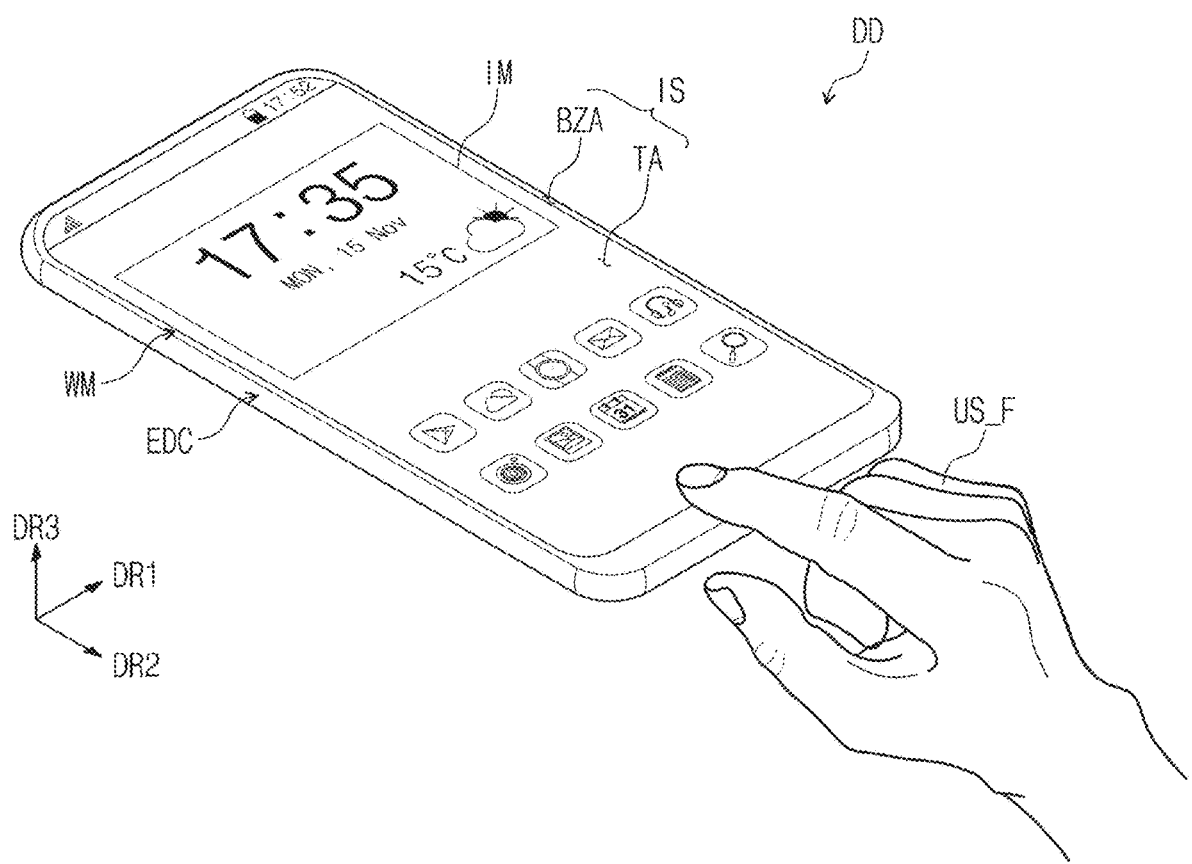
FIG. 1 is a perspective view of a display device according to one or more embodiments of the present disclosure.

In the present disclosure, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the spirit and scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, one or more embodiments of the present disclosure will be described with reference to the accompanying drawings.

Figure 2A:
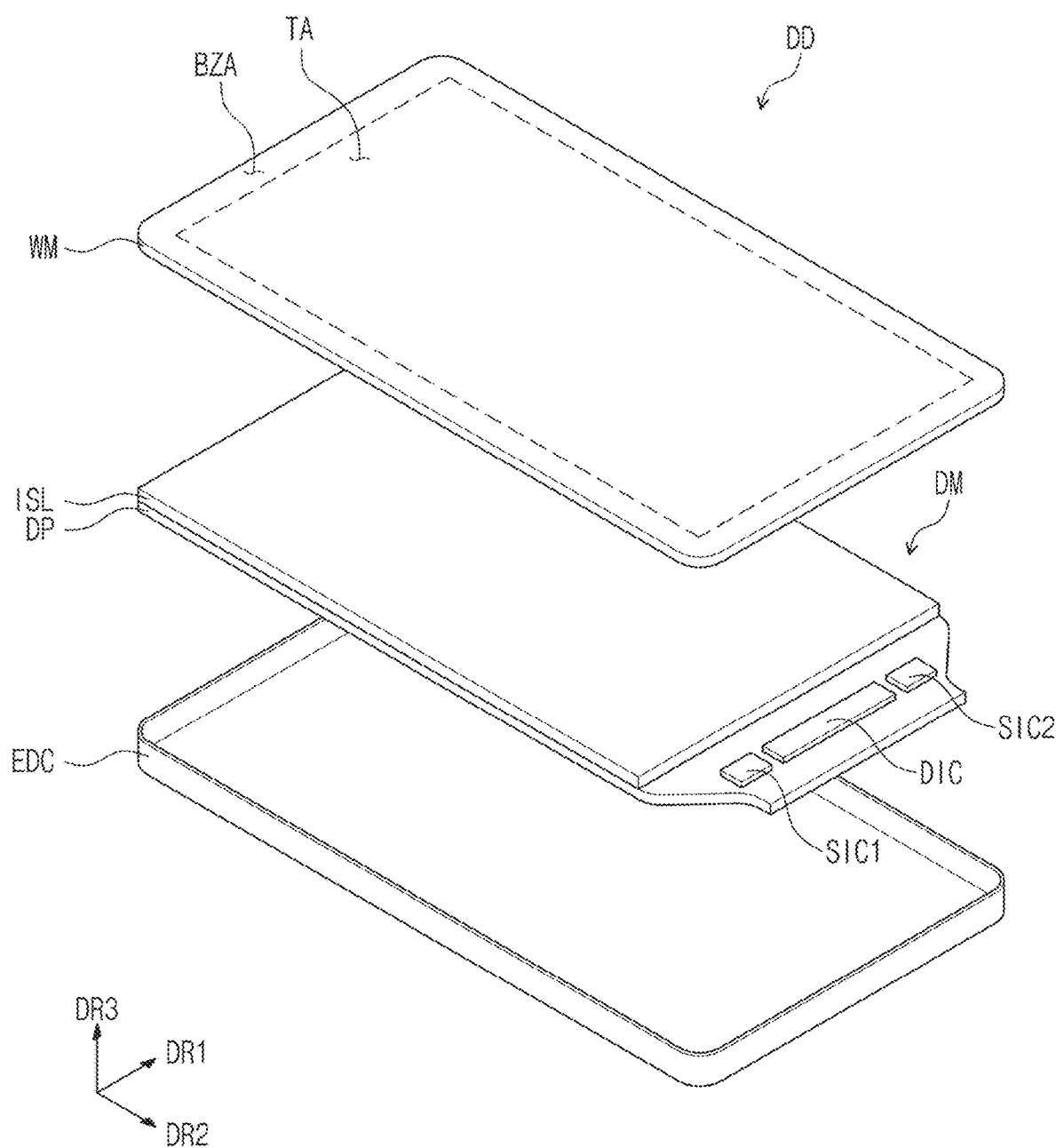
FIG. 2A is an exploded perspective view of the display device according to one or more embodiments of the present disclosure.
Figure 2B:
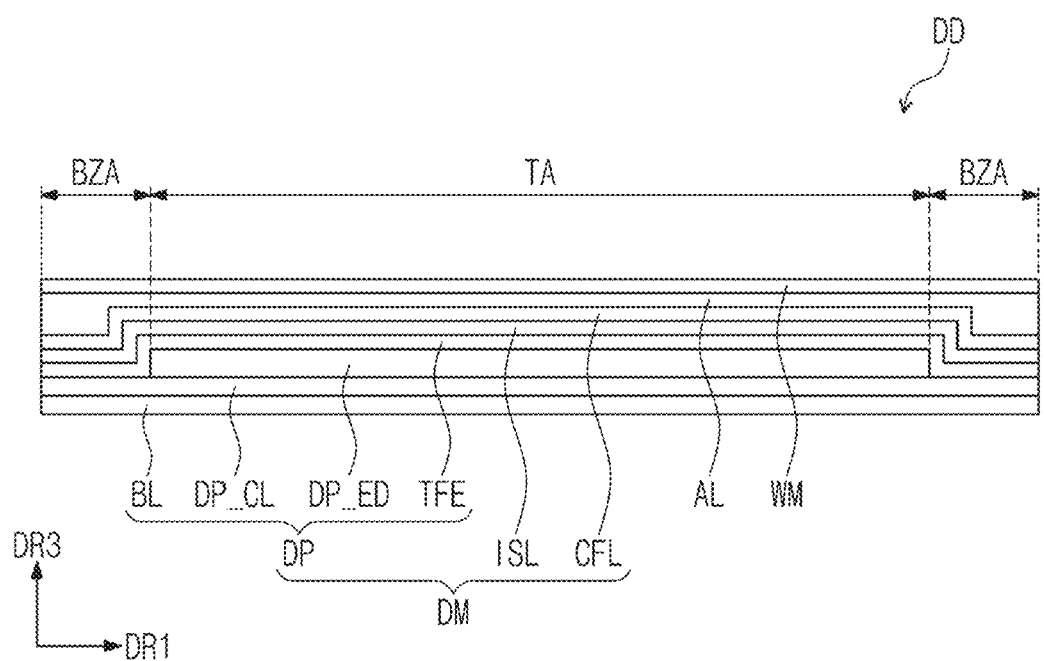
FIG. 2B is a sectional view of the display device according to one or more embodiments of the present disclosure.

FIG. 1 is a perspective view of a display device according to one or more embodiments of the present disclosure. FIG. 2A is an exploded perspective view of the display device according to one or more embodiments of the present disclosure. FIG. 2B is a sectional view of the display device according to one or more embodiments of the present disclosure.

Referring to FIGS. 1, 2A, and 2B, the display device DD according to one or more embodiments of the present disclosure may have a rectangular shape with short sides parallel to a first direction DR1 and long sides parallel to a second direction DR2 crossing the first direction DR1. However, without being limited thereto, the display device DD may have various shapes such as a circular shape, a polygonal shape, and/or the like.

The display device DD may be activated depending on an electrical signal. The display device DD may include one or more embodiments. For example, the display device DD may be applied to an electronic device such as a smart watch, a tablet computer, a notebook computer, a computer, a smart television, and/or the like.

Hereinafter, a normal direction substantially perpendicular to a plane defined by the first direction DR1 and the second direction DR2 is defined as a third direction DR3. The expression "when viewed from above the plane" used herein may mean that it is viewed in the third direction DR3.

An upper surface of the display device DD may be defined as a display surface IS and may be parallel to the plane defined by the first direction DR1 and the second direction DR2. Images IM generated by the display device DD may be provided to a user through the display surface IS.

The display surface IS may be divided into a transmission region TA and a bezel region BZA. The transmission region TA may be a region on which the images IM are displayed. The user visually recognizes the images IM through the transmission region TA. In one or more embodiments, the transmission region TA is illustrated in a rounded quadrangular shape. However, this is illustrative, and the transmission region TA may have various shapes and is not limited to any one embodiment.

The bezel region BZA is adjacent to the transmission region TA and may be disposed around the transmission region TA along an edge or a periphery of the transmission region TA. The bezel region BZA may have a suitable color (e.g., a predetermined color). The bezel region BZA may surround the transmission region TA. Accordingly, the shape of the transmission region TA may be substantially defined by the bezel region BZA. However, this is illustrative, and the bezel region BZA may be disposed adjacent to only one side of the transmission region TA, or may be omitted.

The display device DD may sense an external input applied from the outside. The external input may include various forms of inputs provided from outside the display device DD. For example, the external input may include not only contact by a part of the user's body (e.g., a hand US_F of the user) or contact by a separate device (e.g., an active pen or a digitizer) but also an external input (e.g., hovering) that is applied in proximity to the display device DD or applied adjacent to the display device DD at a suitable distance (e.g., a predetermined distance). In addition, the external input may have various forms such as force, pressure, temperature, light, and/or the like.

The display device DD may sense the user's biometric information applied from the outside. A biometric information sensing region capable of sensing the user's biometric information may be provided on the display surface IS of the display device DD. The biometric information sensing region may be provided in the entire area of the transmission region TA, or may be provided in a partial area of the transmission region TA. FIG. 1 illustrates an example that the entire transmission region TA is used as the biometric information sensing region.

The display device DD may include a window WM, a display module DM, and a housing EDC. In one or more embodiments, the window WM and the housing EDC are coupled to form an exterior of the display device DD.

A front surface of the window WM defines the display surface IS of the display device DD. The window WM may include an optically clear insulating material. For example, the window WM may include glass or plastic. The window WM may have a multi-layer structure or a single-layer structure. For example, the window WM may include a plurality of plastic films coupled through an adhesive, or may include a glass substrate and a plastic film coupled through an adhesive.

The display module DM may include a display panel DP and an input sensing layer ISL. The display panel DP may display an image IM depending on an electrical signal, and the input sensing layer ISL may sense an external input applied from the outside. The external input may be provided in various forms.

The display panel DP according to one or more embodiments of the present disclosure may be an emissive display panel, but is not particularly limited. For example, the display panel DP may be an organic light emitting display panel, an inorganic light emitting display panel, and/or a quantum-dot light emitting display panel. A light emitting layer of the organic light emitting display panel may include an organic light emitting material, and a light emitting layer of the inorganic light emitting display panel may include an inorganic light emitting material. A light emitting layer of the quantum-dot light emitting display panel may include quantum dots and quantum rods. Hereinafter, the display panel DP will be described as an organic light emitting display panel.

Referring to FIG. 2B, the display panel DP includes a base layer BL, a circuit layer DP_CL, an element layer DP_ED, and an encapsulation layer TFE. The display panel DP according to the present disclosure may be a flexible display panel. However, the present disclosure is not limited thereto. For example, the display panel DP may be a foldable display panel that is folded about a folding axis, or a rigid display panel.

The base layer BL may include a synthetic resin layer. The synthetic resin layer may be a polyimide-based resin layer, and the material thereof is not particularly limited. In addition, the base layer BL may include a glass substrate, a metal substrate, or an organic and/or inorganic composite substrate.

The circuit layer DP_CL is disposed on the base layer BL. The circuit layer DP_CL is disposed between the base layer BL and the element layer DP_ED. The circuit layer DP_CL includes at least one insulating layer and/or a circuit element. Hereinafter, the insulating layer included in the circuit layer DP_CL is referred to as the intermediate insulating layer. The intermediate insulating layer includes at least one intermediate inorganic film and at least one intermediate organic film. The circuit element may include a pixel drive circuit included in each of a plurality of pixels for displaying an image and a sensor drive circuit included in each of a plurality of sensors for recognizing external information.

The external information may be biometric information. In one or more embodiments of the present disclosure, the sensor may be a fingerprint recognition sensor, a proximity sensor, an iris recognition sensor, a blood pressure measurement sensor, an illuminance sensor, and/or the like. Alternatively, the sensor may be an optical sensor for optically recognizing biometric information. The circuit layer DP_CL may further include signal lines connected to the pixel drive circuit and/or the sensor drive circuit.

The element layer DP_ED may include a light emitting element included in each of the pixels and a light receiving element included in each of the sensors. In one or more embodiments of the present disclosure, the light receiving element may be a photo diode. The light receiving element may be a sensor that senses, or reacts to, light reflected by a fingerprint of the user. The circuit layer DP_CL and the element layer DP_ED will be described below in detail with reference to FIGS. 6-16D.

The encapsulation layer TFE seals the element layer DP_ED. The encapsulation layer TFE may include at least one organic film and/or at least one inorganic film. The inorganic film may include an inorganic material and may protect the element layer DP_ED from moisture and/or oxygen. The inorganic film may include a silicon nitride layer, a silicon oxy nitride layer, a silicon oxide layer, a titanium oxide layer, and/or an aluminum oxide layer, but is not particularly limited thereto. The organic film may include an organic material and may protect the element layer DP_ED from foreign matter such as dust particles.

The input sensing layer ISL may be formed on the display panel DP. The input sensing layer ISL may be directly disposed on the encapsulation layer TFE. According to one or more embodiments of the present disclosure, the input sensing layer ISL may be formed on the display panel DP by a continuous process. That is, when the input sensing layer ISL is directly disposed on the display panel DP, an adhesive film is not disposed between the input sensing layer ISL and the encapsulation layer TFE. Alternatively, an adhesive film may be disposed between the input sensing layer ISL and the display panel DP. In this case, the input sensing layer ISL may not be manufactured together with the display panel DP by a continuous process and may be manufactured separately from the display panel DP and then fixed to an upper surface of the display panel DP by the adhesive film.

The input sensing layer ISL may sense an external input (e.g., a touch of the user), may change the sensed external input into an input signal (e.g., a predetermined input signal), and may provide the input signal to the display panel DP. The input sensing layer ISL may include a plurality of sensing electrodes for sensing the external input. The sensing electrodes may sense the external input in a capacitive type. The display panel DP may receive the input signal from the input sensing layer ISL and may generate an image corresponding to the input signal.

The display module DM may further include a color filter layer CFL. In one or more embodiments of the present disclosure, the color filter layer CFL may be disposed on the input sensing layer ISL. However, the present disclosure is not limited thereto. The color filter layer CFL may be disposed between the display panel DP and the input sensing layer ISL. The color filter layer CFL may include a plurality of color filters and a black matrix.

The structures of the input sensing layer ISL and the color filter layer CFL will be described below in detail.

The display device DD according to one or more embodiments of the present disclosure may further include an adhesive layer AL. The window WM may be attached to the input sensing layer ISL by the adhesive layer AL. The adhesive layer AL may include an optically clear adhesive, an optically clear adhesive resin, and/or a pressure sensitive adhesive (PSA).

The display module DM may further include a driver chip DIC and sensor chips SIC1 and SIC2. In one or more embodiments of the present disclosure, the driver chip DIC and the sensor chips SIC1 and SIC2 may be mounted on the display panel DP. The driver chip DIC and the sensor chips SIC1 and SIC2 may be disposed adjacent to one end portion (hereinafter, referred to as a first end portion) of the display panel DP. Although the structure in which the driver chip DIC and the sensor chips SIC1 and SIC2 are disposed adjacent to the first end portion of the display panel DP is illustrated in FIG. 2A, the present disclosure is not limited thereto. For example, the driver chip DIC may be disposed adjacent to the first end portion of the display panel DP, and the sensor chips SIC1 and SIC2 may be disposed adjacent to a second end portion of the display panel DP that faces away from (e.g., opposite to) the first end portion.

In one or more embodiments of the present disclosure, the sensor chips SIC1 and SIC2 may include a first sensor chip SIC1 disposed on one side (hereinafter, referred to as a first side) of the driver chip DIC and a second sensor chip SIC2 disposed on a second side of the driver chip DIC that differs from the first side. However, alternatively, only one of the first and second sensor chips SIC1 and SIC2 may be disposed on one side of the driver chip DIC. In the present disclosure, the number of sensor chips SIC1 and SIC2 and the number of driver chips DIC are not particularly limited.

The housing EDC is coupled with the window WM. The housing EDC is coupled with the window WM and provides an inner space (e.g., a predetermined inner space). The display module DM may be accommodated in the inner space. The housing EDC may include a material having a relatively high rigidity. For example, the housing EDC may include glass, plastic, and/or metal, or may include a plurality of frames and/or plates formed of a combination thereof. The housing EDC may stably protect components of the display device DD accommodated in the inner space from an external impact. Although not illustrated, a battery module for supplying power required for overall operation of the display device DD may be disposed between the display module DM and the housing EDC.

Figure 3:
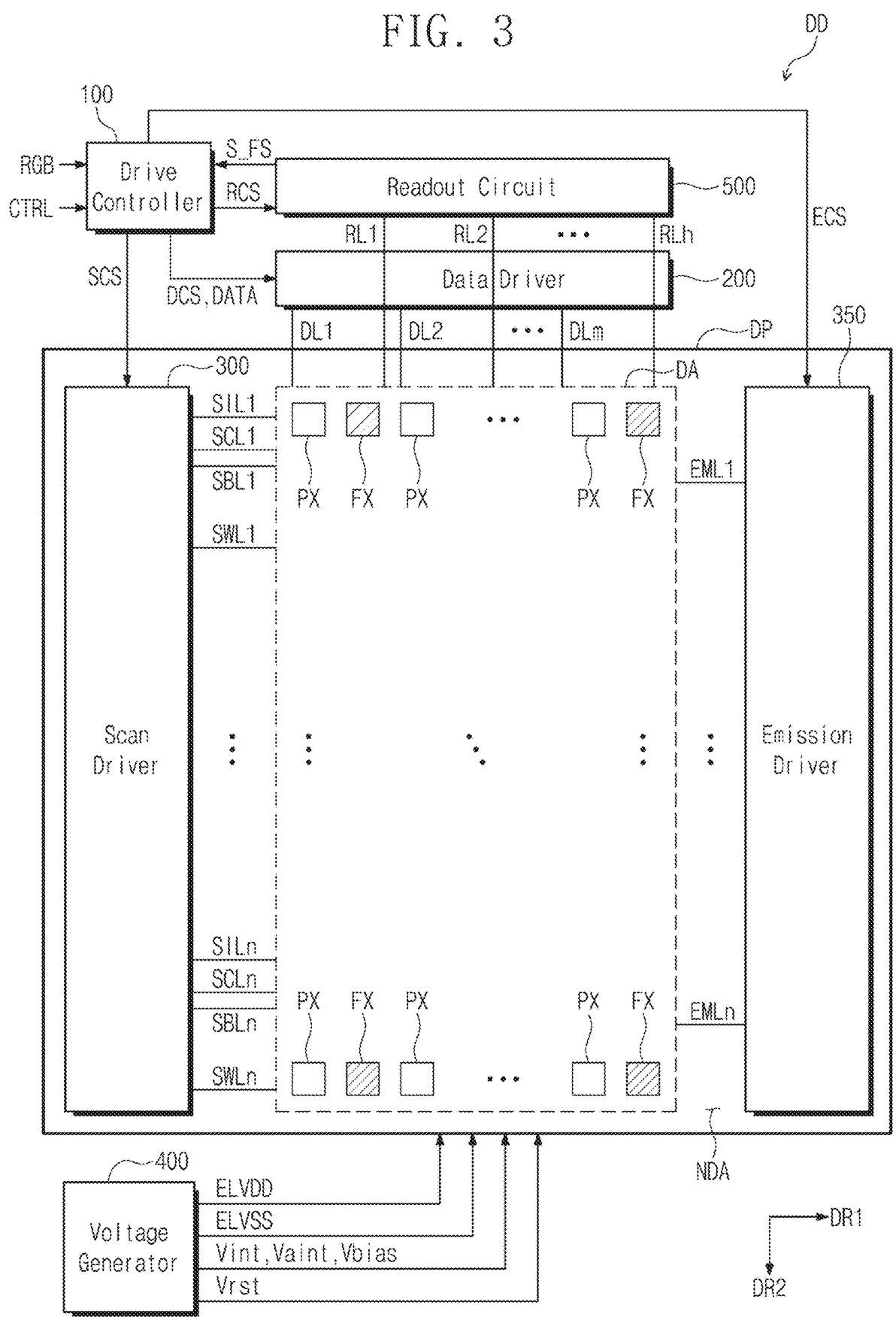
FIG. 3 is a block diagram of the display device according to one or more embodiments of the present disclosure.

FIG. 3 is a block diagram of the display device according to one or more embodiments of the present disclosure.

Referring to FIG. 3, the display device DD includes the display panel DP, a panel driver, and a drive controller 100. In one or more embodiments of the present disclosure, the panel driver includes a data driver 200, a scan driver 300, an emission driver 350, a voltage generator 400, and a readout circuit 500.

The drive controller 100 receives an image signal RGB and a control signal CTRL. The drive controller 100 generates image data DATA by converting the data format of the image signal RGB according to the specification of an interface with the data driver 200. The drive controller 100 outputs a first control signal SCS, a second control signal ECS, a third control signal DCS, and a fourth control signal RCS.

The data driver 200 receives the third control signal DCS and the image data DATA from the drive controller 100. The data driver 200 converts the image data DATA into data signals and outputs the data signals to a plurality of data lines DL1 to DLm that will be described below. The data signals are analog voltages corresponding to gray level values of the image data DATA. In one or more embodiments of the present disclosure, the data driver 200 may be embedded in the driver chip DIC illustrated in FIG. 2A.

The scan driver 300 receives the first control signal SCS from the drive controller 100. The scan driver 300 may output scan signals to scan lines in response to the first control signal SCS.

The voltage generator 400 generates voltages required for operation of the display panel DP. In one or more embodiments, the voltage generator 400 generates a first drive voltage ELVDD, a second drive voltage ELVSS, a first initialization voltage Vint, a second initialization voltage Vaint, a bias voltage Vbias, and a reset voltage Vrst.

The display panel DP may include a display region DA corresponding to the transmission region TA (illustrated in FIG. 1) and a non-display region NDA corresponding to the bezel region BZA (illustrated in FIG. 1).

The display panel DP may include a plurality of pixels PX disposed in the display region DA and a plurality of sensors FX disposed in the display region DA. In one or more embodiments of the present disclosure, each of the plurality of sensors FX may be disposed between two pixels PX adjacent to each other. The plurality of pixels PX and the plurality of sensors FX may be alternately disposed along the first and second directions DR1 and DR2. However, the present disclosure is not limited thereto. That is, two or more pixels PX may be disposed between two sensors FX adjacent to each other in the first direction DR1 from among the plurality of sensors FX, or two or more pixels PX may be disposed between two sensors FX adjacent to each other in the second direction DR2 from among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, the data lines DL1 to DLm, and readout lines RL1 to RLh. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the first direction DR1. The initialization scan lines SIL1 to SILn, the compensation scan lines SCL1 to SCLn, the write scan lines SWL1 to SWLn, the black scan lines SBL1 to SBLn, and the emission control lines EML1 to EMLn are arranged to be spaced from each other along the second direction DR2. The data lines DL1 to DLm and the readout lines RL1 to RLh extend in the second direction DR2 and are arranged to be spaced from each other along the first direction DR1. Here, "n", "m", and "h" are natural numbers of 1 or more.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm, respectively. For example, each of the plurality of pixels PX may be electrically connected to four scan lines. However, without being limited thereto, the number of scan lines connected to each pixel PX may be changed.

The plurality of sensors FX are electrically connected to the write scan lines SWL1 to SWLn and the readout lines RL1 to RLh, respectively. Each of the plurality of sensors FX may be electrically connected to one scan line. However, the present disclosure is not limited thereto. The number of scan lines connected to each sensor FX may be varied. In one or more embodiments of the present disclosure, the number of readout lines RL1 to RLh may be smaller than or equal to the number of data lines DL1 to DLm. For example, the number of readout lines RL1 to RLh may correspond to ½, ¼, or ⅛ of the number of data lines DL1 to DLm.

The scan driver 300 may be disposed in the non-display region NDA of the display panel DP. The scan driver 300 receives the first control signal SCS from the drive controller 100. In response to the first control signal SCS, the scan driver 300 outputs initialization scan signals to the initialization scan lines SIL1 to SILn and outputs compensation scan signals to the compensation scan lines SCL1 to SCLn. Furthermore, in response to the first control signal SCS, the scan driver 300 may output write scan signals to the write scan lines SWL1 to SWLn and may output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The emission driver 350 may be disposed in the non-display region NDA of the display panel DP. The emission driver 350 receives the second control signal ECS from the drive controller 100. The emission driver 350 may output emission control signals to the emission control lines EML1 to EMLn in response to the second control signal ECS. Alternatively, the scan driver 300 may be connected to the emission control lines EML1 to EMLn. In this case, the emission driver 350 may be omitted, and the scan driver 300 may output the emission control signals to the emission control lines EML1 to EMLn.

The readout circuit 500 receives the fourth control signal RCS from the drive controller 100. In response to the fourth control signal RCS, the readout circuit 500 may receive detection signals from the readout lines RL1 to RLh. The readout circuit 500 may process the detection signals received from the readout lines RL1 to RLh and may provide processed detection signals S_FS to the drive controller 100. The drive controller 100 may recognize biometric information based on the processed detection signals S_FS. In one or more embodiments of the present disclosure, the readout circuit 500 may be embedded in the sensor chips SIC1 and SIC2 illustrated in FIG. 2A.

Figure 4A:
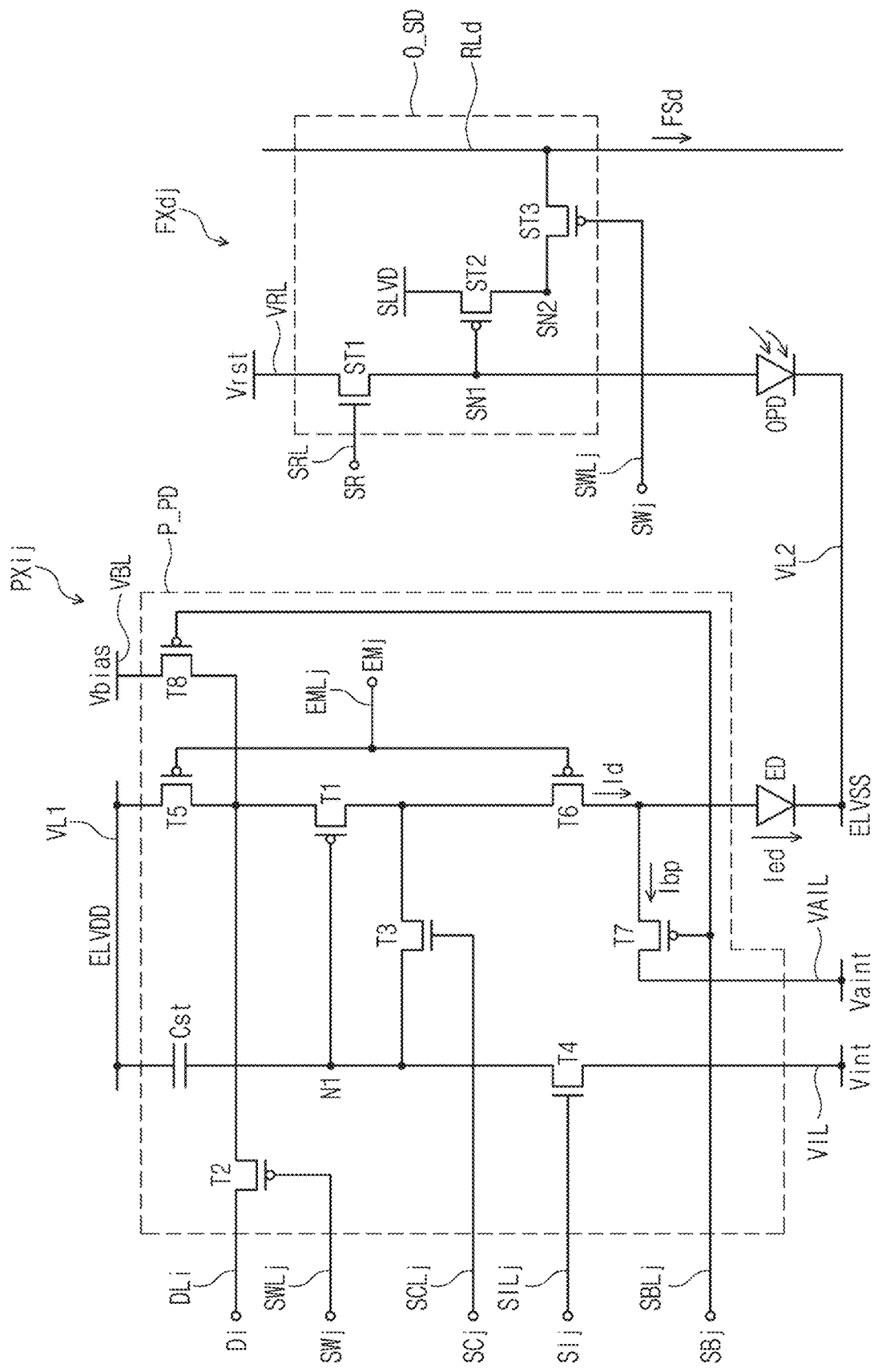
FIG. 4A is a circuit diagram illustrating a pixel and a sensor according to one or more embodiments of the present disclosure.

FIG. 4A is a circuit diagram illustrating a pixel and a sensor according to one or more embodiments of the present disclosure, and FIG. 4B is a waveform diagram for explaining operations of the pixel and the sensor illustrated in FIG. 4A. In FIG. 4A, an equivalent circuit diagram of one pixel PXij from among the plurality of pixels PX illustrated in FIG. 3 is illustrated. Each of the plurality of pixels PX has the same circuit structure. Therefore, description of the circuit structure of the pixel PXij may be applied to the remaining pixels, and detailed description of the remaining pixels will be omitted. Furthermore, in FIG. 4A, an equivalent circuit diagram of one sensor FXdj from among the plurality of sensors FX illustrated in FIG. 3 is illustrated. The plurality of sensors FX have the same circuit structure. Therefore, description of the circuit structure of the sensor FXdj may be applied to the remaining sensors, and detailed description of the remaining sensors will be omitted.

Referring to FIG. 4A, the pixel PXij is connected to an i-th data line DLi from among the data lines DL1 to DLm, a j-th initialization scan line SILj from among the initialization scan lines SIL1 to SILn, a j-th compensation scan line SCLj from among the compensation scan lines SCL1 to SCLn, a j-th write scan line SWLj from among the write scan lines SWL1 to SWLn, a j-th black scan line SBLj from among the black scan lines SBL1 to SBLn, and a j-th emission control line EMLj from among the emission control lines EML1 to EMLn.

The pixel PXij includes a light emitting element ED and a pixel drive circuit P_PD. The light emitting element ED may be a light emitting diode. In one or more embodiments of the present disclosure, the light emitting element ED may be an organic light emitting diode (OLED) including an organic light emitting layer.

The pixel drive circuit P_PD includes first to eighth transistors T1, T2, T3, T4, T5, T6, T7, and T8 and one capacitor Cst. At least one of the first to eighth transistors T1 to T8 may be a transistor having a low-temperature polycrystalline silicon (LTPS) semiconductor layer. Some of the first to eighth transistors T1 to T8 may be P-type transistors, and the others may be N-type transistors. At least one of the first to eighth transistors T1 to T8 may be a transistor having an oxide semiconductor layer. For example, the third and fourth transistors T3 and T4 may be oxide semiconductor transistors, and the first, second, and fifth to eighth transistors T1, T2, and T5 to T8 may be LTPS transistors. The third and fourth transistors T3 and T4 may be NMOS transistors.

The configuration of the pixel drive circuit P_PD according to the present disclosure is not limited to the embodiment illustrated in FIG. 4A. The pixel drive circuit P_PD illustrated in FIG. 4A is merely an example, and various changes and modifications may be made to the configuration of the pixel drive circuit P_PD. For example, the first, second, and fifth to eighth transistors T1, T2, and T5 to T8 may all be P-type transistors or N-type transistors.

The j-th initialization scan line SILj, the j-th compensation scan line SCLj, the j-th write scan line SWLj, the j-th black scan line SBLj, and the j-th emission control line EMLj may transfer the j-th initialization scan signal SIj, the j-th compensation scan signal SCj, the j-th write scan signal SWj, the j-th black scan signal SBj, and the j-th emission control signal EMj to the pixel PXij, respectively. The i-th data line DLi transfers an i-th data signal Di to the pixel PXij. The i-th data signal Di may have a voltage level corresponding to the image signal RGB (refer to FIG. 3) that is input to the display device DD (refer to FIG. 3).

In one or more embodiments of the present disclosure, the pixel PXij may be connected to first and second drive voltage lines VL1 and VL2, first and second initialization voltage lines VIL and VAIL, and a bias voltage line VBL. The first drive voltage line VL1 may transfer the first drive voltage ELVDD to the pixel PXij, and the second drive voltage line VL2 may transfer the second drive voltage ELVSS to the pixel PXij. In addition, the first initialization voltage line VIL may transfer the first initialization voltage Vint to the pixel PXij, and the second initialization voltage line VAIL may transfer the second initialization voltage Vaint to the pixel PXij. The bias voltage line VBL may transfer the bias voltage Vbias to the pixel PXij.

The first transistor T1 is connected between the first drive voltage line VL1, which receives the first drive voltage ELVDD, and the light emitting element ED. The first transistor T1 includes a first electrode connected with the first drive voltage line VL1 via the fifth transistor T5, a second electrode connected with an anode electrode of the light emitting element ED via the sixth transistor T6, and a third electrode (e.g., a gate electrode) connected with one end of the capacitor Cst (e.g., a first node N1). The first transistor T1 may receive the i-th data signal Di that the i-th data line DLi transfers depending on a switching operation of the second transistor T2 and may supply a drive current Id to the light emitting element ED.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode (e.g., a gate electrode) connected with the j-th write scan line SWLj. The second transistor T2 may be turned on in response to the j-th write scan signal SWj transferred through the j-th write scan line SWLj and may transfer, to the first electrode of the first transistor T1, the i-th data signal Di transferred from the i-th data line DLi.

The third transistor T3 is connected between the second electrode of the first transistor T1 and the first node N1. The third transistor T3 includes a first electrode connected with the third electrode of the first transistor T1, a second electrode connected with the second electrode of the first transistor T1, and a third electrode (e.g., a gate electrode) connected with the j-th compensation scan line SCLj. The third transistor T3 may be turned on in response to the j-th compensation scan signal SCj transferred through the j-th compensation scan line SCLj and may diode-connect the first transistor T1 by connecting the third electrode and the second electrode of the first transistor T1 to each other.

The fourth transistor T4 is connected between the first initialization voltage line VIL, to which the first initialization voltage Vint is applied, and the first node N1. The fourth transistor T4 includes a first electrode connected with the first initialization voltage line VIL to which the first initialization voltage Vint is transferred, a second electrode connected with the first node N1, and a third electrode (e.g., a gate electrode) connected with the j-th initialization scan line SILj. The fourth transistor T4 is turned on in response to the j-th initialization scan signal Slj transferred through the j-th initialization scan line SILj. The turned-on fourth transistor T4 initializes the potential of the third electrode (e.g., the gate electrode) of the first transistor T1 (that is, the potential of the first node N1) by transferring the first initialization voltage Vint to the first node N1.

The fifth transistor T5 includes a first electrode connected with the first drive voltage line VL1, a second electrode connected with the first electrode of the first transistor T1, and a third electrode (e.g., a gate electrode) connected to the j-th emission control line EMLj.

The sixth transistor T6 includes a first electrode connected with the second electrode of the first transistor T1, a second electrode connected to the anode electrode of the light emitting element ED, and a third electrode (e.g., a gate electrode) connected to the j-th emission control line EMLj.

The fifth and sixth transistors T5 and T6 are concurrently (e.g., simultaneously) turned on in response to the j-th emission control signal EMj transferred through the j-th emission control line EMLj. The first drive voltage ELVDD applied through the turned-on fifth transistor T5 may be compensated for through the diode-connected first transistor T1 and thereafter may be transferred to the light emitting element ED.

The seventh transistor T7 includes a first electrode connected to the second initialization voltage line VAIL to which the second initialization voltage Vaint is transferred, a second electrode connected with the second electrode of the sixth transistor T6, and a third electrode (e.g., a gate electrode) connected with the j-th black scan line SBLj. The second initialization voltage Vaint may have a voltage level lower than or equal to the voltage level of the first initialization voltage Vint.

The eighth transistor T8 includes a first electrode connected to the bias voltage line VBL to which the bias voltage Vbias is transferred, a second electrode connected with the first electrode of the first transistor T1, and a third electrode (e.g., a gate electrode) connected with the j-th black scan line SBLj.

The seventh and eighth transistors T7 and T8 are concurrently (e.g., simultaneously) turned on in response to the j-th black scan signal SBj transferred through the j-th black scan line SBLj. The second initialization voltage Vaint applied through the turned-on seventh transistor T7 may be transferred to the anode electrode of the light emitting element ED. Accordingly, the anode electrode of the light emitting element ED may be initialized to the second initialization voltage Vaint. The bias voltage Vbias applied through the turned-on eighth transistor T8 may be transferred to the first electrode of the first transistor T1. Accordingly, the bias voltage Vbias may be periodically applied to the first electrode of the first transistor T1. As a result, deterioration in display quality due to an increase in the potential difference between the first and second electrodes of the first transistor T1 to a level (e.g., a predetermined level) or higher by a magnetic hysteresis phenomenon may be prevented or reduced.

The one end of the capacitor Cst is connected with the third electrode of the first transistor T1 (e.g., the first node N1) as described above, and an opposite end of the capacitor Cst is connected with the first drive voltage line VL1. A cathode electrode of the light emitting element ED may be connected with the second drive voltage line VL2 that transfers the second drive voltage ELVSS. The second drive voltage ELVSS may have a lower voltage level than that of the first drive voltage ELVDD. In one or more embodiments of the present disclosure, the second drive voltage ELVSS may have a lower voltage level than those of the first and second initialization voltages Vint and Vaint.

Referring to FIGS. 4A and 4B, the j-th emission control signal EMj has a high level during a non-light emission period NEP. Within the non-light emission period NEP, the j-th initialization scan signal Slj is activated. When the j-th initialization scan signal Slj having the high level is provided through the j-th initialization scan line SILj during an activation period AP1 (hereinafter, referred to as a first activation period) of the j-th initialization scan signal Slj, the fourth transistor T4 is turned on in response to the j-th initialization scan signal Slj having the high level. The first initialization voltage Vint is transferred to the third electrode (e.g., the gate electrode) of the first transistor T1 through the turned-on fourth transistor T4, and the first node N1 is initialized to the first initialization voltage Vint. Accordingly, the first activation period AP1 may be defined as an initialization period of the pixel PXij.

Next, when the j-th compensation scan signal SCj is activated and the j-th compensation scan signal SCj having the high level is supplied through the j-th compensation scan line SCLj during an activation period AP2 (hereinafter, referred to as a second activation period) of the j-th compensation scan signal SCj, the third transistor T3 is turned on. The first transistor T1 is diode-connected by the turned-on third transistor T3 and is forward-biased. The first activation period AP1 may not overlap the second activation period AP2.

Within the second activation period AP2, the j-th write scan signal SWj is activated. The j-th write scan signal SWj has a low level during an activation period AP4 (hereinafter, referred to as a fourth activation period). During the fourth activation period AP4, the second transistor T2 is turned on by the j-th write scan signal SWj having the low level. Then, a compensation voltage "Di-Vth" obtained by subtracting a threshold voltage Vth of the first transistor T1 from the i-th data signal Di supplied from the i-th data line DLi is applied to the third electrode of the first transistor T1. That is, the potential of the third electrode of the first transistor T1 may be the compensation voltage "Di-Vth". The fourth activation period AP4 may overlap the second activation period AP2. A duration of the second activation period AP2 may be greater than a duration of the fourth activation period AP4.

The first drive voltage ELVDD and the compensation voltage "Di-Vth" may be applied to the opposite ends of the capacitor Cst, and charges corresponding to a difference between voltages at the opposite ends of the capacitor Cst may be stored in the capacitor Cst. Here, the period during which the j-th compensation scan signal SCj has the high level may be referred to as a compensation period of the pixel PXij.

In one or more embodiments, the j-th black scan signal SBj is activated within the second activation period AP2 of the j-th compensation scan signal SCj. The j-th black scan signal SBj has the low level during an activation period AP3 (hereinafter, referred to as a third activation period). During the third activation period AP3, the seventh transistor T7 is turned on by receiving the j-th black scan signal SBj having the low level through the j-th black scan line SBLj. A portion of the drive current Id may escape through the seventh transistor T7 as a bypass current Ibp. The third activation period AP3 may overlap the second activation period AP2. The duration of the second activation period AP2 may be greater than a duration of the third activation period AP3. The third activation period AP3 may precede the fourth activation period AP4 and may not overlap the fourth activation period AP4.

When the pixel PXij displays a black image, the pixel PXij is not able to normally display the black image if the light emitting element ED emits light even though the minimum drive current of the first transistor T1 flows as the drive current Id. Accordingly, the seventh transistor T7 in the pixel PXij according to one or more embodiments of the present disclosure may distribute a portion of the minimum drive current of the first transistor T1 as the bypass current Ibp to a current path other than the current path toward the light emitting element ED. Here, the minimum drive current of the first transistor T1 means a current flowing to the first transistor T1 under the condition that a gate-source voltage Vgs of the first transistor T1 is lower than the threshold voltage Vth so that the first transistor T1 is turned off. The minimum drive current (e.g., a current of about 10 pA or less) flowing to the first transistor T1 under the condition that the first transistor T1 is turned off is transferred to the light emitting element ED, and a black gray-scale image is displayed. When the pixel PXij displays the black image, an influence of the bypass current Ibp on the minimum drive current is relatively great, whereas when the pixel PXij displays an image such as a general image or a white image, the bypass current Ibp has little influence on the drive current Id. Accordingly, when the pixel PXij displays the black image, the current obtained by subtracting the bypass current Ibp escaping through the seventh transistor T7 from the drive current Id (that is, a light emission current Ied) may be provided to the light emitting element ED so that the pixel PXij clearly expresses the black image. Thus, the pixel PXij may implement an accurate black gray-scale image using the seventh transistor T7, thereby improving the contrast ratio.

After that, the j-th emission control signal EMj supplied from the j-th emission control line EMLj is changed from the high level to the low level. The fifth and sixth transistors T5 and T6 are turned on in response to the emission control signal EMj having the low level. Then, the drive current Id depending on the difference between the voltage of the third electrode of the first transistor T1 and the first drive voltage ELVDD is generated. The drive current Id is supplied to the light emitting element ED through the sixth transistor T6, and the light emission current Ied flows through the light emitting element ED.

Referring again to FIG. 4A, the sensor FXdj is connected to a d-th readout line RLd from among the readout lines RL1 to RLh, the j-th write scan line SWLj, and a reset control line SRL.

The sensor FXdj includes a light receiving element OPD and a sensor drive circuit O_SD. In one or more embodiments of the present disclosure, the light receiving element OPD may be an organic photo diode including an organic material as a photoelectric conversion layer. In FIG. 4A, a structure in which the sensor FXdj includes one light receiving element is illustrated. However, the present disclosure is not limited thereto. For example, the sensor FXdj may include a plurality of light receiving elements OPD connected in parallel.

An anode electrode of the light receiving element OPD may be connected to a first sensing node SN1, and a cathode electrode of the light receiving element OPD may be connected with the second drive voltage line VL2 that transfers the second drive voltage ELVSS. The cathode electrode of the light receiving element OPD may be electrically connected with the cathode electrode of the light emitting element ED. In one or more embodiments of the present disclosure, the cathode electrode of the light receiving element OPD may be integrally formed with the cathode electrode of the light emitting element ED and may form a common cathode electrode C-CE (refer to FIG. 6).

The sensor drive circuit O_SD includes three transistors ST1, ST2, and ST3. The three transistors ST1, ST2, and ST3 may include a reset transistor ST1, an amplifying transistor ST2, and an output transistor ST3. At least one of the reset transistor ST1, the amplifying transistor ST2, and the output transistor ST3 may be an oxide semiconductor transistor. In one or more embodiments of the present disclosure, the reset transistor ST1 may be an oxide semiconductor transistor, and the amplifying transistor ST2 and the output transistor ST3 may be LTPS transistors. However, without being limited thereto, at least the reset transistor ST1 and the output transistor ST3 may be oxide semiconductor transistors, and the amplifying transistor ST2 may be an LTPS transistor.

Furthermore, some of the reset transistor ST1, the amplifying transistor ST2, and the output transistor ST3 may be P-type transistors, and the rest thereof may be an N-type transistor. In one or more embodiments of the present disclosure, the amplifying transistor ST2 and the output transistor ST3 may be PMOS transistors, and the reset transistor ST1 may be an NMOS transistor. However, without being limited thereto, the reset transistor ST1, the amplifying transistor ST2, and the output transistor ST3 may all be N-type transistors or P-type transistors.

Some of the reset transistor ST1, the amplifying transistor ST2, and the output transistor ST3 (e.g., the reset transistor ST1) may be of the same type (e.g., same kind) as the third and fourth transistors T3 and T4 of the pixel PXij. The amplifying transistor ST2 and the output transistor ST3 may be transistors of the same type (e.g., same kind) as the first, second, and fifth to eighth transistors T1, T2, and T5 to T8 of the pixel PXij.

The circuit configuration of the sensor drive circuit O_SD according to the present disclosure is not limited to that illustrated in FIG. 4A. The sensor drive circuit O_SD illustrated in FIG. 4A is merely illustrative, and various changes and modifications may be made to the configuration of the sensor drive circuit O_SD.

The reset transistor ST1 includes a first electrode that receives the reset voltage Vrst, a second electrode connected with the first sensing node SN1, and a third electrode that receives a reset control signal SR. The reset transistor ST1 may reset the potential of the first sensing node SN1 to the reset voltage Vrst in response to the reset control signal SR. The reset control signal SR may be a signal provided through the reset control line SRL. However, the present disclosure is not limited thereto. Alternatively, the reset control signal SR may be the j-th compensation scan signal SCj supplied through the j-th compensation scan line SCLj. That is, the reset transistor ST1 may receive the j-th compensation scan signal SCj, which is supplied from the j-th compensation scan line SCLj, as the reset control signal SR. In one or more embodiments of the present disclosure, the reset voltage Vrst may have a lower voltage level than that of the second drive voltage ELVSS at least during an activation period of the reset control signal SR. The reset voltage Vrst may be transferred to the sensor FXdj through a reset voltage line VRL. The reset voltage Vrst may be a DC voltage maintained at a voltage level lower than that of the second drive voltage ELVSS.

The reset transistor ST1 may include a plurality of sub-reset transistors connected in series. For example, the reset transistor ST1 may include two sub-reset transistors (hereinafter, referred to as first and second sub-reset transistors). In this case, a third electrode of the first sub-reset transistor and a third electrode of the second sub-reset transistor are connected to the reset control line SRL.

Furthermore, a second electrode of the first sub-reset transistor and a first electrode of the second sub-reset transistor may be electrically connected with each other. In addition, the reset voltage Vrst may be applied to a first electrode of the first sub-reset transistor, and a second electrode of the second sub-reset transistor may be electrically connected with the first sensing node SN1. However, the number of sub-reset transistors is not limited thereto and may be diversely modified.

The amplifying transistor ST2 includes a first electrode that receives a sensing drive voltage SLVD, a second electrode connected with a second sensing node SN2, and a third electrode connected with the first sensing node SN1. The amplifying transistor ST2 may be turned on in response to the potential of the first sensing node SN1 and may apply the sensing drive voltage SLVD to the second sensing node SN2. In one or more embodiments of the present disclosure, the sensing drive voltage SLVD may be one of the first drive voltage ELVDD, the first initialization voltage Vint, and the second initialization voltage Vaint. When the sensing drive voltage SLVD is the first drive voltage ELVDD, the first electrode of the amplifying transistor ST2 may be electrically connected to the first drive voltage line VL1. When the sensing drive voltage SLVD is the first initialization voltage Vint, the first electrode of the amplifying transistor ST2 may be electrically connected to the first initialization voltage line VIL, and when the sensing drive voltage SLVD is the second initialization voltage Vaint, the first electrode of the amplifying transistor ST2 may be electrically connected to the second initialization voltage line VAIL.

The output transistor ST3 includes a first electrode connected with the second sensing node SN2, a second electrode connected with the d-th readout line RLd, and a third electrode that receives an output control signal. In response to the output control signal, the output transistor ST3 may transfer a detection signal FSd to the d-th readout line RLd. The output control signal may be the j-th write scan signal SWj supplied through the j-th write scan line SWLj. That is, the output transistor ST3 may receive the j-th write scan signal SWj, which is supplied from the j-th write scan line SWLj, as the output control signal.

The light receiving element OPD of the sensor FXdj may be exposed to light during a light emission period of the light emitting element ED. The light may be light output from the light emitting element ED.

If the user's hand US_F (refer to FIG. 1) touches the display surface IS (refer to FIG. 1), the light receiving element OPD generates photo-charges corresponding to light reflected by ridges of a fingerprint or valleys between the ridges. The amount of current flowing through the light receiving element OPD varies depending on the generated photo-charges. When the light receiving element OPD receives light reflected by the ridges of the fingerprint, a current flowing through the light receiving element OPD may be referred to as a first current, and when the light receiving element OPD receives light reflected by the valleys of the fingerprint, a current flowing through the light receiving element OPD may be referred to as a second current. The amount of light reflected by the ridges of the fingerprint and the amount of light reflected by the valleys of the fingerprint differ from each other, and the difference between the amounts of light appears as a difference between the first and second currents. When the first current flows through the light receiving element OPD, the potential of the first sensing node SN1 may be referred to as the first potential, and when the second current flows through the light receiving element OPD, the potential of the first sensing node SN1 may be referred to as the second potential. In one or more embodiments of the present disclosure, the first current may be greater than the second current. In this case, the first potential may be lower than the second potential.

The amplifying transistor ST2 may be a source follower amplifier that generates a source-drain current in proportion to the potential of the first sensing node SN1 that is input to the third electrode of the amplifying transistor ST2.

During the fourth activation period AP4, the j-th write scan signal SWj having the low level is supplied to the output transistor ST3 through the j-th write scan line SWLj. When the output transistor ST3 is turned on in response to the j-th write scan signal SWj having the low level, the detection signal FSd corresponding to a current flowing through the amplifying transistor ST2 may be output to the d-th readout line RLd.

When the reset control signal RST having a high level is supplied through the reset control line SRL during a reset period, the reset transistor ST1 is turned on. The reset period may be defined as an activation period (that is, a high-level period) of the reset control signal SR. Alternatively, when the reset transistor ST1 is implemented with a P-type transistor, the reset control signal SR having a low level may be supplied to the reset control line SRL during the reset period. The first sensing node SN1 may be reset to a potential corresponding to the reset voltage Vrst during the reset period. In one or more embodiments of the present disclosure, the reset voltage Vrst may have a lower voltage level than that of the second drive voltage ELVSS.

When the reset period ends, the light receiving element OPD may generate photo-charges corresponding to received light, and the generated photo-charges may be accumulated in the first sensing node SN1.

Figure 5:
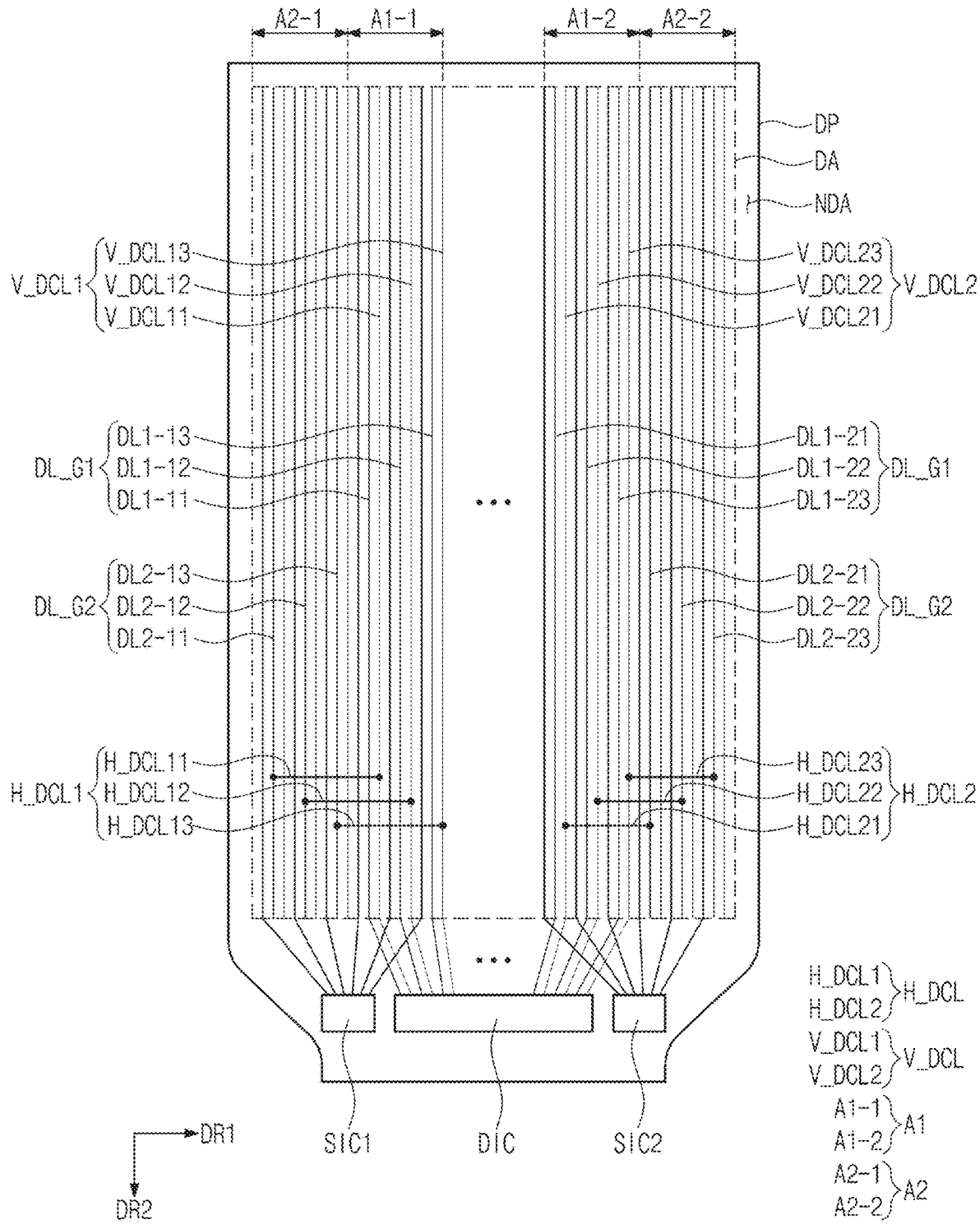
FIG. 5 is a plan view of a display panel according to one or more embodiments of the present disclosure.

FIG. 5 is a plan view of the display panel according to one or more embodiments of the present disclosure. For convenience of description, the scan lines and the data lines are omitted, and only the readout lines are illustrated in FIG. 5.

Referring to FIG. 5, the display panel DP includes the display region DA and the non-display region NDA. The plurality of pixels PX (refer to FIG. 3) and the plurality of sensors FX (refer to FIG. 3) are disposed in the display region DA. The drive chip DIC and the sensor chips SIC1 and SIC2 are mounted on the non-display region NDA.

The data lines DL1 to DLm (refer to FIG. 3) are connected to the plurality of pixels PX in the display region DA and are connected to the driver chip DIC in the non-display region NDA. The readout lines RL1 to RLh (refer to FIG. 3) are connected to the plurality of sensors FX in the display region DA and are connected to the sensor chips SIC1 and SIC2 in the non-display region NDA.

The data lines DL1 to DLm may be divided into a first group and a second group. The first group includes a plurality of first data lines DL_G1, and the second group includes a plurality of second data lines DL_G2. The plurality of first data lines DL_G1 are arranged along the first direction DR1, and the plurality of second data lines DL_G2 are arranged along the first direction DR1. The plurality of first data lines DL_G1 are spaced from the plurality of second data lines DL_G2 in the first direction DR1.

The plurality of first data lines DL_G1 are connected to pixel drive circuits P_PD of a first group of pixels from among the plurality of pixels PX, and the plurality of second data lines DL_G2 are connected to pixel drive circuits P_PD of a second group of pixels from among the plurality of pixels PX. The first group of pixels and the first data lines DL_G1 are disposed in a first region A1, and the second group of pixels and the second data lines DL_G2 are disposed in a second region A2. The first region A1 includes a first-first region A1-1 defined on a first side with respect to a center line of the display panel DP parallel to the second direction DR2 and a first-second region A1-2 defined on a second side with respect to the center line. The second region A2 includes a second-first region A2-1 disposed between the first-first region A1-1 and the non-display region NDA and a second-second region A2-2 disposed between the first-second region A1-2 and the non-display region NDA.

The plurality of first data lines DL_G1 include first-first data lines DL1-11 to DL1-13 disposed in the first-first region A1-1 and first-second data lines DL1-21 to DL1-23 disposed in the first-second region A1-2. The plurality of second data lines DL_G2 include second-first data lines DL2-11 to DL2-13 disposed in the second-first region A2-1 and second-second data lines DL2-21 to DL2-23 disposed in the second-second region A2-2.

The first-first data lines DL1-11 to DL1-13 and the first-second data lines DL1-21 to DL1-23 are connected to the driver chip DIC. Although FIG. 5 illustrates an example that the first-first data lines DL1-11 to DL1-13 and the first-second data lines DL1-21 to DL1-23 are connected to the same driver chip DIC, the present disclosure is not limited thereto. For example, the first-first data lines DL1-11 to DL1-13 and the first-second data lines DL1-21 to DL1-23 may be connected to different driver chips.

The display panel DP further includes data connecting lines that connect the second data lines DL_G2 to the driver chip DIC. The data connecting lines include a plurality of vertical data connecting lines V_DCL extending along the first data lines DL_G1 and a plurality of horizontal data connecting lines H_DCL extending in the first direction DR1.

The plurality of horizontal data connecting lines H_DCL include first horizontal data connecting lines H_DCL1 including H_DCL11 to H_DCL13 and second horizontal data connecting lines H_DCL2 including H_DCL21 to H_DCL23. The first horizontal data connecting lines H_DCL11 to H_DCL13 are connected with the second-first data lines DL2-11 to DL2-13, and the second horizontal data connecting lines H_DCL21 to H_DCL23 are connected with the second-second data lines DL2-21 to DL2-23. The plurality of vertical data connecting lines V_DCL include first vertical data connecting lines V_DCL1 including V_DCL11 to V_DCL13 and second vertical data connecting lines V_DCL2 including V_DCL21 to V_DCL23. The first vertical data connecting lines V_DCL11 to V_DCL13 are connected to the first horizontal data connecting lines H_DCL11 to H_DCL13, and the second vertical data connecting lines V_DCL21 to V_DCL23 are connected with the second horizontal data connecting lines H_DCL21 to H_DCL23.

Accordingly, the first vertical data connecting lines V_DCL11 to V_DCL13 are electrically connected with the second-first data lines DL2-11 to DL2-13 by the first horizontal data connecting lines H_DCL11 to H_DCL13. The second vertical data connecting lines V_DCL21 to V_DCL23 are electrically connected with the second-second data lines DL2-21 to DL2-23 by the second horizontal data connecting lines H_DCL21 to H_DCL23.

The first vertical data connecting lines V_DCL11 to V_DCL13 alternate with the first-first data lines DL1-11 to DL1-13 in the first-first region A1-1. The second vertical data connecting lines V_DCL21 to V_DCL23 alternate with the first-second data lines DL1-21 to DL1-23 in the first-second region A1-2.

The plurality of horizontal data connecting lines H_DCL (H_DCL1 and H_DCL2) and portions of the vertical data connecting lines V_DCL (V_DCL1 and V_DCL2) may be disposed in the display region DA. That is, portions of the data connecting lines for connecting the second data lines DL_G2 and the driver chip DIC are disposed in the display region DA. Accordingly, the area of the region occupied by the data connecting lines in the non-display region NDA may be decreased, and thus the area of dead space of the display panel DP may be decreased.

Figure 6:
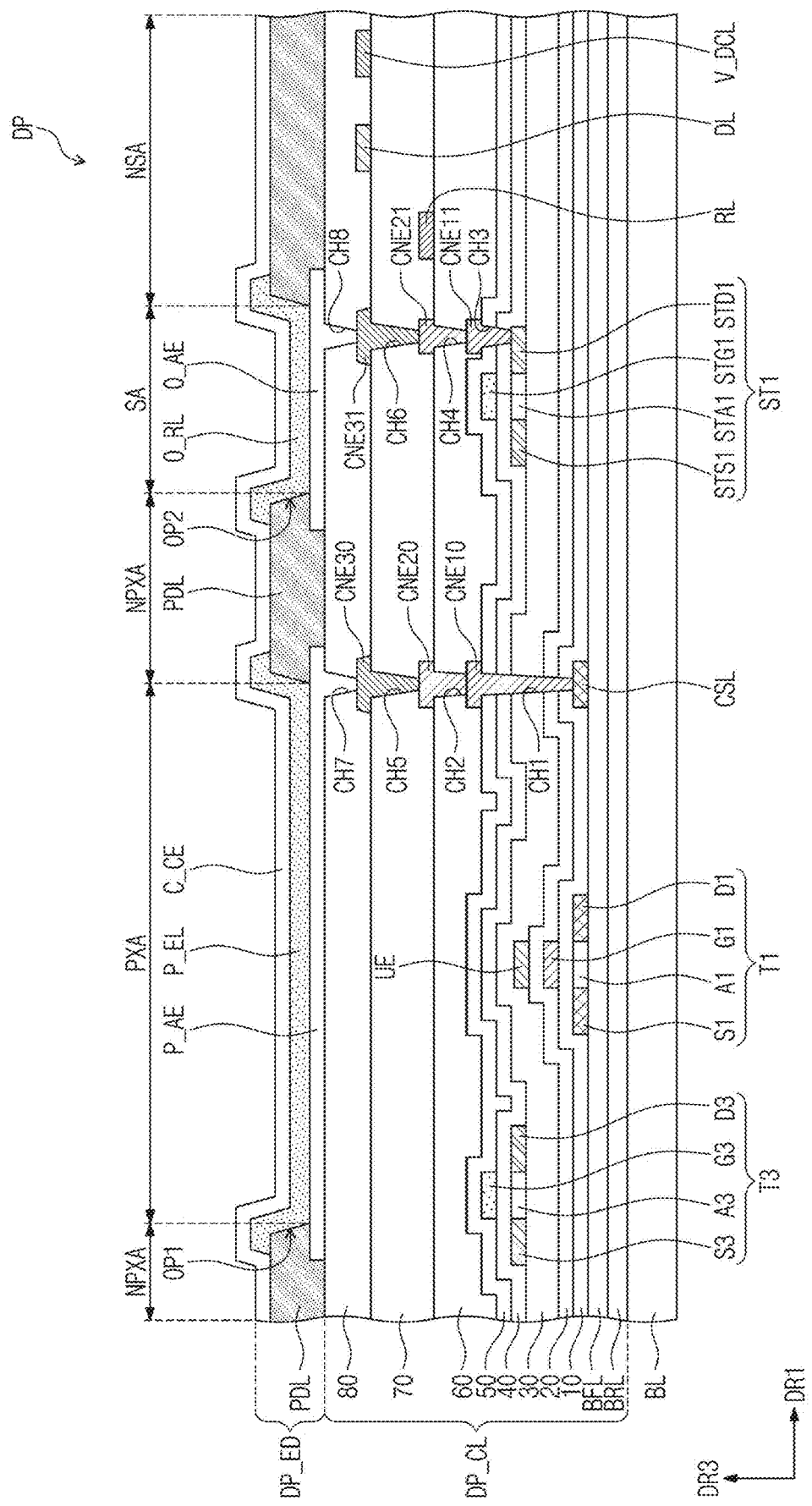
FIG. 6 is a sectional view of the display panel according to one or more embodiments of the present disclosure.

FIG. 6 is a sectional view of the display panel according to one or more embodiments of the present disclosure.

Referring to FIG. 6, the display panel DP may include the base layer BL, the circuit layer DP_CL, and the element layer DP_ED.

The base layer BL may include a synthetic resin layer. The synthetic resin layer may include a thermosetting resin. In particular, the synthetic resin layer may be a polyimide-based resin layer, and the material thereof is not particularly limited. The synthetic resin layer may include at least one of an acrylic resin, a methacrylic resin, a polyisoprene resin, a vinyl resin, an epoxy resin, a urethane-based resin, a cel-luosic resin, a siloxane-based resin, a polyamide resin, and/or a perylene-based resin. In addition, the base layer BL may include a glass substrate, a metal substrate, and/or an organic and/or inorganic composite substrate.

At least one inorganic layer is formed on an upper surface of the base layer BL. The inorganic layer may include at least one of aluminum oxide, titanium oxide, silicon oxide, silicon oxy nitride, zirconium oxide, and/or hafnium oxide. The inorganic layer may be formed of multiple layers. The multiple inorganic layers may constitute a barrier layer BRL and/or a buffer layer BFL that will be described below. The barrier layer BRL and the buffer layer BFL may be selectively disposed.

The circuit layer DP_CL may include the barrier layer BRL and/or the buffer layer BFL. The barrier layer BRL prevents infiltration of foreign matter from the outside. The barrier layer BRL may include a silicon oxide layer and/or a silicon nitride layer. A plurality of silicon oxide layers and a plurality of silicon nitride layers may be provided. The silicon oxide layers and the silicon nitride layers may be alternately stacked one above another.

The buffer layer BFL may be disposed on the barrier layer BRL. The buffer layer BFL improves a coupling force between the base layer BL and a semiconductor pattern and/or a conductive pattern. The buffer layer BFL may include silicon oxide layers and/or silicon nitride layers. The silicon oxide layers and the silicon nitride layers may be alternately stacked one above another.

The semiconductor pattern is disposed on the buffer layer BFL. Hereinafter, the semiconductor pattern directly disposed on the buffer layer BFL is defined as the first semiconductor pattern. The first semiconductor pattern may include a silicon semiconductor. The first semiconductor pattern may include poly-silicon. However, without being limited thereto, the first semiconductor pattern may include amorphous silicon.

FIG. 6 merely illustrates a portion of the first semiconductor pattern, and the first semiconductor pattern may be additionally disposed in another region of the pixel PXij (refer to FIG. 4A). The first semiconductor pattern has different electrical properties depending on whether the first semiconductor pattern is doped or not. The first semiconductor pattern may include a doped region and an undoped region. The doped region may be doped with an N-type dopant or a P-type dopant. A P-type transistor includes a doped region doped with a P-type dopant, and an N-type transistor includes a doped region doped with an N-type dopant.

The doped region has a higher conductivity than the undoped region and substantially serves as an electrode or a signal line. The undoped region substantially corresponds to an active region (or, a channel) of a transistor. In other words, one portion of the first semiconductor pattern may be the active region of the transistor, another portion may be a source or drain of the transistor, and another portion may be a connecting signal line (or, a connecting electrode).

As illustrated in FIG. 6, the first electrode S1, a channel part A1, and the second electrode D1 of the first transistor T1 are formed from the first semiconductor pattern. The first electrode S1 and the second electrode D1 of the first transistor T1 extend from the channel part A1 in opposite directions.

In FIG. 6, a portion of a connecting signal line CSL formed from the semiconductor pattern is illustrated. In one or more embodiments, the connecting signal line CSL may be connected to the second electrode of the sixth transistor T6 (refer to FIG. 4A) on a plane (e.g., in a plan view).

A first insulating layer 10 is disposed on the buffer layer BFL. The first insulating layer 10 commonly overlaps the plurality of pixels PX (refer to FIG. 3) and covers the first semiconductor pattern. The first insulating layer 10 may be an inorganic layer and/or an organic layer and may have a single-layer structure or a multi-layer structure. The first insulating layer 10 may include at least one of aluminum oxide, titanium oxide, silicon oxide, silicon oxy nitride, zirconium oxide, and/or hafnium oxide. In one or more embodiments, the first insulating layer 10 may be a single silicon oxide layer. Not only the first insulating layer 10 but also insulating layers of the circuit layer DP_CL that will be described below may be inorganic layers and/or organic layers and may have a single-layer structure or a multi-layer structure. The inorganic layers may include at least one of the aforementioned materials.

The third electrode G1 of the first transistor T1 is disposed on the first insulating layer 10. The third electrode G1 may be a portion of a first gate pattern layer GAT1 (refer to FIG. 15C). The third electrode G1 of the first transistor T1 overlaps the channel part A1 of the first transistor T1 in the third direction DR3. The third electrode G1 of the first transistor T1 may serve as a mask in a process of doping the first semiconductor pattern.

A second insulating layer 20 is disposed on the first insulating layer 10 and covers the third electrode G1 of the first transistor T1. The second insulating layer 20 commonly overlaps the plurality of pixels PX. The second insulating layer 20 may be an inorganic layer and/or an organic layer and may have a single-layer structure or a multi-layer structure. In one or more embodiments, the second insulating layer 20 may be a single silicon oxide layer.

An upper electrode UE may be disposed on the second insulating layer 20. The upper electrode UE may overlap the third electrode G1 of the first transistor T1 in the third direction DR3. The upper electrode UE may be a portion of a second gate pattern layer GAT2 (refer to FIG. 15D), or may be a portion of a doped semiconductor pattern. A portion of the third electrode G1 and the upper electrode UE overlapping the portion of the third electrode G1 may define the capacitor Cst (refer to FIG. 4A). In one or more embodiments of the present disclosure, the upper electrode UE may be omitted.

In one or more embodiments of the present disclosure, the second insulating layer 20 may be replaced with an insulating pattern. The upper electrode UE is disposed on the insulating pattern. The upper electrode UE may serve as a mask that forms the insulating pattern from the second insulating layer 20.

A third insulating layer 30 is disposed on the second insulating layer 20 and covers the upper electrode UE. In one or more embodiments, the third insulating layer 30 may be a single silicon oxide layer. A semiconductor pattern is disposed on the third insulating layer 30. Hereinafter, the semiconductor pattern directly disposed on the third insulating layer 30 is defined as the second semiconductor pattern. The second semiconductor pattern may include metal oxide. An oxide semiconductor may include a crystalline or amorphous oxide semiconductor. For example, the oxide semiconductor may include metal oxide of zinc (Zn), indium (In), gallium (Ga), tin (Sn), and/or titanium (Ti), or may include metal such as zinc (Zn), indium (In), gallium (Ga), tin (Sn), and/or titanium (Ti) and a mixture of oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), and/or zinc-tin oxide (ZTO).

FIG. 6 merely illustrates a portion of the second semiconductor pattern, and the second semiconductor pattern may be additionally disposed in another region of the pixel PXij. The second semiconductor pattern may include a plurality of regions distinguished depending on whether metal oxide is reduced or not. A region where metal oxide is reduced (hereinafter, referred to as a reduced region) has a higher conductivity than a region where metal oxide is not reduced (hereinafter, referred to as a non-reduced region). The reduced region substantially serves as an electrode or a signal line. The non-reduced region substantially corresponds to a channel part of a transistor. In other words, one portion of the second semiconductor pattern may be the channel part of the transistor, and another portion may be a first electrode or a second electrode of the transistor.

The circuit layer DP_CL may further include a portion of a semiconductor patterns of the pixel drive circuit P_PD (refer to FIG. 4A) and a portion of a semiconductor patterns of the sensor drive circuit O_SD (refer to FIG. 4A). For convenience of description, the semiconductor pattern of the third transistor T3 of the pixel drive circuit P_PD and the semiconductor pattern of the reset transistor ST1 of the sensor drive circuit O_SD are illustrated. The first electrode S3, a channel part A3, and the second electrode D3 of the third transistor T3 are formed from the second semiconductor pattern, and first electrode STS1, a channel part STA1, and the second electrode STD1 of the reset transistor ST1 are formed from the second semiconductor pattern. In one or more embodiments of the present disclosure, the second semiconductor pattern may include metal oxide. The first electrode S3, the second electrode D3, the first electrode STS1 and the second electrode STD1 include metal reduced from a metal oxide semiconductor. The first electrode S3, the second electrode D3, the first electrode STS1 and the second electrode STD1 may include a metal layer that has a suitable thickness (e.g., a predetermined thickness) from an upper surface of the second semiconductor pattern and includes the reduced metal.

A fourth insulating layer 40 is disposed on the third insulating layer 30 to cover first electrode S3, the channel part A3, and the second electrode D3 of the third transistor T3, and the first electrode STS1, the channel part STA1, and the second electrode STD1 of the reset transistor ST1. The third electrode G3 of the third transistor T3 and the third electrode STG1 of the reset transistor ST1 is disposed on the fourth insulating layer 40. In one or more embodiments, the third electrode G3 of the third transistor T3 and the third electrode STG1 of the reset transistor ST1 may be a portion of a third gate pattern layer GAT3 (refer to FIG. 15F). The third electrode G3 of the third transistor T3 overlaps the channel part A3 of the third transistor T3 in the third direction DR3 and the third electrode STG1 of the reset transistor ST1 overlaps the channel part STA1 of the reset transistor ST1 in the third direction DR3. Although one third electrode STG1 is illustrated in this embodiment for convenience of description, the reset transistor ST1 may include two third electrodes.

A fifth insulating layer 50 is disposed on the fourth insulating layer 40 and covers the third electrode G3 of the third transistor T3 and the third electrode STG1 of the reset transistor ST1. In one or more embodiments, the fifth insulating layer 50 may include a silicon oxide layer and/or a silicon nitride layer. The fifth insulating layer 50 may include a plurality of silicon oxide layers and a plurality of silicon nitride layers alternately stacked one above another.

At least one insulating layer is additionally disposed on the fifth insulating layer 50. As in this embodiment, a sixth insulating layer 60 and a seventh insulating layer 70 may be sequentially disposed on the fifth insulating layer 50. Each of the sixth insulating layer 60 and the seventh insulating layer 70 may be organic layers and may have a single-layer structure or a multi-layer structure. Each of the sixth insulating layer 60 and the seventh insulating layer 70 may be a single polyimide-based resin layer. Without being limited thereto, the sixth insulating layer 60 and the seventh insulating layer 70 may include at least one of an acrylic resin, a methacrylic resin, a polyisoprene resin, a vinyl resin, an epoxy resin, a urethane-based resin, a celluosic resin, a siloxane-based resin, a polyamide resin, and/or a perylene-based resin.

A first connecting electrode CNE10 may be disposed on the fifth insulating layer 50. The first connecting electrode CNE10 is connected to the connecting signal line CSL through a first contact hole CH1 penetrating the first to fifth insulating layers 10 to 50. A second connecting electrode CNE20 may be connected to the first connecting electrode CNE10 through a second contact hole CH2 penetrating the sixth insulating layer 60. In one or more embodiments of the present disclosure, at least one of the fifth to seventh insulating layers 50 to 70 may be omitted, and one of the first and second connecting electrodes CNE10 and CNE20 may be omitted.

A third connecting electrode CNE11 may be additionally disposed on the fifth insulating layer 50. The third connecting electrode CNE11 is connected with the second electrode STD1 of the reset transistor ST1 through a third contact hole CH3 penetrating the fourth and fifth insulating layers 40 and 50. A fourth connecting electrode CNE21 may be connected to the third connecting electrode CNE11 through a fourth contact hole CH4 penetrating the sixth insulating layer 60.

Figure 15A:
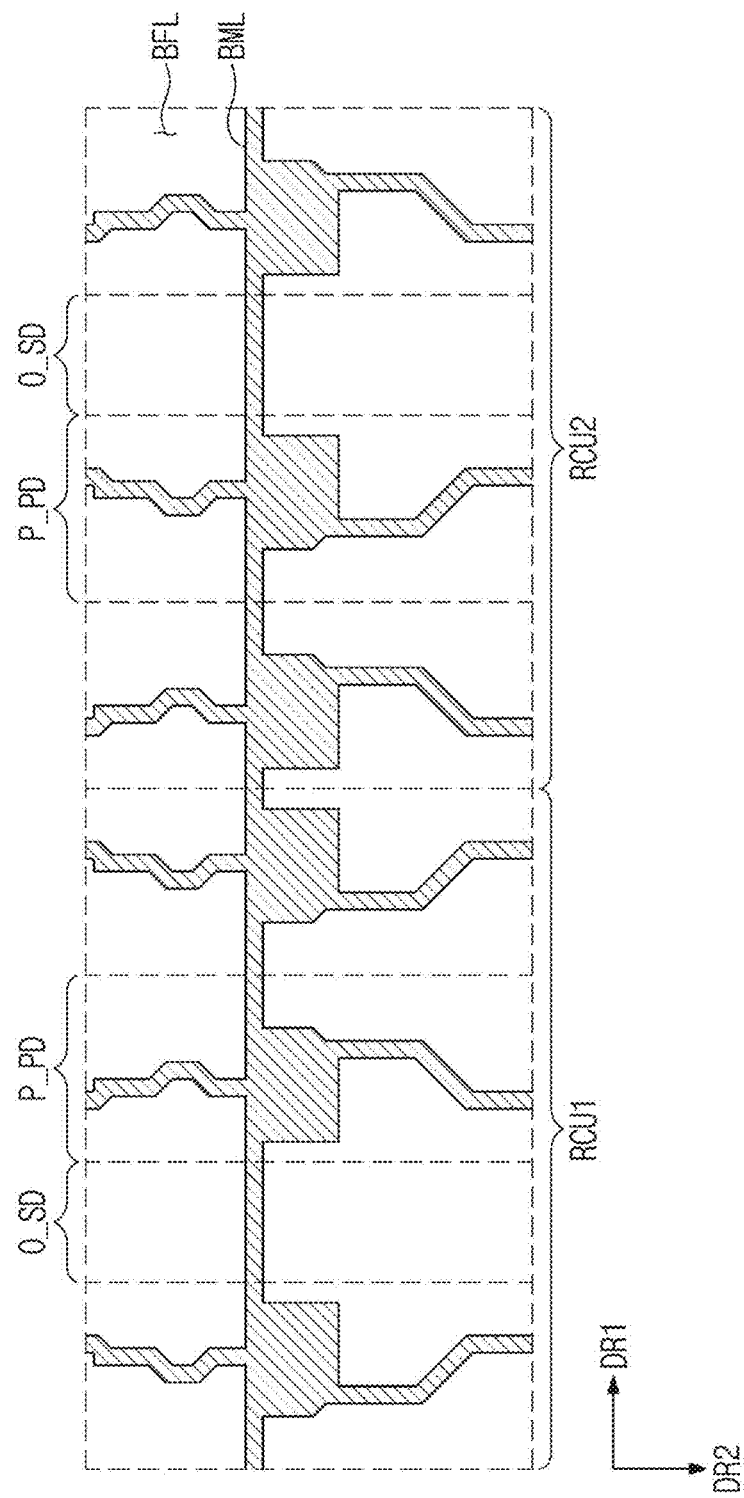
FIGS. 15A-15I are plan views illustrating a manufacturing process of a circuit layer according to one or more embodiments of the present disclosure.
Figure 15B:
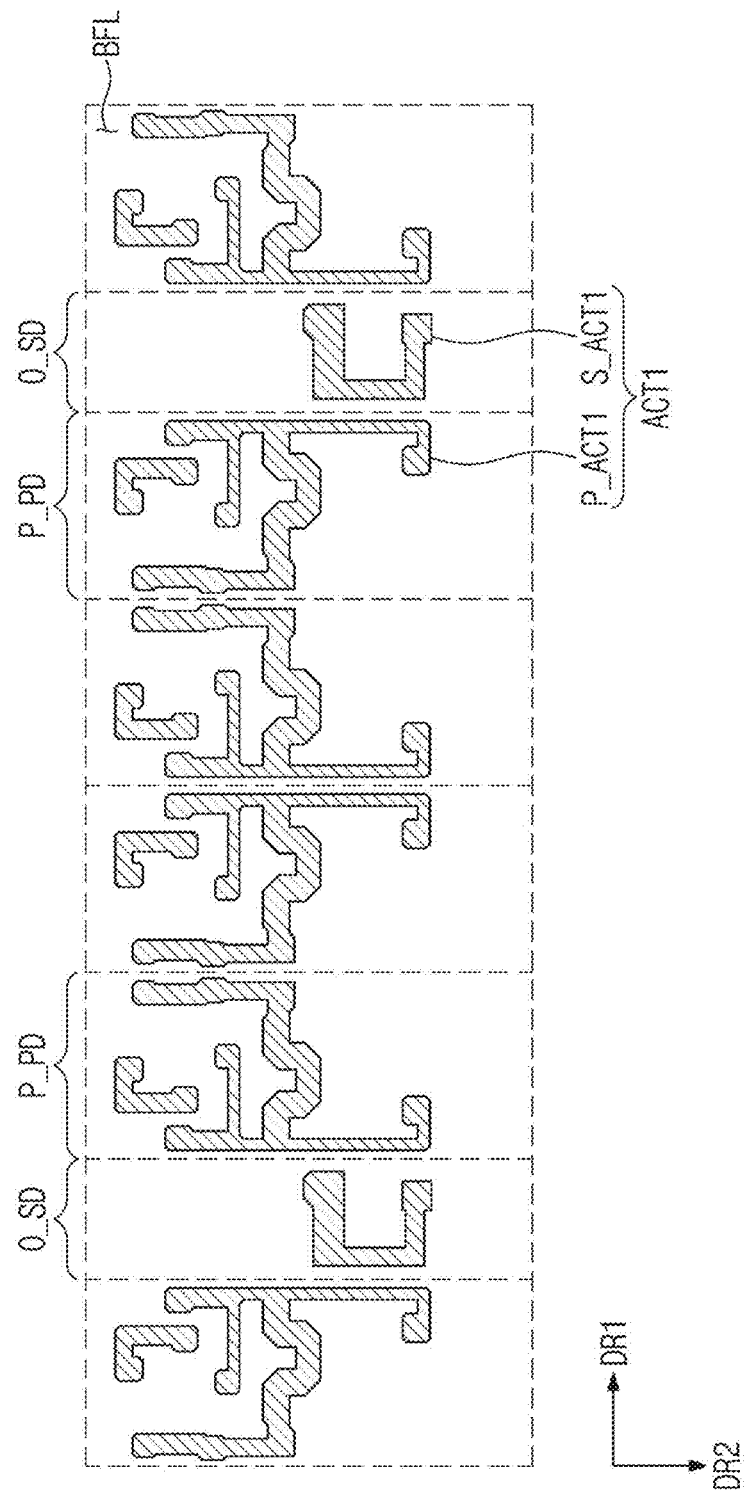
Figure 15C:
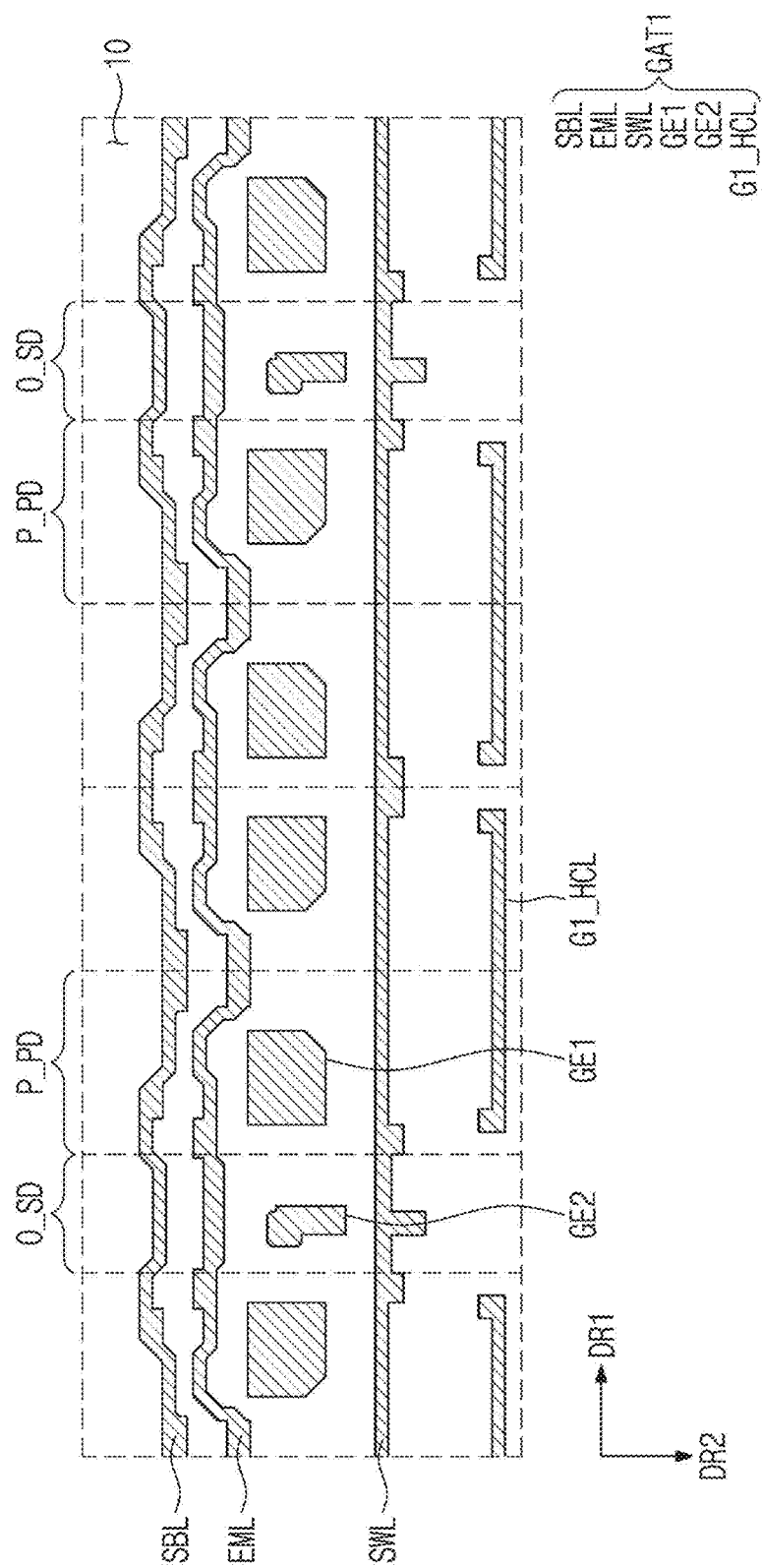
Figure 15D:
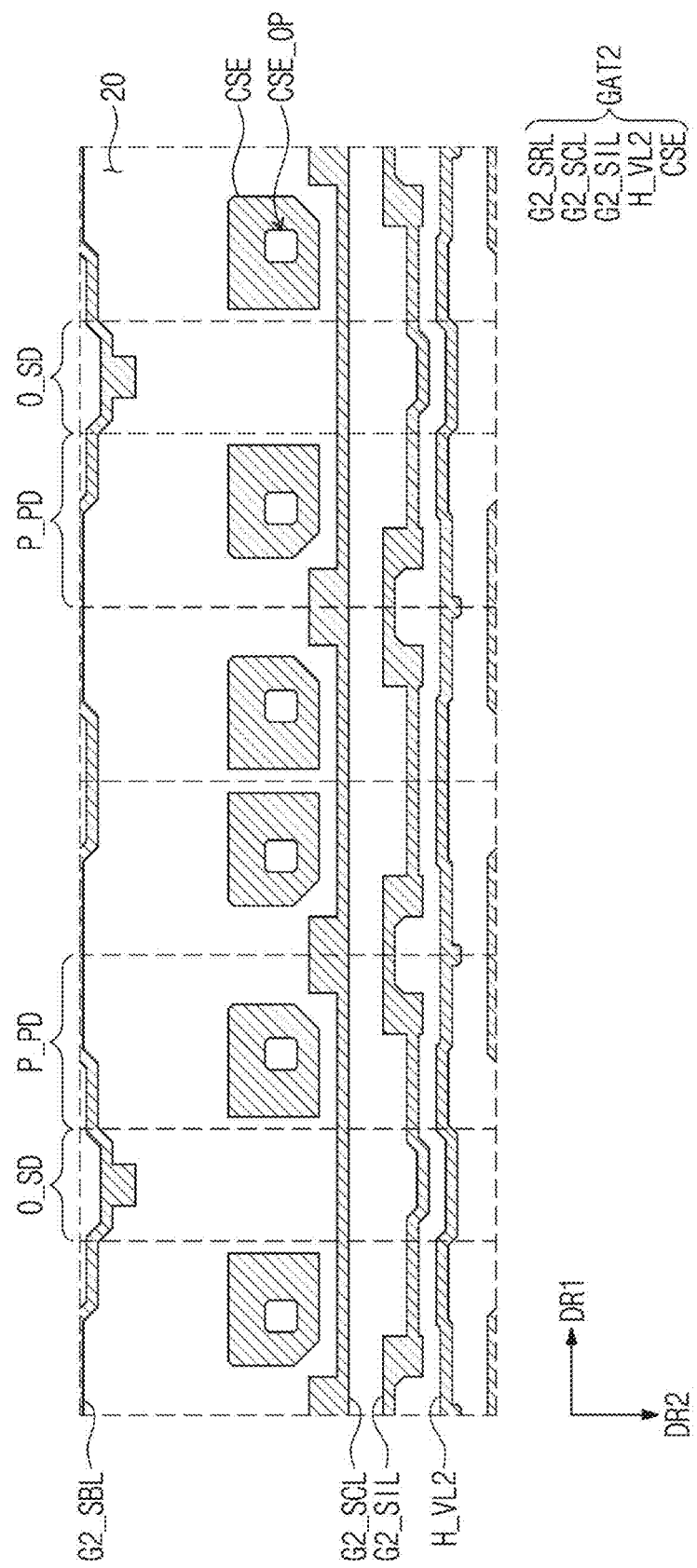
Figure 15E:
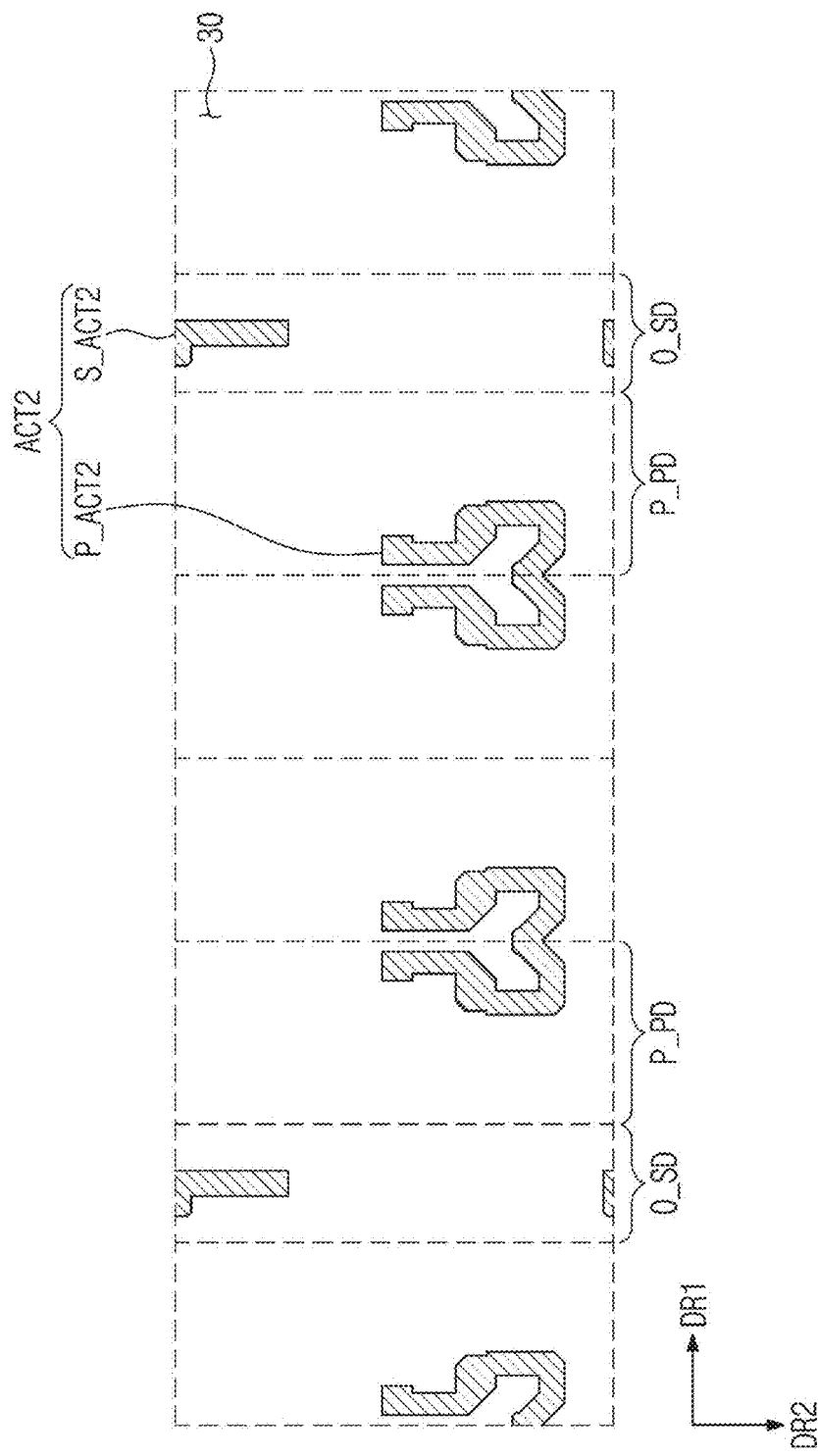
Figure 15F:
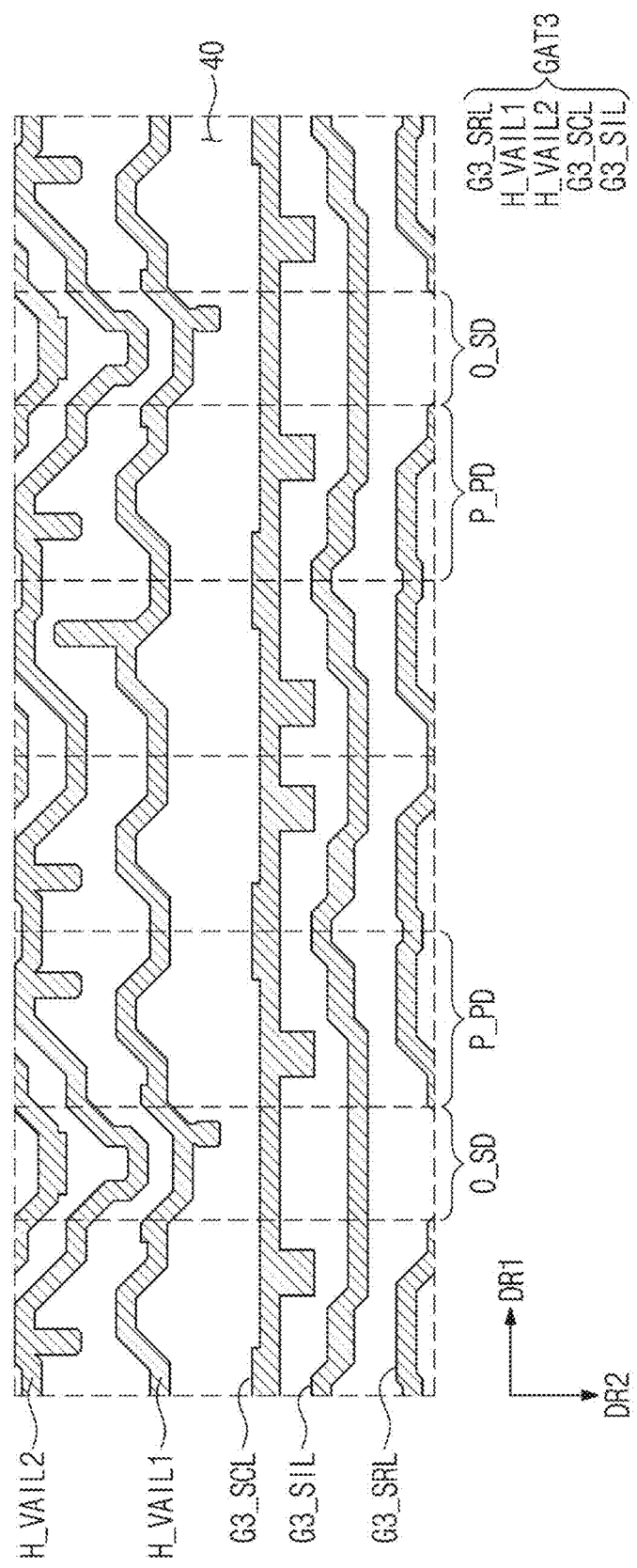
Figure 15G:
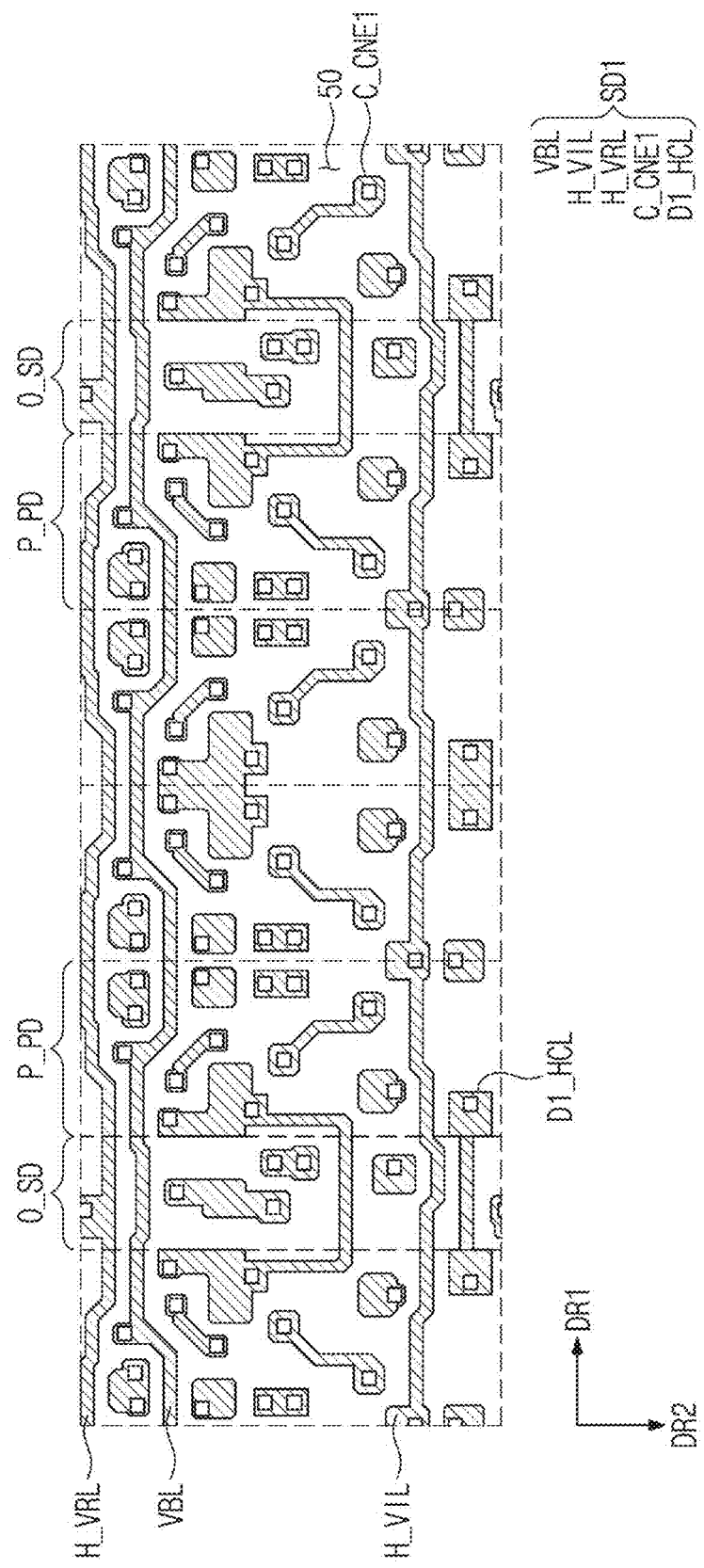
Figure 15H:
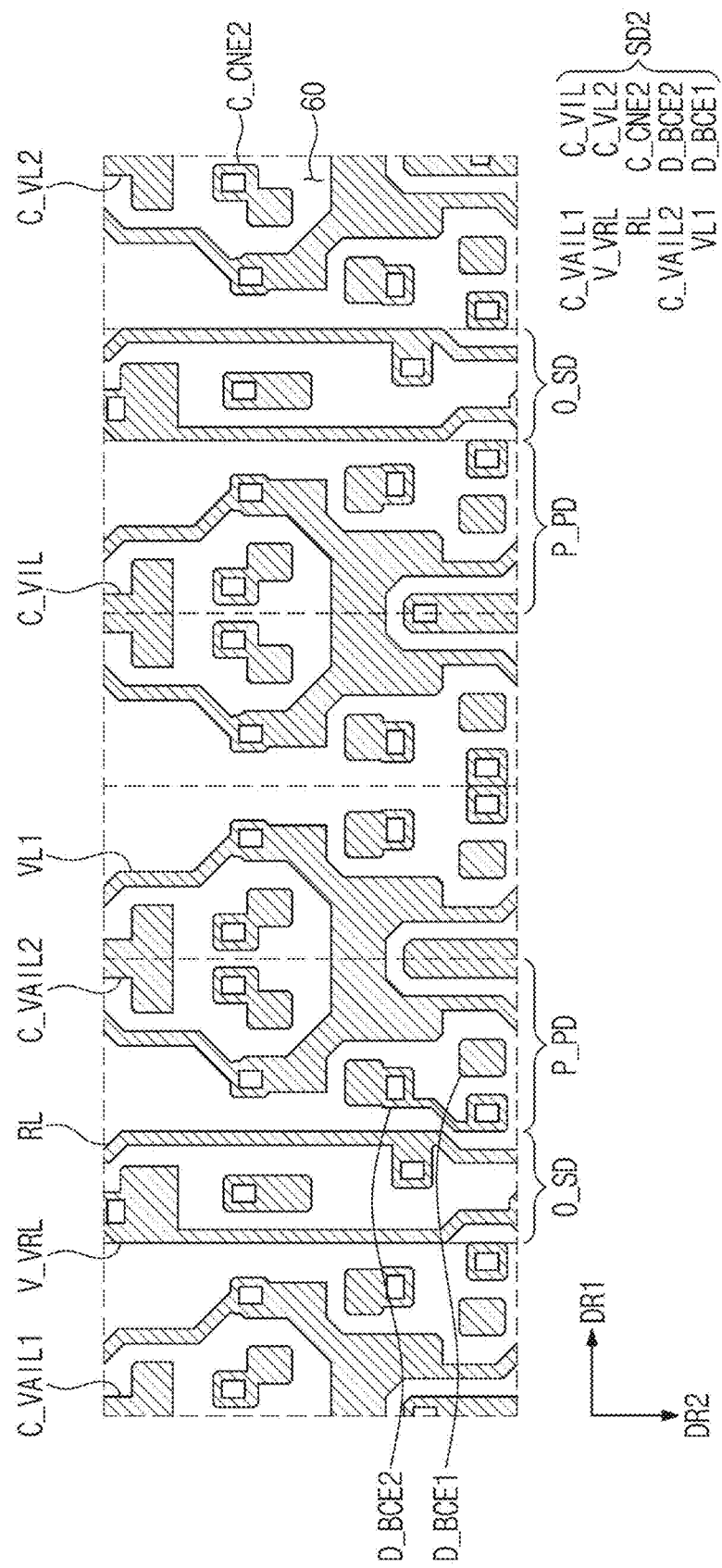

The first and third connecting electrodes CNE10 and CNE11 may be portions of a first data pattern layer SD1 (refer to FIG. 15G), and the second and fourth connecting electrodes CNE20 and CNE21 may be portions of a second data pattern layer SD2 (refer to FIG. 15H).

The horizontal data connecting lines H_DCL (refer to FIG. 5) may be disposed on (e.g., at) the same layer as a layer (that is, on the fifth insulating layer 50) on which the first and third connecting electrodes CNE10 and CNE11 are disposed. However, the present disclosure is not limited thereto. The horizontal data connecting lines H_DCL may be disposed on (e.g., at) the same layer as a layer (that is, on the first insulating layer 10) on which the first electrode S1 of the first transistor T1 is disposed.

A readout wiring RL may be disposed on (e.g., at) the same layer as a layer (that is, on the sixth insulating layer 60) on which the second and fourth connecting electrodes CNE20 and CNE21 are disposed. The readout wiring RL may be one of the readout lines RL1 to RLh illustrated in FIG. 3. The second and fourth connecting electrodes CNE20 and CNE21 and the readout wiring RL are covered by the seventh insulating layer 70.

A data wiring DL and the vertical data connecting lines V_DCL may be disposed on (e.g., at) the seventh insulating layer 70. The data wiring DL may be one of the data lines DL1 to DLm illustrated in FIG. 3. A fifth connecting electrode CNE30 and a sixth connecting electrode CNE31 may be additionally disposed on the seventh insulating layer 70. The fifth connecting electrode CNE30 may be connected with the second connecting electrode CNE20 through a fifth contact hole CH5 penetrating the seventh insulating layer 70. The sixth connecting electrode CNE31 may be connected to the fourth connecting electrode CNE21 through a sixth contact hole CH6 penetrating the seventh insulating layer 70. The data wiring DL and the vertical data connecting lines V_DCL may be disposed on (e.g., at) the same layer as a layer (that is, on the seventh insulating layer 70) on which the fifth connecting electrode CNE30 and the sixth connecting electrode CNE31 are disposed, but may be electrically insulated from each other. The data wiring DL, the vertical data connecting lines V_DCL, the fifth connecting electrode CNE30, and the sixth connecting electrode CNE31 are covered by an eighth insulating layer 80.

The element layer DP_ED is disposed on the circuit layer DP_CL. The element layer DP_ED may include the anode electrode P_AE of the light emitting element ED (refer to FIG. 4A) and the anode electrode O_AE of the light receiving element OPD (refer to FIG. 4A). As illustrated in FIG. 6, the anode electrode P_AE of the light emitting element ED may be connected to the fifth connecting electrode CNE30 through a seventh contact hole CH7 penetrating the eighth insulating layer 80. The anode electrode O_AE of the light receiving element OPD may be connected to the sixth connecting electrode CNE31 through an eighth contact hole CH8 penetrating the eighth insulating layer 80.

Although the structure in which the circuit layer DP_CL includes the fifth connecting electrode CNE30 and the sixth connecting electrode CNE31 is illustrated in FIG. 6, the present disclosure is not limited thereto. Alternatively, the fifth connecting electrode CNE30 and the sixth connecting electrode CNE31 may be omitted from the circuit layer DP_CL. In this case, the anode electrode P_AE may be directly connected with the second connecting electrode CNE20, and the anode electrode O_AE may be directly connected with the fourth connecting electrode CNE21.

The element layer DP_ED further includes a pixel defining layer PDL disposed on the circuit layer DP_CL. The pixel defining layer PDL may include a light emitting opening OP1 corresponding to the light emitting element ED and a light receiving opening OP2 corresponding to the light receiving element OPD. The light emitting opening OP1 exposes at least a portion of the anode electrode P_AE of the light emitting element ED. The light emitting opening OP1 of the pixel defining layer PDL may define a light emitting region PXA. For example, the plurality of pixels PX (refer to FIG. 3) may be arranged on a plane (e.g., in a plan view) of the display panel DP (refer to FIG. 3) according to a rule (e.g., a predetermined rule). Regions where the plurality of pixels PX are disposed may be defined as pixel regions, and one pixel region may include the light emitting region PXA and a non-light emitting region NPXA adjacent to the light emitting region PXA. The non-light emitting region NPXA may be around (e.g., may surround) the light emitting region PXA.

The light receiving opening OP2 exposes the anode electrode O_AE of the light receiving element OPD. The light receiving opening OP2 of the pixel defining layer PDL may define a light receiving region SA. For example, the plurality of sensors FX (refer to FIG. 3) may be arranged on a plane (e.g., in a plan view) of the display layer DP according to a rule (e.g., a predetermined rule). The regions where the plurality of sensors FX are disposed may be defined as sensing regions, and one sensing region may include the light receiving region SA and a non-light receiving region NSA adjacent to the light receiving region SA. The non-light receiving region NSA may be around (e.g., may surround) the light receiving region SA.

A light emitting layer P_EL is disposed to correspond to the light emitting opening OP1 defined in the pixel defining layer PDL, and a photoelectric conversion layer O_RL is provided to correspond to the light receiving opening OP2 defined in the pixel defining layer PDL. Although the patterned light emitting layer P_EL is illustrated in this embodiment, the present disclosure is not limited thereto. A common light emitting layer may be commonly disposed for the plurality of pixels PX. In this case, the common light emitting layer may generate white light or blue light. The common cathode electrode C_CE is commonly connected to the light emitting element ED and the light receiving element OPD. The common cathode electrode C_CE may face the anode electrode O_AE and the anode electrode P_AE. The common cathode electrode C_CE is disposed on the light emitting layer P_EL and the photoelectric conversion layer O_RL. The common cathode electrode C_CE is commonly disposed for the plurality of pixels PX and the plurality of sensors FX.

Figure 7:
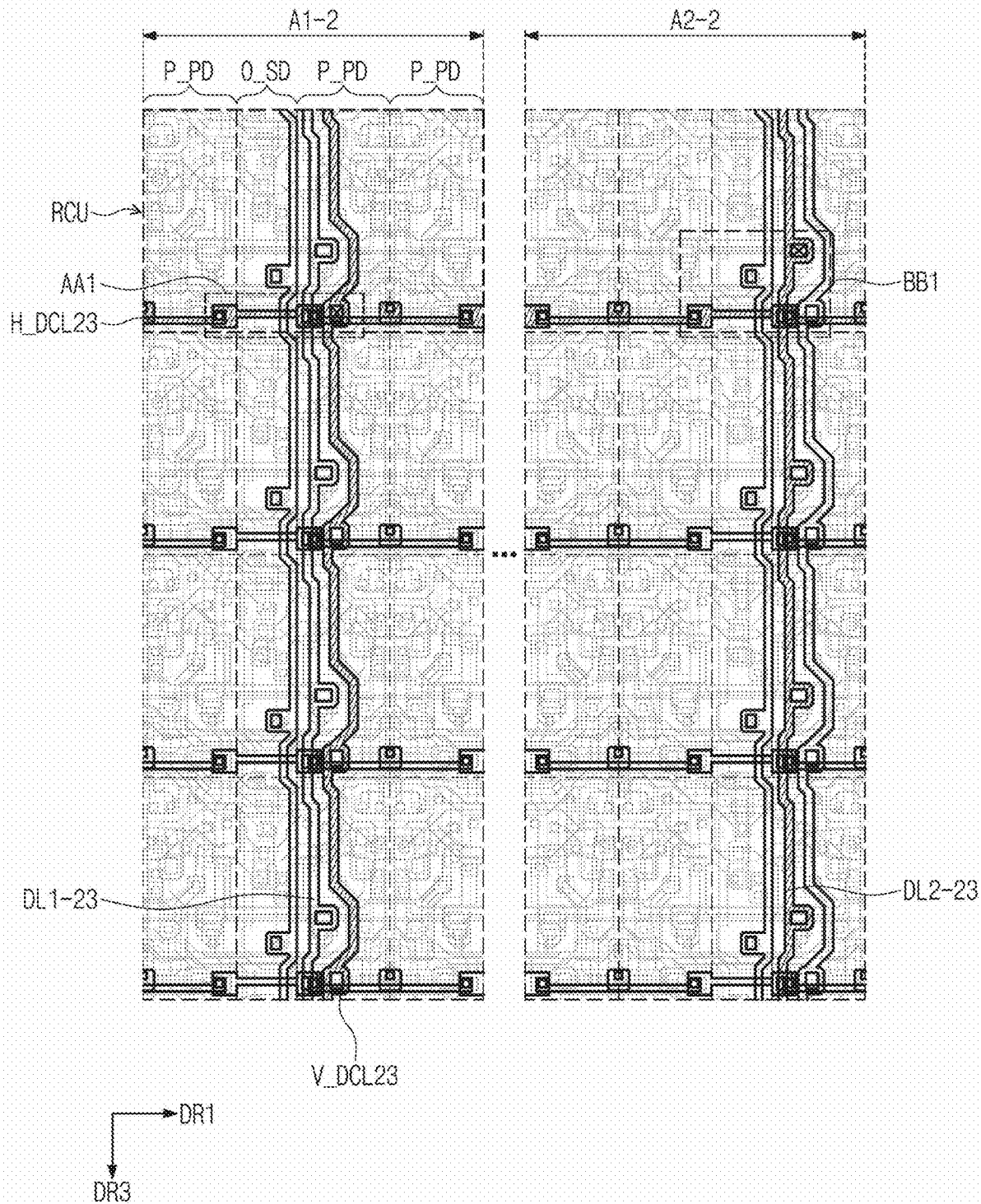
FIG. 7 is an enlarged plan view illustrating a portion of the display panel according to one or more embodiments of the present disclosure.

FIG. 7 is an enlarged plan view illustrating a portion of the display panel according to one or more embodiments of the present disclosure. On a plane (e.g., in a plan view), conductive patterns and semiconductor patterns of the display panel may be repeatedly arranged according to a rule (e.g., a predetermined rule). In FIG. 7, some of the pixel drive circuits P_PD and some of the sensor drive circuits O_SD are illustrated.

The circuit layer DP_CL includes a plurality of reference circuit units RCU, and at least one sensor drive circuit O_SD and at least one pixel drive circuit P_PD are included in each of the reference circuit units RCU. In FIG. 7, a structure in which one sensor drive circuit O_SD and three pixel drive circuits P_PD are included in one reference circuit unit RCU is illustrated. However, the numbers of sensor drive circuits O_SD and pixel drive circuits P_PD included in each reference circuit unit RCU are not particularly limited.

Referring to FIGS. 5 and 7, the display region DA of the display panel DP may be divided into the first region A1 in which the first data lines DL_G1 are disposed and the second region A2 in which the second data lines DL_G2 are disposed. The first region A1 is a region in which the vertical data connecting lines V_DCL1 and V_DCL2 connected to the second data lines DL_G2 are disposed together with the first data lines DL_G1.

In FIG. 7, a part of the first-second data lines DL1-21 to DL1-23, a part of the second-second data lines DL2-21 to DL2-23, a part of the second vertical data connecting lines V_DCL2, and a part of the second horizontal data connecting lines H_DCL2 are illustrated. However, the first-first data lines DL1-11 to DL1-13, the second-first data lines DL2-11 to DL2-13, the first vertical data connecting lines V_DCL1, and the first horizontal data connecting lines H_DCL1 also have similar structures, and therefore repetitive descriptions will be omitted.

In the second-second region A2-2, the data line DL2-23 from among the second-second data lines DL2-21 to DL2-23 may be connected with the corresponding second-third horizontal data connecting line H_DCL23 from among the second horizontal data connecting lines H_DCL21 to H_DCL23. In the first-second region A1-2, the second-third horizontal data connecting line H_DCL23 may be connected with the corresponding second-third vertical data connecting line V_DCL23 from among the second vertical data connecting lines V_DCL21 to V_DCL23.

Figure 8A:
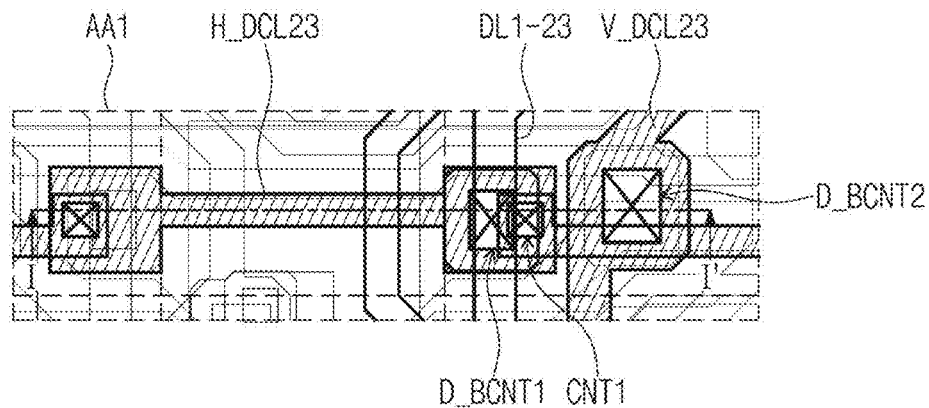
FIG. 8A is an enlarged view of a portion AA1 illustrated in FIG. 7.
Figure 8B:
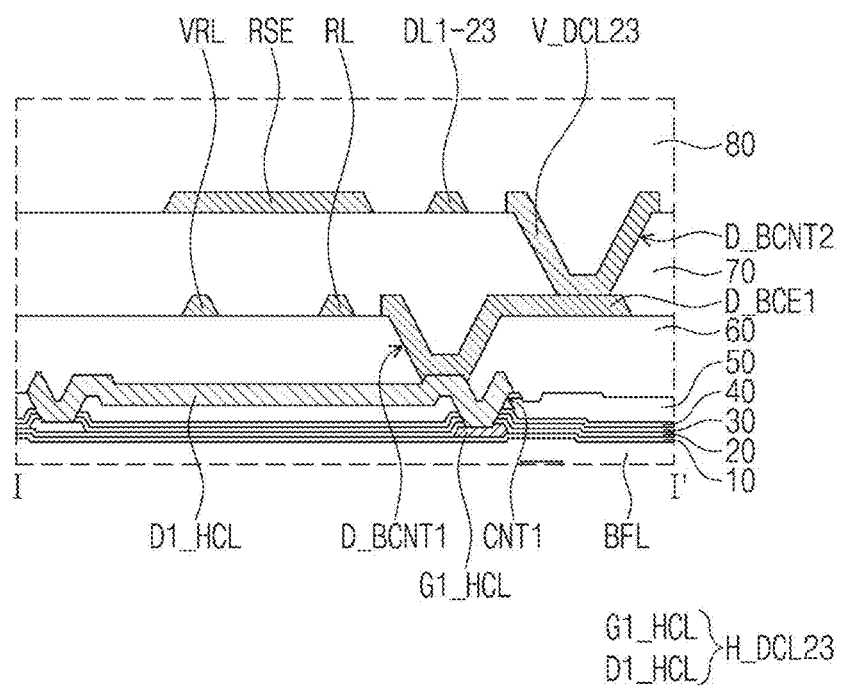
FIG. 8B is a sectional view taken along the line I-I' illustrated in FIG. 8A.
Figure 9A:
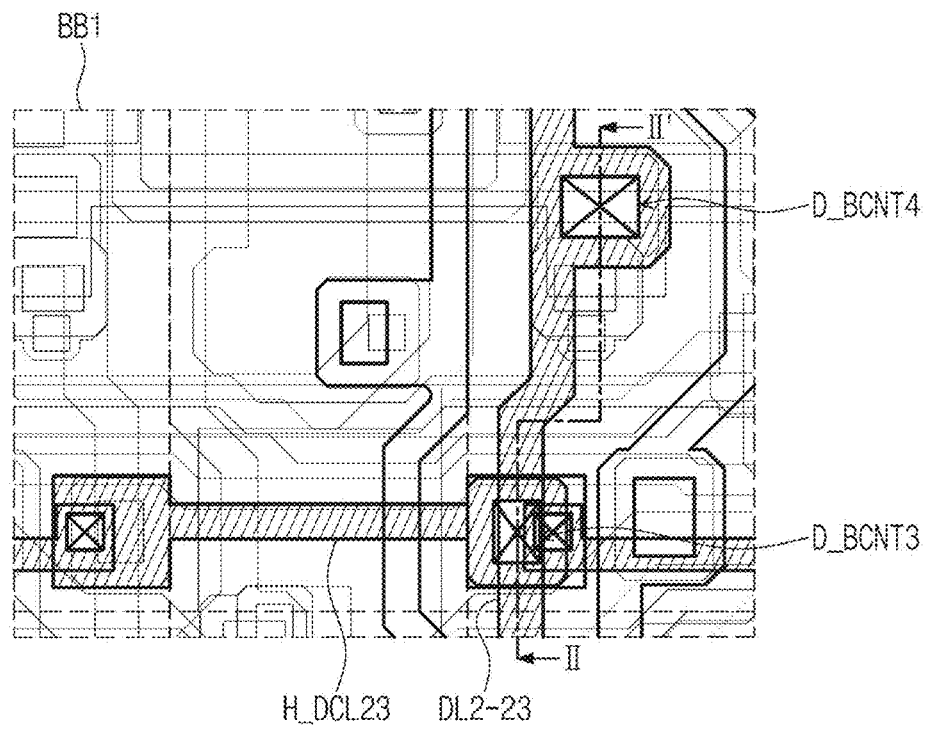
FIG. 9A is an enlarged view of a portion BB1 illustrated in FIG. 7.
Figure 9B:
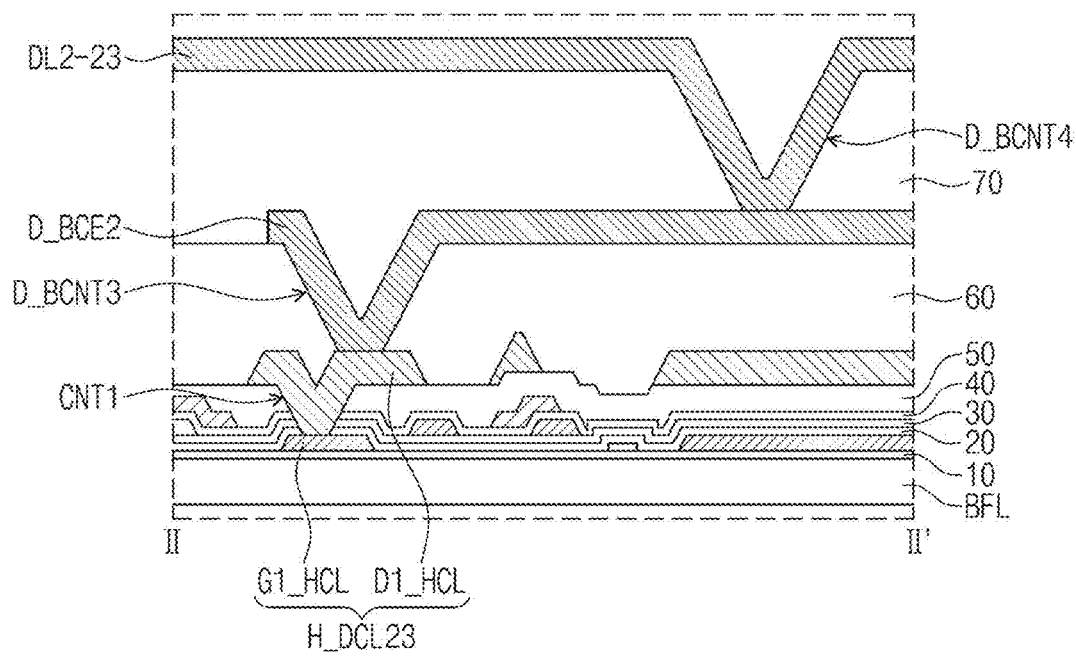
FIG. 9B is a sectional view taken along the line II-II' illustrated in FIG. 9A.

FIG. 8A is an enlarged view of a portion AA1 illustrated in FIG. 7, and FIG. 8B is a sectional view taken the along line I-I' illustrated in FIG. 8A. FIG. 9A is an enlarged view of a portion BB1 illustrated in FIG. 7, and FIG. 9B is a sectional view taken along the line II-II' illustrated in FIG. 9A.

Referring to FIGS. 7, 8A, and 8B, the second horizontal data connecting lines H_DCL21 to H_DCL23 are disposed on a layer different from the layer on which the first-second data lines DL1-21 to DL1-23 are disposed. The second horizontal data connecting lines H_DCL21 to H_DCL23 are disposed on a layer different from the layer on which the second vertical data connecting lines V_DCL21 to V_DCL23 are disposed. The first-second data lines DL1-21 to DL1-23 and the second vertical data connecting lines V_DCL21 to V_DCL23 are disposed on (e.g., at) the same layer.

The second-third horizontal data connecting line H_DCL23 is disposed on the fifth insulating layer 50, but the second-third vertical data connecting line V_DCL23 and the first-second data lines DL1-21 to DL1-23 are disposed on the seventh insulating layer 70.

In the first-second region A1-2, the second-third horizontal data connecting line H_DCL23 may be electrically connected with the second-third vertical data connecting line V_DCL23 through a first data bridge electrode D_BCE1. The first data bridge electrode D_BCE1 may be disposed on the sixth insulating layer 60. The first data bridge electrode D_BCE1 is directly connected with the second-third horizontal data connecting line H_DCL23 through a first data bridge contact hole D_BCNT1 provided in the sixth insulating layer 60. The second-third vertical data connecting line V_DCL23 is directly connected with the first data bridge electrode D_BCE1 through a second data bridge contact hole D_BCNT2 provided in the seventh insulating layer 70.

In one or more embodiments of the present disclosure, the second-third horizontal data connecting line H_DCL23 includes a first horizontal line portion G1_HCL disposed on the first insulating layer 10 and a second horizontal line portion D1_HCL disposed on the fifth insulating layer 50. The first horizontal line portion G1_HCL and the second horizontal line portion D1_HCL partially overlap each other on a plane (e.g., in a plan view). The second to fifth insulating layers 20, 30, 40, and 50 are interposed between the first horizontal line portion G1_HCL and the second horizontal line portion D1_HCL. The second horizontal line portion D1_HCL may be connected with the first horizontal line portion G1_HCL through a contact hole CNT1 formed through the second to fifth insulating layers 20, 30, 40, and 50.

The reset voltage line VRL and the readout wiring RL may be disposed on the sixth insulating layer 60, and a shielding reset wiring RSE may be disposed on the seventh insulating layer 70. The shielding reset wiring RSE may overlap the reset voltage line VRL and the readout wiring RL on a plane (e.g., in a plan view). The data line DL1-23 and the readout wiring RL may be disposed between the shielding reset wiring RSE and the second-third vertical data connecting line V_DCL23.

The shielding reset wiring RSE may shield the readout wiring RL such that a detection signal output from the readout wiring RL is not coupled by a data signal. Accordingly, the sensing accuracy of the sensor FX (refer to FIG. 3) may be improved.

Referring to FIGS. 7, 9A, and 9B, in the second-second region A2-2, the second-third horizontal data connecting line H_DCL23 may be electrically connected with the corresponding data line DL2-23 through a second data bridge electrode D_BCE2. The second data bridge electrode D_BCE2 may be disposed on the sixth insulating layer 60. The second data bridge electrode D_BCE2 is directly connected with the second-third horizontal data connecting line H_DCL23 through a third data bridge contact hole D_BCNT3 provided in the sixth insulating layer 60. The data line DL2_23 is directly connected with the second data bridge electrode D_BCE2 through a fourth data bridge contact hole D_BCNT4 provided in the seventh insulating layer 70.

The first data bridge contact hole D_BCNT1 and the third data bridge contact hole D_BCNT3 are formed through the same patterning process, and the second data bridge contact hole D_BCNT2 and the fourth data bridge contact hole D_BCNT4 are formed through the same patterning process.

Figure 10:
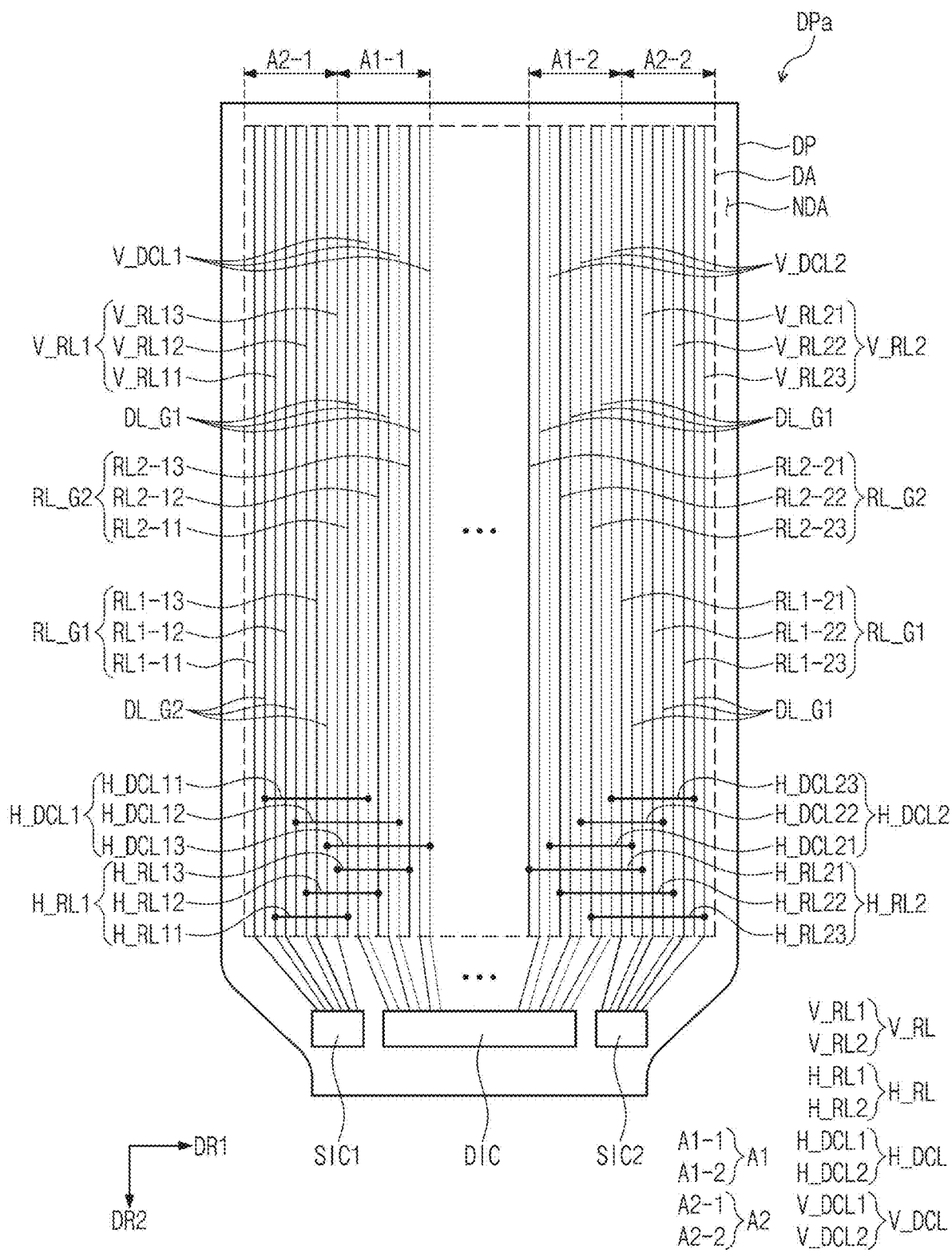
FIG. 10 is a plan view of a display panel according to one or more embodiments of the present disclosure.

FIG. 10 is a plan view of a display panel according to one or more embodiments of the present disclosure. For convenience of description, scan lines are omitted, and only data lines and readout lines are illustrated in FIG. 10. The data lines illustrated in FIG. 10 have the same structure as the data lines illustrated in FIG. 5, and therefore repetitive descriptions will be omitted.

Referring to FIG. 10, the readout lines RL1 to RLh (refer to FIG. 3) are connected to a plurality of sensors FX in a display region DA of the display panel DPa and are connected to sensor chips SIC1 and SIC2 in a non-display region NDA.

The readout lines RL1 to RLh may be divided into a first group and a second group. The first group includes a plurality of first readout lines RL_G1, and the second group includes a plurality of second readout lines RL_G2. The plurality of first readout lines RL_G1 are arranged along the first direction DR1, and the plurality of second readout lines RL_G2 are arranged along the first direction DR1. The plurality of first readout lines RL_G1 are spaced from the plurality of second readout lines RL_G2 in the first direction DR1.

The plurality of first readout lines RL_G1 are connected to sensor drive circuits O_SD of a first group of sensors from among the plurality of sensors FX, and the plurality of second readout lines RL_G2 are connected to sensor drive circuits O_SD of a second group of sensors from among the plurality of sensors FX. The first group of sensors and the first readout lines RL_G1 are disposed in the second region A2, and the second group of sensors and the second readout lines RL_G2 are disposed in the first region A1.

The plurality of first readout lines RL_G1 include first-first readout lines RL1-11 to RL1-13 and first-second readout lines RL1-21 to RL1-23. The first-first readout lines RL1-11 to RL1-13 are disposed in a second-first region A2-1 and connected to the first sensor chip SIC1. The first-second readout lines RL1-21 to RL1-23 are disposed in a second-second region A2-2 and connected to the second sensor chip SIC2.

The plurality of second readout lines RL_G2 include second-first readout lines RL2-11 to RL2-13 and second-second readout lines RL2-21 to RL2-23. The second-first readout lines RL2-11 to RL2-13 are disposed in a first-first region A1-1 and electrically connected to the first sensor chip SIC1. The second-second readout lines RL2-21 to RL2-23 are disposed in a first-second region A1-2 and electrically connected to the second sensor chip SIC2. The plurality of second readout lines RL_G2 may be disposed between the first-first readout lines RL1-11 to RL1-13 and the first-second readout lines RL1-21 to RL1-23.

The display panel DPa further includes connecting lines electrically connected with the second readout lines RL_G2. The connecting lines include a plurality of vertical connecting lines V_RL extending along the first readout lines RL_G1 and a plurality of horizontal connecting lines H_RL extending in the first direction DR1. The vertical connecting lines V_RL may include first vertical connecting lines V_RL1 electrically connected to the first sensor chip SIC1 and second vertical connecting lines V_RL2 electrically connected to the second sensor chip SIC2.

The first vertical connecting lines V_RL1 may alternate with the first-first readout lines RL1-11 to RL1-13 in the first direction DR1. The second vertical connecting lines V_RL2 may alternate with the first-second readout lines RL1-21 to RL1-23 in the first direction DR1.

The horizontal connecting lines H_RL electrically connect the vertical connecting lines V_RL to the second readout lines RL_G2. The horizontal connecting lines H_RL include first horizontal connecting lines H_RL1 that connect the first vertical connecting lines V_RL1 to the second-first readout lines RL2-11 to RL2-13, respectively, and second horizontal connecting lines H_RL2 that connect the second vertical connecting lines V_RL2 to the second-second readout lines RL2-21 to RL2-23, respectively.

The plurality of horizontal connecting lines H_RL and portions of the vertical connecting lines V_RL may be disposed in the display region DA. That is, portions of connecting lines for connecting the second readout lines RL_G2 and the first and second sensor chips SIC1 and SIC2 are disposed in the display region DA. Accordingly, the area of the region occupied by the connecting lines in the non-display region NDA may be decreased, and thus the area of dead space of the display panel DPa may be decreased.

Figure 11:
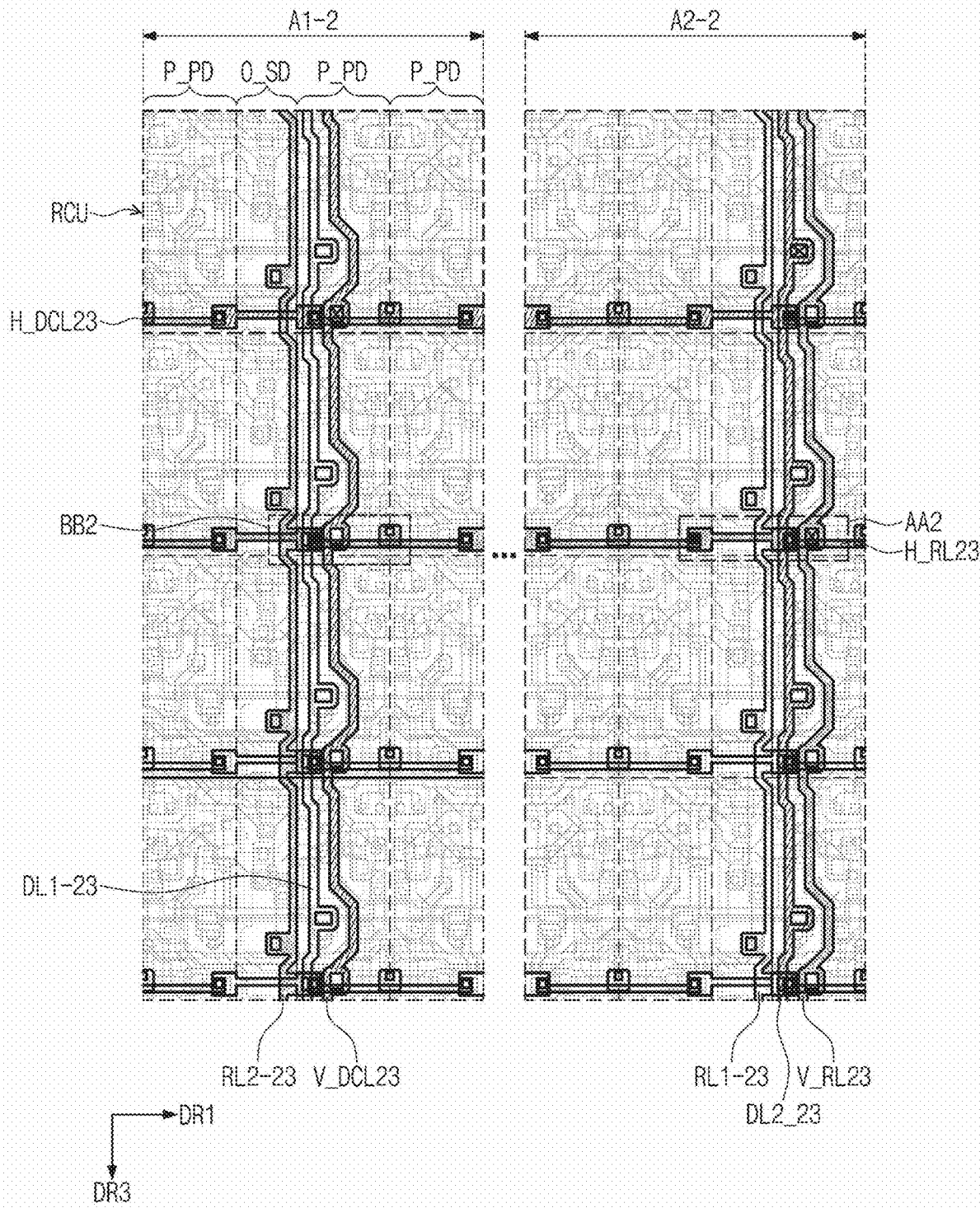
FIG. 11 is an enlarged plan view illustrating a portion of the display panel according to one or more embodiments of the present disclosure.

FIG. 11 is an enlarged plan view illustrating a portion of the display panel according to one or more embodiments of the present disclosure.

In FIG. 11, a part of the first-second readout lines RL1-21 to RL1-23, a part of the second-second readout lines RL2-21 to RL2-23, a part of the second vertical connecting lines V_RL2, and a part of the second horizontal connecting lines H_RL2 are illustrated. However, the first-first readout lines RL1-11 to RL1-13, the second-first readout lines RL2-11 to RL2-13, the first vertical connecting lines V_RL1, and the first horizontal connecting lines H_RL1 also have similar structures, and therefore repetitive descriptions will be omitted.

In the first-second region A1-2, the readout line RL2-23 from among the second-second readout lines RL2-21 to RL2-23 may be connected with a corresponding second-third horizontal connecting line H_RL23 from among the second horizontal connecting lines H_RL2. In the first-second region A1-2, the readout line RL2-22 among the second-second readout lines RL2-21 to RL2-23 may be connected with a corresponding second-second horizontal connecting line H_RL22 among the second horizontal connecting lines H_RL2. In the first-second region A1-2, the readout line RL2-21 from among the second-second readout lines RL2-21 to RL2-23 may be connected with a corresponding second-first horizontal connecting line H_RL21 from among the second horizontal connecting lines H_RL2 (e.g., see FIG. 10).

In the second-second region A2-2, the second-third horizontal connecting line H_RL23 may be connected with a corresponding second-third vertical connecting line V_RL23 from among the second vertical connecting lines V_RL2. In the second-second region A2-2, the second-second horizontal connecting line H_RL22 may be connected with a corresponding second-second vertical connecting line V_RL22 from among the second vertical connecting lines V_RL2 (e.g., see FIG. 10). In the second-second region A2-2, the second-first horizontal connecting line H_RL21 may be connected with a corresponding second-first vertical connecting line V_RL21 from among the second vertical connecting lines V_RL2 (e.g., see FIG. 10).

Figure 12A:
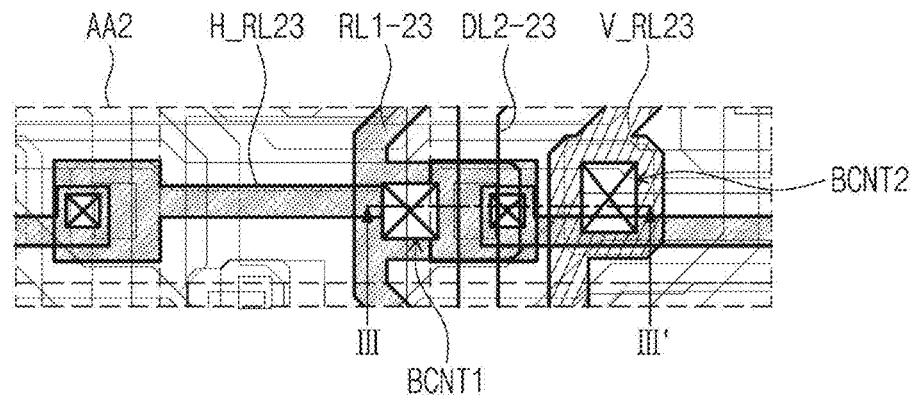
FIG. 12A is an enlarged view of a portion AA2 illustrated in FIG. 11.
Figure 12B:
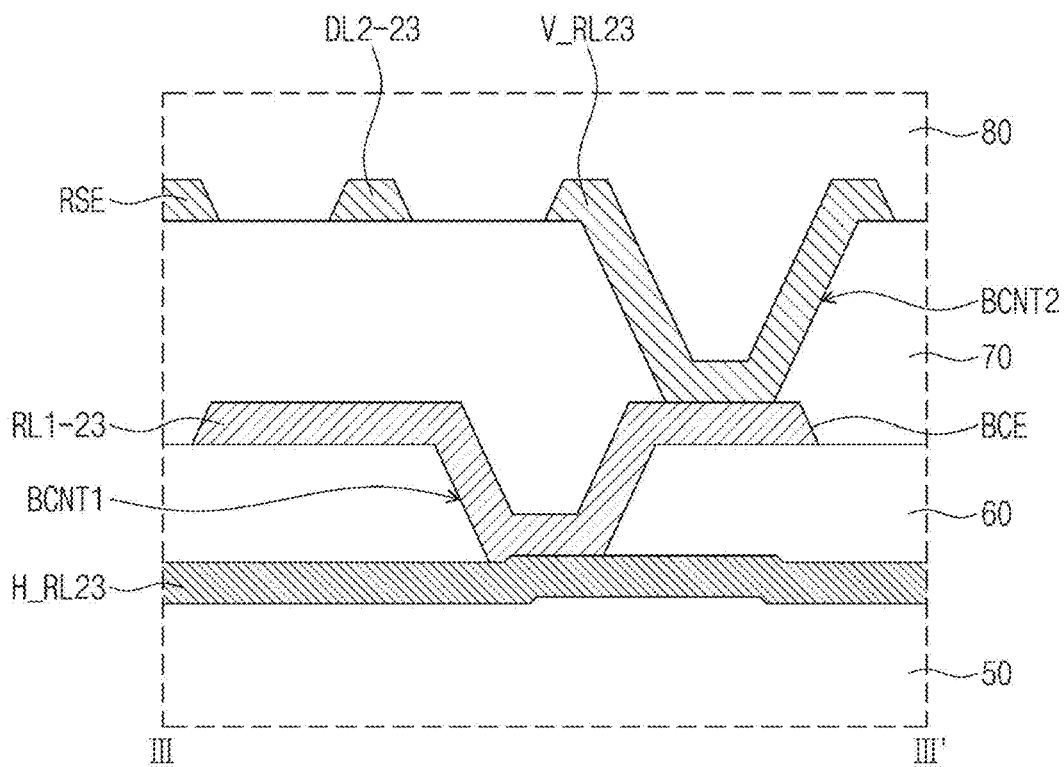
FIG. 12B is a sectional view taken along the line III-III' illustrated in FIG. 12A.
Figure 13A:
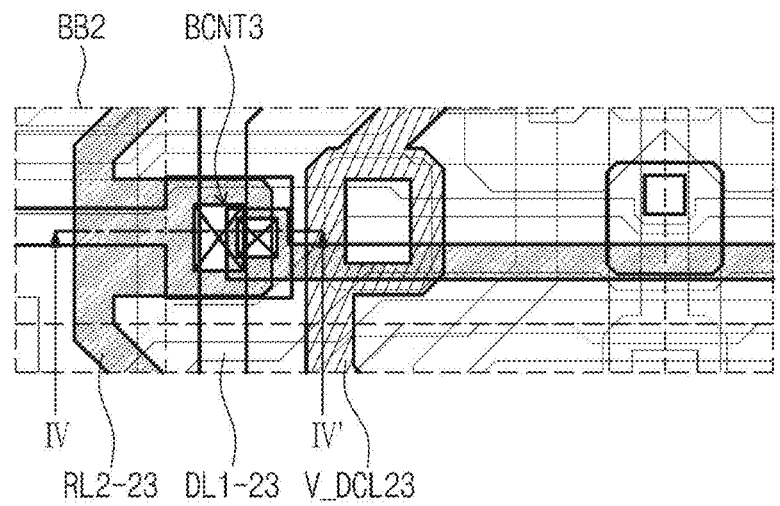
FIG. 13A is an enlarged view of a portion BB2 illustrated in FIG. 11.
Figure 13B:
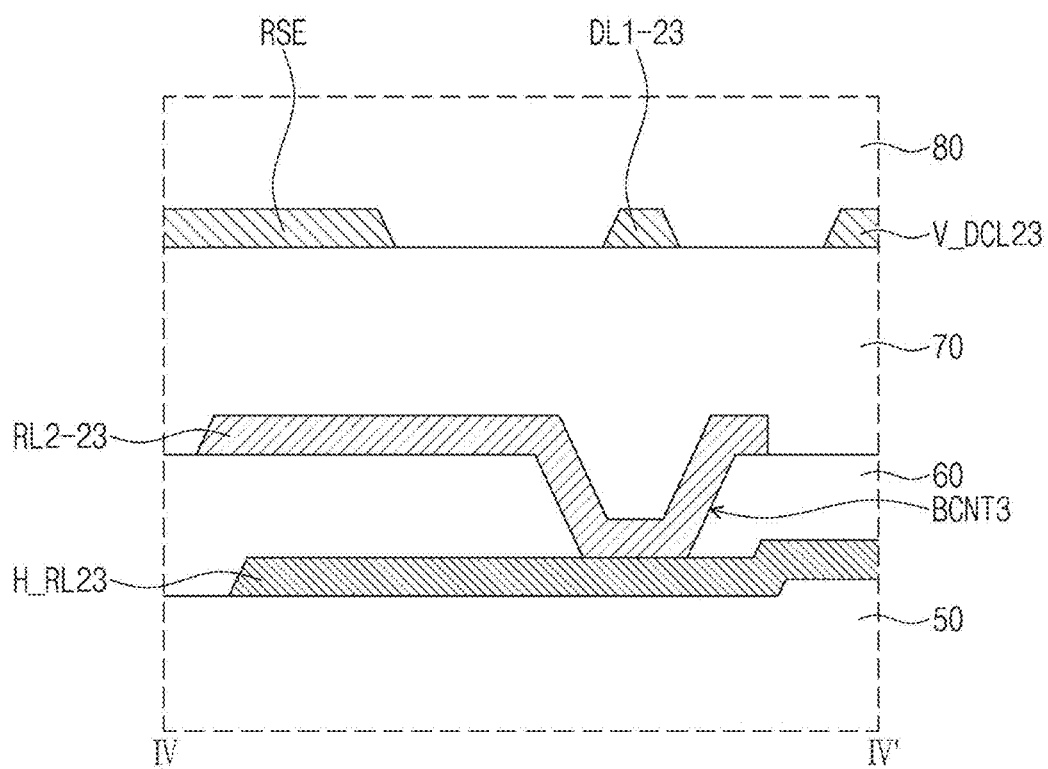
FIG. 13B is a sectional view taken along the line IV-IV' illustrated in FIG. 13A.

FIG. 12A is an enlarged view of a portion AA2 illustrated in FIG. 11, and FIG. 12B is a sectional view taken along the line III-III' illustrated in FIG. 12A. FIG. 13A is an enlarged view of a portion BB2 illustrated in FIG. 11, and FIG. 13B is a sectional view taken along the line IV-IV' illustrated in FIG. 13A.

Referring to FIGS. 11, 12A, and 12B, the second horizontal connecting lines H_RL2 are disposed on a layer different from the layer on which the second-second readout lines RL2-21 to RL2-23 are disposed. The second horizontal connecting lines H_RL2 are disposed on a layer different from the layer on which the second vertical connecting lines V_RL2 are disposed.

The second-third horizontal connecting line H_RL23 is disposed on a fifth insulating layer 50, but the second-third vertical connecting line V_RL23 is disposed on a seventh insulating layer 70. The first-second readout lines RL1-21 to RL1-23 and the second-second readout lines RL2-21 to RL2-23 are disposed on a sixth insulating layer 60.

In the second-second region A2-2, the second-third horizontal connecting line H_RL23 may be electrically connected with the second-third vertical connecting line V_RL23 through a bridge contact electrode BCE. The bridge contact electrode BCE may be disposed on the sixth insulating layer 60. The bridge contact electrode BCE is directly connected with the second-third horizontal connecting line H_RL23 through a first bridge contact hole BCNT1 provided in the sixth insulating layer 60. The second-third vertical connecting line V_RL23 is directly connected with the bridge contact electrode BCE through a second bridge contact hole BCNT2 provided in the seventh insulating layer 70.

Referring to FIGS. 11, 13A, and 13B, in the first-second region A1-2, the second-third horizontal connecting line H_RL23 may be electrically connected with the corresponding readout line RL2-23. The readout line RL2-23 is directly connected with the second-third horizontal connecting line H_RL23 through a third bridge contact hole BCNT3 provided in the sixth insulating layer 60.

The first bridge contact hole BCNT1 and the third bridge contact hole BCNT3 may be formed through the same patterning process.

The shielding reset wiring RSE may be disposed over the readout lines RL1-23 and RL2-23. The shielding reset wiring RSE may overlap the readout lines RL1-23 and RL2-23 on a plane (e.g., in a plan view). The data wiring DL may be disposed between the shielding reset wiring RSE and the vertical connecting line V_RL2.

The shielding reset wiring RSE may shield the readout lines RL1-23 and RL2-23 such that a detection signal output from the readout lines RL1-23 and RL2-23 is not coupled by a data signal. Accordingly, the sensing accuracy of the sensor FX (refer to FIG. 3) may be improved.

Figure 14A:
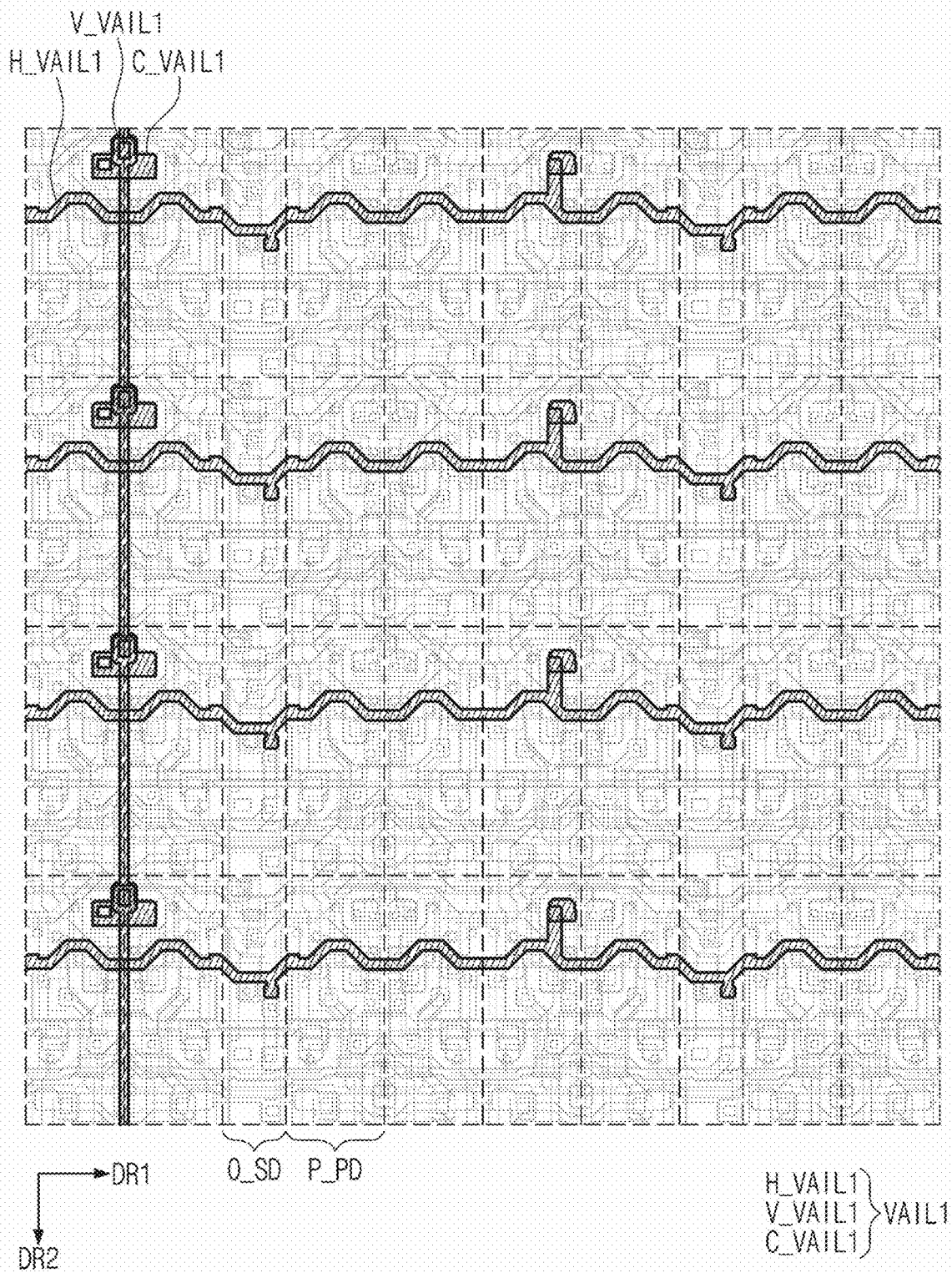
FIG. 14A is a plan view illustrating a second-first initialization voltage line according to one or more embodiments of the present disclosure.
Figure 14B:
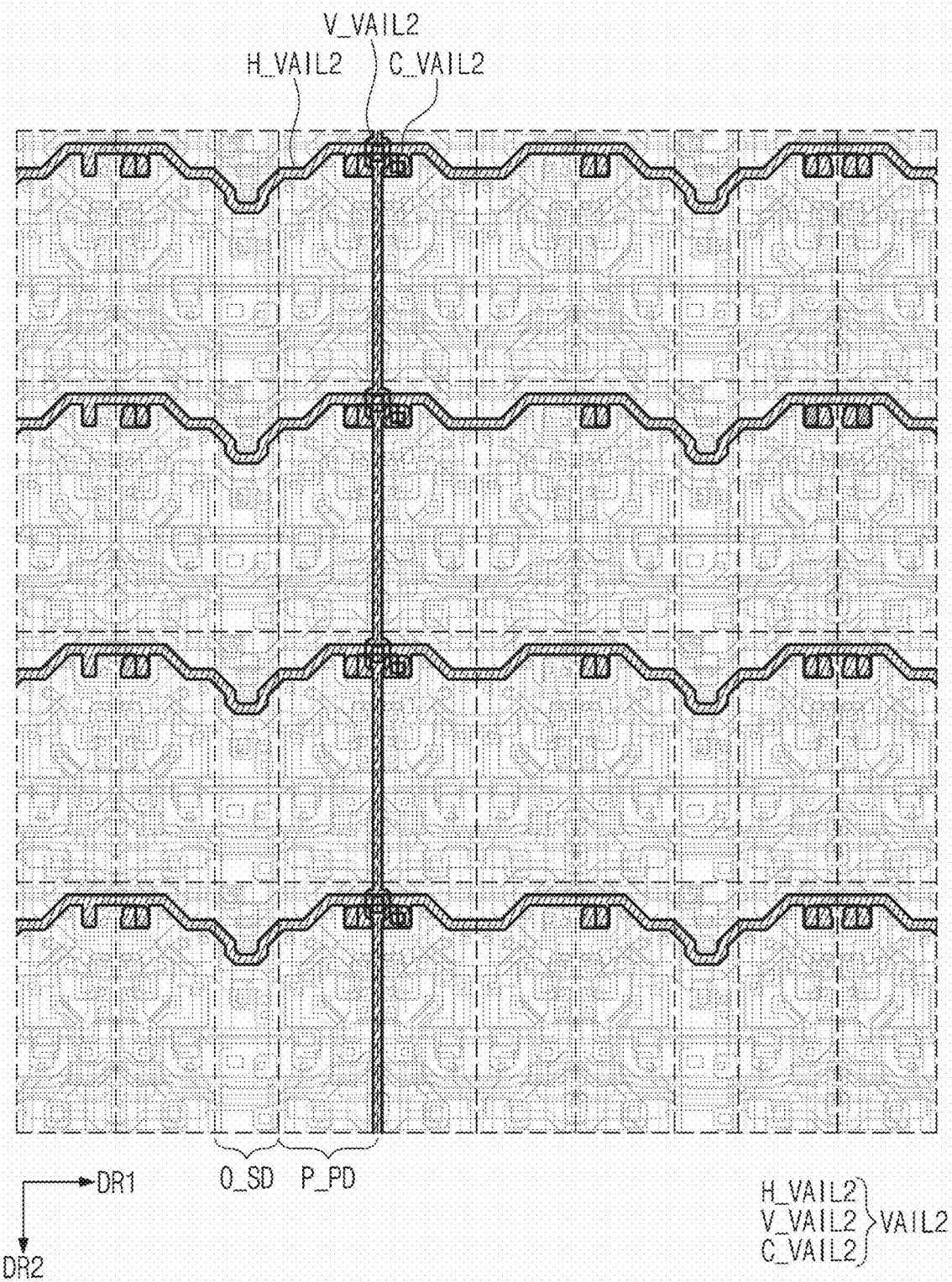
FIG. 14B is a plan view illustrating a second-second initialization voltage line according to one or more embodiments of the present disclosure.
Figure 14C:
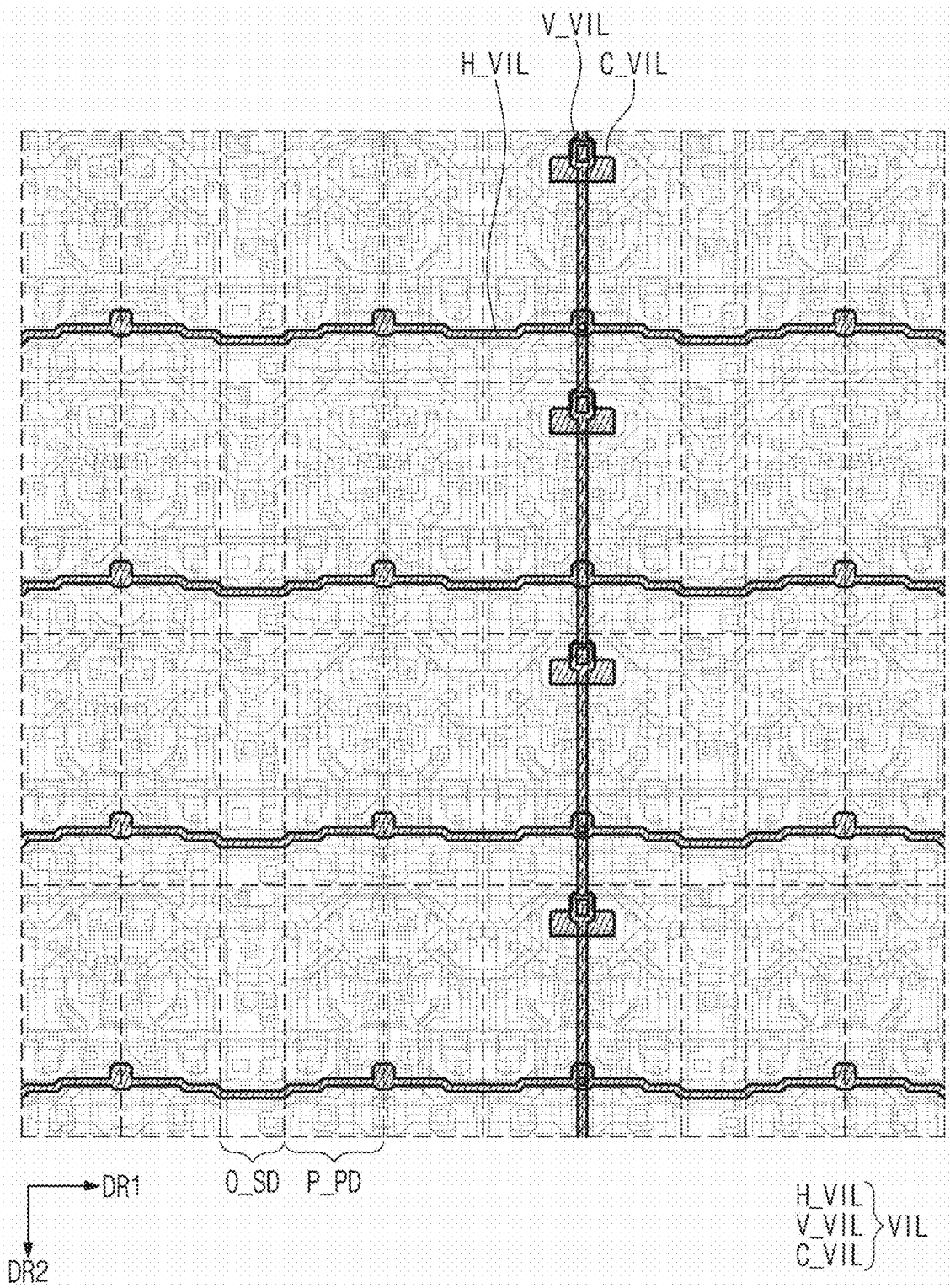
FIG. 14C is a plan view illustrating a first initialization voltage line according to one or more embodiments of the present disclosure.
Figure 14D:
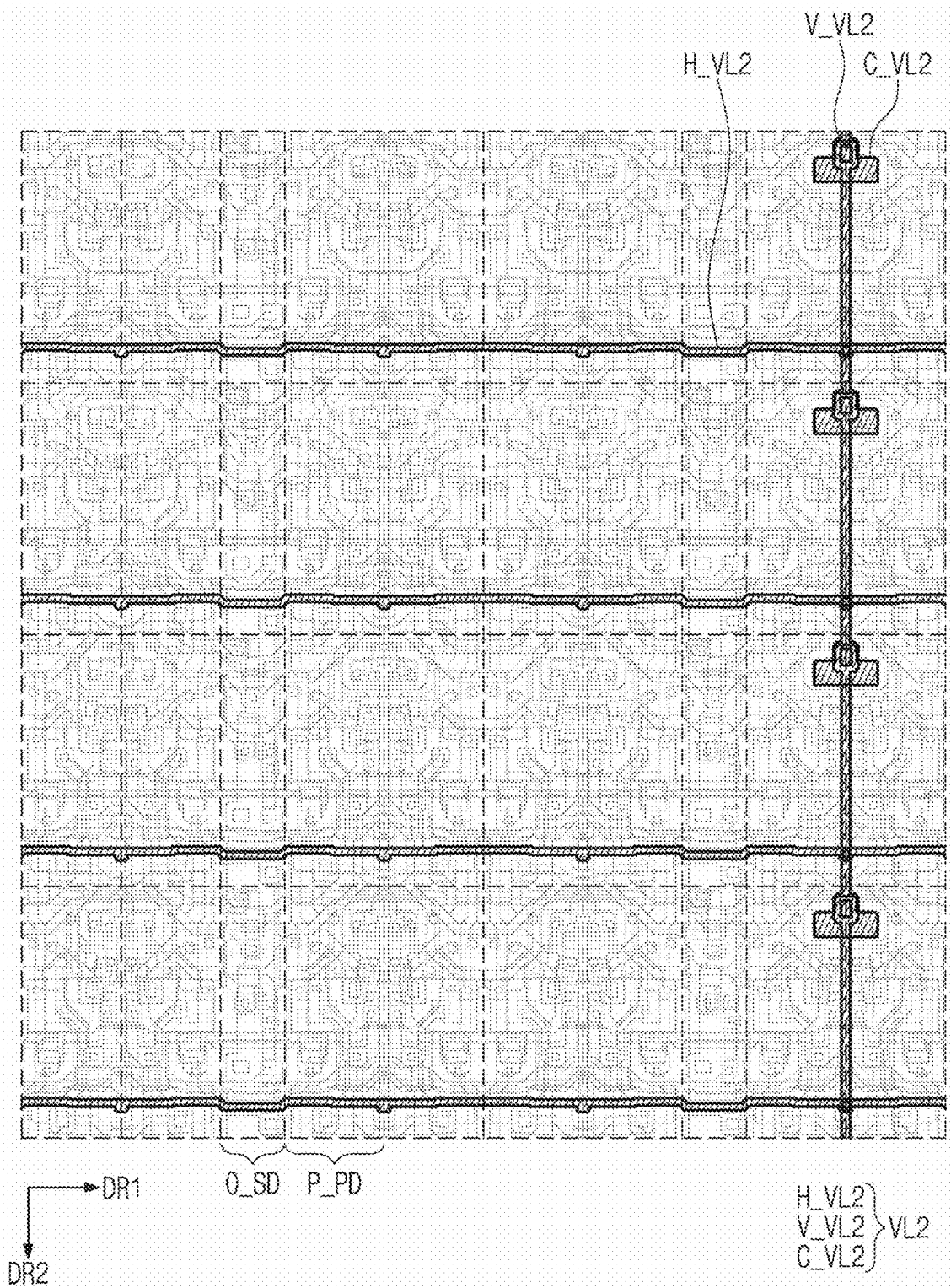
FIG. 14D is a plan view illustrating a second drive voltage line according to one or more embodiments of the present disclosure.

FIG. 14A is a plan view illustrating a second-first initialization voltage line according to one or more embodiments of the present disclosure. FIG. 14B is a plan view illustrating a second-second initialization voltage line according to one or more embodiments of the present disclosure. FIG. 14C is a plan view illustrating the first initialization voltage line according to one or more embodiments of the present disclosure. FIG. 14D is a plan view illustrating the second drive voltage line according to one or more embodiments of the present disclosure.

The second initialization voltage line VAIL (refer to FIG. 4A) includes the second-first initialization voltage line VAIL1 and the second-second initialization voltage line VAIL2. The second-first initialization voltage line VAIL1 is connected to at least one pixel (in particular, a first light emitting element of a first pixel) from among the plurality of pixels PX illustrated in FIG. 3, and the second-second initialization voltage line VAIL2 is connected to another pixel (e.g., second and third light emitting elements of second and third pixels) from among the plurality of pixels PX. In one or more embodiments of the present disclosure, the first pixel includes the first light emitting element that is configured to output first color light (e.g., red light), the second pixel includes the second light emitting element that is configured to output second color light (e.g., green light), and the third pixel includes the third light emitting element that is configured to output third color light (e.g., blue light).

Referring to FIG. 14A, the second-first initialization voltage line VAIL1 includes a second-first horizontal initialization voltage line H_VAIL1 and a second-first vertical initialization voltage line V_VAIL1. The second-first horizontal initialization voltage line H_VAIL1 extends in the first direction DR1, and the second-first vertical initialization voltage line V_VAIL1 extends in the second direction DR2. Accordingly, the second-first initialization voltage line VAIL1 may be disposed in a mesh form in the display region DA (refer to FIG. 3) of the display panel DP (refer to FIG. 3).

The second-first horizontal initialization voltage line H_VAIL1 and the second-first vertical initialization voltage line V_VAIL1 may be disposed on different layers. For example, the second-first horizontal initialization voltage line H_VAIL1 may be disposed on the fourth insulating layer 40 (refer to FIG. 6), and the second-first vertical initialization voltage line V_VAIL1 may be disposed on the seventh insulating layer 70 (refer to FIG. 6). The second-first horizontal initialization voltage line H_VAIL1 and the second-first vertical initialization voltage line V_VAIL1 may be electrically connected with each other through a second-first connecting pattern C_VAIL1. The second-first connecting pattern C_VAIL1 may be disposed on the sixth insulating layer 60 (refer to FIG. 6) and may function as a bridge that electrically connects the second-first horizontal initialization voltage line H_VAIL1 and the second-first vertical initialization voltage line V_VAIL1.

Referring to FIG. 14B, the second-second initialization voltage line VAIL2 includes a second-second horizontal initialization voltage line H_VAIL2 and a second-second vertical initialization voltage line V_VAIL2. The second-second horizontal initialization voltage line H_VAIL2 extends in the first direction DR1, and the second-second vertical initialization voltage line V_VAIL2 extends in the second direction DR2. Accordingly, the second-second initialization voltage line VAIL2 may be disposed in a mesh form in the display region DA (refer to FIG. 3) of the display panel DP (refer to FIG. 3).

The second-second horizontal initialization voltage line H_VAIL2 and the second-second vertical initialization voltage line V_VAIL2 may be disposed on different layers. For example, the second-second horizontal initialization voltage line H_VAIL2 may be disposed on the fourth insulating layer 40 (refer to FIG. 6), and the second-second vertical initialization voltage line V_VAIL2 may be disposed on the seventh insulating layer 70 (refer to FIG. 6). The second-second horizontal initialization voltage line H_VAIL2 and the second-second vertical initialization voltage line V_VAIL2 may be electrically connected with each other through a second-second connecting pattern C_VAIL2. The second-second connecting pattern C_VAIL2 may be disposed on the sixth insulating layer 60 (refer to FIG. 6) and may function as a bridge that electrically connects the second-second horizontal initialization voltage line H_VAIL2 and the second-second vertical initialization voltage line V_VAIL2.

Referring to FIGS. 14A and 14B, the second-first horizontal initialization voltage line H_VAIL1 and the second-second horizontal initialization voltage line H_VAIL2 may be disposed on (e.g., at) the same layer (e.g., the fourth insulating layer 40). However, the present disclosure is not limited thereto. The second-first horizontal initialization voltage line H_VAIL1 and the second-second horizontal initialization voltage line H_VAIL2 may be disposed on different layers.

The second-first vertical initialization voltage line V_VAIL1 and the second-second vertical initialization voltage line V_VAIL2 may be disposed on (e.g., at) the same layer (e.g., the seventh insulating layer 70). The second-first vertical initialization voltage line V_VAIL1 and the second-second vertical initialization voltage line V_VAIL2 may be spaced from each other in the first direction DR1. At least two columns of pixel drive circuits P_PD and one column of sensor drive circuits O_SD may be disposed between the second-first vertical initialization voltage line V_VAIL1 and the second-second vertical initialization voltage line V_VAIL2.

Referring to FIG. 14C, the first initialization voltage line VIL includes a first horizontal initialization voltage line H_VIL and a first vertical initialization voltage line V_VIL. The first horizontal initialization voltage line H_VIL extends in the first direction DR1, and the first vertical initialization voltage line V_VIL extends in the second direction DR2. Accordingly, the first initialization voltage line VIL may be disposed in a mesh form in the display region DA (refer to FIG. 3) of the display panel DP (refer to FIG. 3).

The first horizontal initialization voltage line H_VIL and the first vertical initialization voltage line V_VIL may be disposed on different layers. For example, the first horizontal initialization voltage line H_VIL may be disposed on the fifth insulating layer 50 (refer to FIG. 6), and the first vertical initialization voltage line V_VIL may be disposed on the seventh insulating layer 70 (refer to FIG. 6). The first horizontal initialization voltage line H_VIL and the first vertical initialization voltage line V_VIL may be electrically connected with each other through a first connecting pattern C_VIL. The first connecting pattern C_VIL may be disposed on the sixth insulating layer 60 (refer to FIG. 6) and may function as a bridge that electrically connects the first horizontal initialization voltage line H_VIL and the first vertical initialization voltage line V_VIL.

Referring to FIG. 14D, the second drive voltage line VL2 includes a horizontal drive voltage line H_VL2 and a vertical drive voltage line V_VL2. The horizontal drive voltage line H_VL2 extends in the first direction DR1, and the vertical drive voltage line V_VL2 extends in the second direction DR2. Accordingly, the second drive voltage line VL2 may be disposed in a mesh form in the display region DA (refer to FIG. 3) of the display panel DP (refer to FIG. 3).

The horizontal drive voltage line H_VL2 and the vertical drive voltage line V_VL2 may be disposed on different layers. For example, the horizontal drive voltage line H_VL2 may be disposed on the second insulating layer 20 (refer to FIG. 6), and the vertical drive voltage line V_VL2 may be disposed on the seventh insulating layer 70 (refer to FIG. 6). The horizontal drive voltage line H_VL2 and the vertical drive voltage line V_VL2 may be electrically connected with each other through a second connecting pattern C_VL2. The second connecting pattern C_VL2 may be disposed on the sixth insulating layer 60 (refer to FIG. 6) and may function as a bridge that electrically connects the horizontal drive voltage line H_VL2 and the vertical drive voltage line V_VL2.

Referring to FIGS. 14A-14D, the second-first vertical initialization voltage line V_VAIL1, the second-second vertical initialization voltage line V_VAIL2, the first vertical initialization voltage line V_VIL, and the vertical drive voltage line V_VL2 may be disposed on (e.g., at) the same layer (e.g., the seventh insulating layer 70). The second-first vertical initialization voltage line V_VAIL1, the second-second vertical initialization voltage line V_VAIL2, the first vertical initialization voltage line V_VIL, and the vertical drive voltage line V_VL2 may be spaced from each other in the first direction DR1. At least two columns of pixel drive circuits P_PD may be disposed between the first vertical initialization voltage line V_VIL and the second-second vertical initialization voltage line V_VAIL2. At least two columns of pixel drive circuits P_PD and at least one column of sensor drive circuits O_SD may be disposed between the vertical drive voltage line V_VL2 and the first vertical initialization voltage line V_VIL.

In FIGS. 14A-14D, the structure in which the second-first vertical initialization voltage line V_VAIL1, the second-second vertical initialization voltage line V_VAIL2, the first vertical initialization voltage line V_VIL, and the vertical drive voltage line V_VL2 are sequentially disposed along the first direction DR1 is illustrated. However, the arrangement order of the voltage lines is not limited thereto and may be modified in various ways.

As the voltage lines included in the display panel DP (refer to FIG. 3) are arranged in the mesh structure as described above, voltages may be uniformly supplied to the entire display region DA (refer to FIG. 3) of the display panel DP. In particular, as the voltage lines connected to the sensor are arranged in the mesh structure, deterioration in sensing accuracy due to a drop in the voltage applied to the sensor FX (refer to FIG. 3) may be prevented.

FIGS. 15A-15I are plan views illustrating an arrangement order of the circuit layer according to one or more embodiments of the present disclosure.

Referring to FIGS. 15A-15I, conductive patterns and semiconductor patterns may be repeatedly arranged on a plane according to a rule (e.g., a predetermined rule). In FIGS. 15A-15I, some of the pixel drive circuits P_PD and some of the sensor drive circuits O_SD are illustrated.

The circuit layer DP_CL (refer to FIG. 6) may include a first reference circuit unit RCU1 and a second reference circuit unit RCU2. The first and second reference circuit units RCU1 and RCU2 may be symmetrical to each other with respect to a reference line parallel to the second direction DR2. The first and second reference circuit units RCU1 and RCU2 may be alternately arranged along the first direction DR1. At least one sensor drive circuit O_SD and at least one pixel drive circuit P_PD are included in each of the first and second reference circuit units RCU1 and RCU2. In FIGS. 15A-15I, a structure in which one sensor drive circuit O_SD and three pixel drive circuits P_PD are included in one reference circuit unit RCU1 or RCU2 is illustrated. However, the numbers of sensor drive circuits O_SD and pixel drive circuits P_PD included in each reference circuit unit RCU1 or RCU2 are not particularly limited.

Although the first and second reference circuit units RCU1 and RCU2 symmetrical to each other (e.g., a mirror image of each other) are illustrated in FIGS. 15A-15I, the circuit layer DP_CL may have a structure in which the first reference circuit unit RCU1 is repeated or a structure in which the second reference circuit unit RCU2 is repeated.

Referring to FIG. 15A, a light blocking pattern layer BML may be formed on the buffer layer BFL. The light blocking pattern layer BML may be a conductive pattern having a function of blocking light. The light blocking pattern layer BML may be disposed under at least one of the transistors T1 to T8 (refer to FIG. 4A) included in each pixel drive circuit P_PD and may block light incident to the transistors T1 to T8 from the outside.

Referring to FIGS. 15A and 15B, a first semiconductor pattern layer ACT1 may be disposed on the light blocking pattern layer BML and the buffer layer BFL. The first semiconductor pattern layer ACT1 may overlap the light blocking pattern layer BML on the buffer layer BFL. The first semiconductor pattern layer ACT1 may include a silicon semiconductor. For example, the silicon semiconductor may include amorphous silicon and/or polycrystalline silicon. For example, the first semiconductor pattern layer ACT1 may include low-temperature polycrystalline silicon (LTPS).

The first semiconductor pattern layer ACT1 includes a first semiconductor pattern P_ACT1 included in the pixel drive circuit P_PD and a second semiconductor pattern S_ACT1 included in the sensor drive circuit O_SD.

Referring to FIG. 15C, the first gate pattern layer GAT1 may be disposed on the first insulating layer 10. The first gate pattern layer GAT1 may include metal, an alloy, conductive metal oxide, and/or a transparent conductive material. For example, the first gate pattern layer GAT1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), and/or indium zinc oxide (IZO), but is not particularly limited thereto.

The first gate pattern layer GAT1 may include a first gate wiring SBL, a second gate wiring EML, a third gate wiring SWL, a first gate electrode GE1, and a second gate electrode GE2.

Each of the first to third gate wirings SBL, EML, and SWL may extend in the first direction DR1. The first gate wiring SBL corresponds to the j-th black scan line SBLj of FIG. 4A. For example, the j-th black scan signal SBj (refer to FIG. 4A) may be provided to the first gate wiring SBL. The first gate wiring SBL may constitute the seventh transistor T7 of FIG. 4A together with the first semiconductor pattern P_ACT1.

The second gate wiring EML corresponds to the j-th emission control line EMLj of FIG. 4A. For example, the j-th emission control signal EMj (refer to FIG. 4A) may be provided to the second gate wiring EML. The second gate wiring EML may constitute the fifth and sixth transistors T5 and T6 of FIG. 4A together with the first semiconductor pattern P_ACT1.

The third gate wiring SWL corresponds to the j-th write scan line SWLj of FIG. 4A. For example, the j-th write scan signal SWj (refer to FIG. 4A) may be provided to the third gate wiring SWL. The third gate wiring SWL may constitute the second transistor T2 of FIG. 4A together with the first semiconductor pattern P_ACT1 and may constitute the output transistor ST3 of FIG. 4A together with the second semiconductor pattern S_ACT1.

The first and second gate electrodes GE1 and GE2 may be disposed in an island shape. The first gate electrode GE1 may constitute the first transistor T1 of FIG. 4A together with the first semiconductor pattern P_ACT1. The first gate electrode GE1 may correspond to the third electrode G1 of the first transistor T1 illustrated in FIG. 6. The second gate electrode GE2 may constitute the amplifying transistor ST2 of FIG. 4A together with the second semiconductor pattern S_ACT1.

The first gate pattern layer GAT1 further includes a first horizontal line portion G1_HCL. The first horizontal line portion G1_HCL may extend in the first direction DR1. In one or more embodiments of the present disclosure, the first horizontal line portion G1_HCL may have a structure that extends to overlap two pixel circuit portions P_PD. The first horizontal line portion G1_HCL may be a component included in the horizontal data connecting lines H_DCL (refer to FIG. 5).

Referring to FIGS. 15C and 15D, the second insulating layer 20 may cover the first gate pattern layer GAT1 and may be disposed on the first insulating layer 10. The second gate pattern layer GAT2 may be disposed on the second insulating layer 20. The second gate pattern layer GAT2 may include metal, an alloy, conductive metal oxide, and/or a transparent conductive material.

The second gate pattern layer GAT2 may include a fourth gate wiring G2_SRL, a fifth gate wiring G2_SCL, a sixth gate wiring G2_SIL, a capacitor electrode CSE, and a horizontal drive voltage line H_VL2.

The fourth to sixth gate wirings G2_SRL, G2_SCL, and G2_SIL may extend in the first direction DR1. The fourth gate wiring G2_SRL corresponds to (or, is included in) the reset control line SRL (refer to FIG. 4A). The fifth gate wiring G2_SCL may correspond to (or, may be included in) the j-th compensation scan line SCLj (refer to FIG. 4A). The sixth gate wiring G2_SIL may correspond to (or, may be included in) the j-th initialization scan line SILj (refer to FIG. 4A).

The capacitor electrode CSE may overlap the first gate electrode GE1 and may be disposed in an island shape. For example, the capacitor electrode CSE may constitute the capacitor Cst (refer to FIG. 4A) together with the first gate electrode GE1. The first gate electrode GE1 may correspond to the upper electrode UE illustrated in FIG. 6. An opening CSE_OP penetrating the capacitor electrode CSE may be formed in the capacitor electrode CSE, and the first gate electrode GE1 may be partially exposed through the opening CSE_OP.

The horizontal drive voltage line H_VL2 may extend in the first direction DR1. The horizontal drive voltage line H_VL2 may be included in the second drive voltage line VL2 of FIG. 4A. The second drive voltage ELVSS may be applied to the horizontal drive voltage line H_VL2.

Referring to FIGS. 15D and 15E, the third insulating layer 30 may cover the second gate pattern layer GAT2 and may be disposed on the second insulating layer 20. A second semiconductor pattern layer ACT2 may be disposed on the third insulating layer 30. The second semiconductor pattern layer ACT2 may include an oxide semiconductor. The second semiconductor pattern layer ACT2 may be disposed in a layer different from the first semiconductor pattern layer ACT1 and may not overlap the first semiconductor pattern layer ACT1.

The second semiconductor pattern layer ACT2 includes a third semiconductor pattern P_ACT2 included in the pixel drive circuit P_PD and a fourth semiconductor pattern S_ACT2 included in the sensor drive circuit O_SD.

Referring to FIGS. 15E-15G, the fourth insulating layer 40 may cover the second semiconductor pattern layer ACT2 and may be disposed on the third insulating layer 30. The third gate pattern layer GAT3 may be disposed on the fourth insulating layer 40. The third gate pattern layer GAT3 may include metal, an alloy, conductive metal oxide, and/or a transparent conductive material.

The third gate pattern layer GAT3 may include a seventh gate wiring G3_SRL, an eighth gate wiring G3_SCL, a ninth gate wiring G3_SIL, the second-first horizontal initialization voltage line H_VAIL1, and the second-second horizontal initialization voltage line H_VAIL2. The second-first horizontal initialization voltage line H_VAIL1 and the second-second horizontal initialization voltage line H_VAIL2 may be referred to as the second horizontal initialization voltage line.

The seventh to ninth gate wirings G3_SRL, G3_SCL, and G3_SIL may extend in the first direction DR1. The seventh gate wiring G3_SRL may overlap the fourth semiconductor pattern S_ACT2. The seventh gate wiring G3_SRL may constitute the reset transistor ST1 of FIG. 4A together with the fourth semiconductor pattern S_ACT2. The seventh gate wiring G3_SRL may be electrically connected with the fourth gate wiring G2_SRL illustrated in FIG. 15D.

The eighth gate wiring G3_SCL may overlap the fifth gate wiring G2_SCL and the third semiconductor pattern P_ACT2. In one or more embodiments, the eighth gate wiring G3_SCL may make contact with the fifth gate wiring G2_SCL through a contact portion. Accordingly, the j-th compensation scan signal SCj applied to the fifth gate wiring G2_SCL may be provided to the eighth gate wiring G3_SCL. The fifth gate wiring G2_SCL, the third semiconductor pattern P_ACT2, and the eighth gate wiring G3_SCL may constitute the third transistor T3 of FIG. 4A.

The ninth gate wiring G3_SIL may overlap the sixth gate wiring G2_SIL and the third semiconductor pattern P_ACT2. The ninth gate wiring G3_SIL may be electrically connected with the sixth gate wiring G2_SIL. The j-th initialization scan signal SIj may be provided to the ninth gate wiring G3_SIL through the sixth gate wiring G2_SIL. The sixth gate wiring G2_SIL, the third semiconductor pattern P_ACT2, and the ninth gate wiring G3_SIL may constitute the fourth transistor T4 of FIG. 4A.

The second-first horizontal initialization voltage line H_VAIL1 and the second-second horizontal initialization voltage line H_VAIL2 are included in the second initialization voltage line VAIL (refer to FIG. 4A). The second-first horizontal initialization voltage line H_VAIL1 is connected to the first pixel among the plurality of pixels PX illustrated in FIG. 3, and the second-second horizontal initialization voltage line H_VAIL2 is connected to the second and third pixels from among the plurality of pixels PX.

The second-first horizontal initialization voltage line H_VAIL1 applies a second-first initialization voltage to the first pixel as the second initialization voltage Vaint (refer to FIG. 4A), and the second-second horizontal initialization voltage line H_VAIL2 applies a second-second initialization voltage to the second and third pixels as the second initialization voltage Vaint. The second-second initialization voltage may have a voltage level different from the voltage level of the second-first initialization voltage.

Referring to FIGS. 15F and 15G, the fifth insulating layer 50 may cover at least a portion of the third gate pattern layer GAT3 and may be disposed on the fourth insulating layer 40. A first data pattern layer SD1 may be disposed on the fifth insulating layer 50. The first data pattern layer SD1 may include, for example, metal, an alloy, conductive metal oxide, and/or a transparent conductive material. Hereinafter, for convenience of description, only some of the components included in the first data pattern layer SD1 are illustrated in FIG. 15H.

The first data pattern layer SD1 may include a horizontal reset voltage line H_VRL, a bias voltage line VBL, a first horizontal initialization voltage line H_VIL, and a plurality of first connecting electrode patterns C_CNE1.

The horizontal reset voltage line H_VRL, the bias voltage line VBL, and the first horizontal initialization voltage line H_VIL may extend in the first direction DR1. The horizontal reset voltage line H_VRL, the bias voltage line VBL, and the first horizontal initialization voltage line H_VIL may be spaced from each other in the second direction DR2.

The horizontal reset voltage line H_VRL may be a component included in the reset voltage line VRL of FIG. 4A. The reset voltage Vrst (refer to FIG. 4A) may be provided to the horizontal reset voltage line H_VRL. The horizontal reset voltage line H_VRL may be electrically connected with the reset transistor ST1. The reset transistor ST1 may receive the reset voltage Vrst through the horizontal reset voltage line H_VRL. The bias voltage line VBL may correspond to the bias voltage line VBL of FIG. 4A. The bias voltage Vbias (refer to FIG. 4A) may be provided to the bias voltage line VBL. The bias voltage line VBL may be connected with the eighth transistor T8 through a contact portion. The eighth transistor T8 may receive the bias voltage Vbias through the bias voltage line VBL.

The first horizontal initialization voltage line H_VIL may be included in the first initialization voltage line VIL of FIG. 4A. The first initialization voltage Vint (refer to FIG. 4A) may be provided to the first horizontal initialization voltage line H_VIL. The first horizontal initialization voltage line H_VIL may be connected with the fourth transistor T4 through a contact portion. The fourth transistor T4 may receive the first initialization voltage Vint through the first horizontal initialization voltage line H_VIL.

The plurality of first connecting electrode patterns C_CNE1 may make contact with one of the first to fourth semiconductor patterns P_ACT1, S_ACT1, P_ACT2, and S_ACT2. The plurality of first connecting electrode patterns C_CNE1 may perform a function of electrically connecting one of the first to fourth semiconductor patterns P_ACT1, S_ACT1, P_ACT2, and S_ACT2 to other lines. The plurality of first connecting electrode patterns C_CNE1 may be connected with one of the first to fourth semiconductor patterns P_ACT1, S_ACT1, P_ACT2, and S_ACT2 through a contact portion. The plurality of first connecting electrode patterns C_CNE1 may include the first and third connecting electrodes CNE10 and CNE11 illustrated in FIG. 6.

The first data pattern layer SD1 may further include a second horizontal line portion D1_HCL. The second horizontal line portion D1_HCL may extend in the first direction DR1. In one or more embodiments of the present disclosure, the second horizontal line portion D1_HCL may have a structure that extends to overlap one sensor circuit portion O_SD. The second horizontal line portion D1_HCL may be a component included in the horizontal data connecting lines H_DCL illustrated in FIG. 5. Opposite end portions of the second horizontal line portion D1_HCL may overlap the first horizontal line portion G1_HCL. The opposite end portions of the second horizontal line portion D1_HCL may be connected with the overlapping first horizontal line portion G1_HCL. One horizontal data connecting line H_DCL may be provided by the coupling of the first horizontal line portion G1_HCL and the second horizontal line portion D1_HCL.

Referring to FIGS. 15G and 15H, the sixth insulating layer 60 may cover at least a portion of the first data pattern layer SD1 and may be disposed on the fifth insulating layer 50. A second data pattern layer SD2 may be disposed on the sixth insulating layer 60. The second data pattern layer SD2 may include, for example, metal, an alloy, conductive metal oxide, and/or a transparent conductive material.

The second data pattern layer SD2 includes a readout wiring RL, a vertical reset voltage line V_VRL, a first drive voltage line VL1, and a plurality of connecting patterns.

The readout wiring RL and the vertical reset voltage line V_VRL extend in the second direction DR2 and are spaced from each other in the first direction DR1. The readout wiring RL may correspond to the readout lines RL1 to RLh illustrated in FIG. 3. The readout wiring RL may be connected to the sensor drive circuit O_SD illustrated in FIG. 4A (in particular, the output transistor ST3).

The vertical reset voltage line V_VRL may be a component included in the reset voltage line VRL of FIG. 4A. The vertical reset voltage line V_VRL may be connected with the horizontal reset voltage line H_VRL. The reset voltage line VRL may have a mesh form by the coupling of the vertical reset voltage line V_VRL and the horizontal reset voltage line H_VRL.

The first drive voltage line VL1 may overlap the pixel drive circuit P_PD. The first drive voltage line VL1 may correspond to the first drive voltage line VL1 of FIG. 4A. The first drive voltage ELVDD (refer to FIG. 4A) may be provided to the first drive voltage line VL1. The first drive voltage line VL1 may be disposed in a mesh form in the display region DA (refer to FIG. 3) of the display panel DP. The first drive voltage line VL1 may be connected with the fifth transistor T5 and the capacitor Cst, which are illustrated in FIG. 4A, through a contact portion.

The plurality of connecting patterns may include a second-first connecting pattern C_VAIL1, a second-second connecting pattern C_VAIL2, a first connecting pattern C_VIL, and a second connecting pattern C_VL2.

The second data pattern layer SD2 may further include a plurality of second connecting electrode patterns C_CNE2. The plurality of second connecting electrode patterns C_CNE2 may include the second and fourth connecting electrodes CNE20 and CNE21 illustrated in FIG. 6.

The second data pattern layer SD2 may further include a first data bridge electrode D_BCE1 and a second data bridge electrode D_BCE2. The first data bridge electrode D_BCE1 performs a function of connecting the first horizontal line portion G1_HCL to the corresponding vertical data connecting line V_DCL. The second data bridge electrode D_BCE2 performs a function of connecting the second horizontal line portion D1_HCL to the corresponding data wiring DL.

Figure 15I:
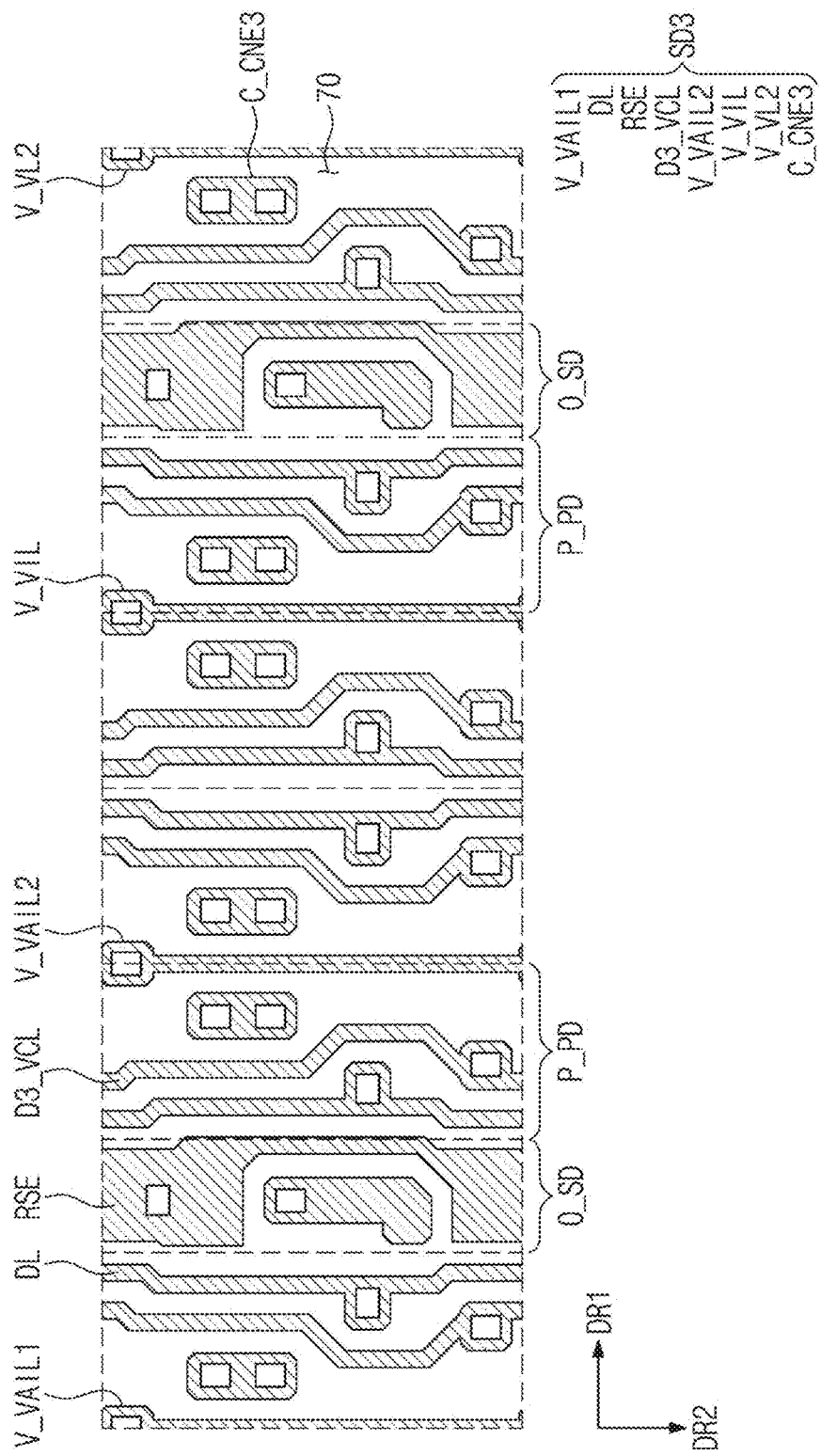

Referring to FIGS. 15H and 15I, the seventh insulating layer 70 may cover at least a portion of the second data pattern layer SD2 and may be disposed on the sixth insulating layer 60. A third data pattern layer SD3 may be disposed on the seventh insulating layer 70. The third data pattern layer SD3 may include, for example, metal, an alloy, conductive metal oxide, and/or a transparent conductive material.

The third data pattern layer SD3 may include a data wiring DL, a vertical data connecting wiring D3_VCL, a shielding reset wiring RSE, a second-first vertical initialization voltage line V_VAIL1, a second-second vertical initialization voltage line V_VAIL2, a first vertical initialization voltage line V_VIL, a vertical drive voltage line V_VL2, and a plurality of third connecting electrode patterns C_CNE3.

The data wiring DL, the vertical data connecting wiring D3_VCL, the second-first vertical initialization voltage line V_VAIL1, the second-second vertical initialization voltage line V_VAIL2, the first vertical initialization voltage line V_VIL, the vertical drive voltage line V_VL2, and the shielding reset wiring RSE may extend in the second direction DR2. The data wiring DL, the vertical data connecting wiring D3_VCL, the second-first vertical initialization voltage line V_VAIL1, the second-second vertical initialization voltage line V_VAIL2, the first vertical initialization voltage line V_VIL, the vertical drive voltage line V_VL2, and the shielding reset wiring RSE may be spaced apart each other in the first direction DR1.

The data wiring DL may correspond to the data lines DL1 to DLm illustrated in FIG. 3. The data wiring DL may be connected to the pixel drive circuit P_PD illustrated in FIG. 4A (in particular, the second transistor T2). The vertical data connecting wiring D3_VCL may correspond to the vertical data connecting line V_DCL illustrated in FIG. 5. The vertical data connecting wiring D3_VCL may be electrically connected with the first and second horizontal line portions G1_HCL and D1_HCL illustrated in FIGS. 15C and 15G.

The second-first vertical initialization voltage line V_VAIL1 and the second-second vertical initialization voltage line V_VAIL2 may be referred to as the second vertical initialization voltage line. The second-first vertical initialization voltage line V_VAIL1 and the second-second vertical initialization voltage line V_VAIL2 may be included in the second initialization voltage line VAIL (refer to FIG. 4A). The second-first vertical initialization voltage line V_VAIL1 is electrically connected to the second-first horizontal initialization voltage line H_VAIL1 illustrated in FIG. 15F, and the second-second vertical initialization voltage line V_VAIL2 is electrically connected to the second-second horizontal initialization voltage line H_VAIL2 illustrated in FIG. 15F.

The first vertical initialization voltage line V_VIL may be included in the first initialization voltage line VIL of FIG. 4A. The first vertical initialization voltage line V_VIL is electrically connected with the first horizontal initialization voltage line H_VIL illustrated in FIG. 15G.

The vertical drive voltage line V_VL2 may be included in the second drive voltage line VL2 of FIG. 4A. The vertical drive voltage line V_VL2 is electrically connected with the horizontal drive voltage line H_VL2 illustrated in FIG. 15D.

The shielding reset wiring RSE may extend in the second direction DR2. The shielding reset wiring RSE may extend along the readout wiring RL. On a plane (e.g., in a plan view), the shielding reset wiring RSE may overlap the readout wiring RL. The shielding reset wiring RSE may make contact with the reset voltage line VRL through a contact portion. Accordingly, the reset voltage applied to the reset voltage line VRL may be applied to the shielding reset wiring RSE.

The shielding reset wiring RSE may be disposed to partially cover the sensor drive circuit O_SD. In particular, the shielding reset wiring RSE may be disposed to cover the reset transistor ST1, the amplifying transistor ST2, and all or part of the output transistor ST3.

The plurality of third connecting electrode patterns C_CNE3 may include the fifth connecting electrode CNE30 and the sixth connecting electrode CNE31 illustrated in FIG. 6.

FIGS. 16A-16D are plan views illustrating an arrangement order of the circuit layer according to one or more embodiments of the present disclosure. From among the components illustrated in FIGS. 16A-16D, components identical to the components illustrated in FIGS. 15A-15I will be assigned with identical reference numerals, and specific descriptions thereabout will be omitted.

Figure 16A:
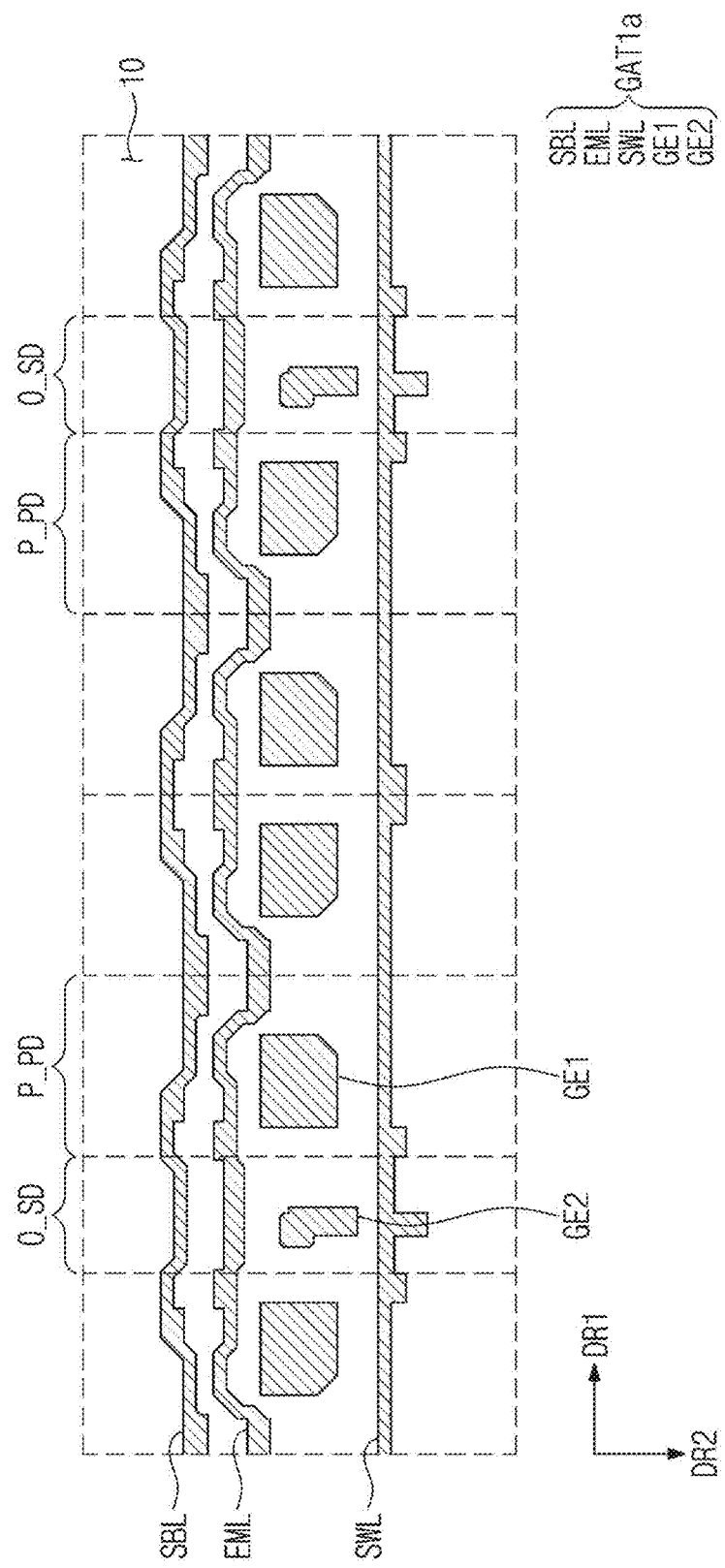
FIGS. 16A-16D are plan views illustrating a manufacturing process of a circuit layer according to one or more embodiments of the present disclosure.

Referring to FIG. 16A, a first gate pattern layer GAT1a may be disposed on the first insulating layer 10. The first gate pattern layer GAT1a may include a first gate wiring SBL, a second gate wiring EML, a third gate wiring SWL, a first gate electrode GE1, and a second gate electrode GE2.

Unlike the first gate pattern layer GAT1 illustrated in FIG. 15C, the first gate pattern layer GAT1a does not further include the first horizontal line portion G1_HCL.

Figure 16B:
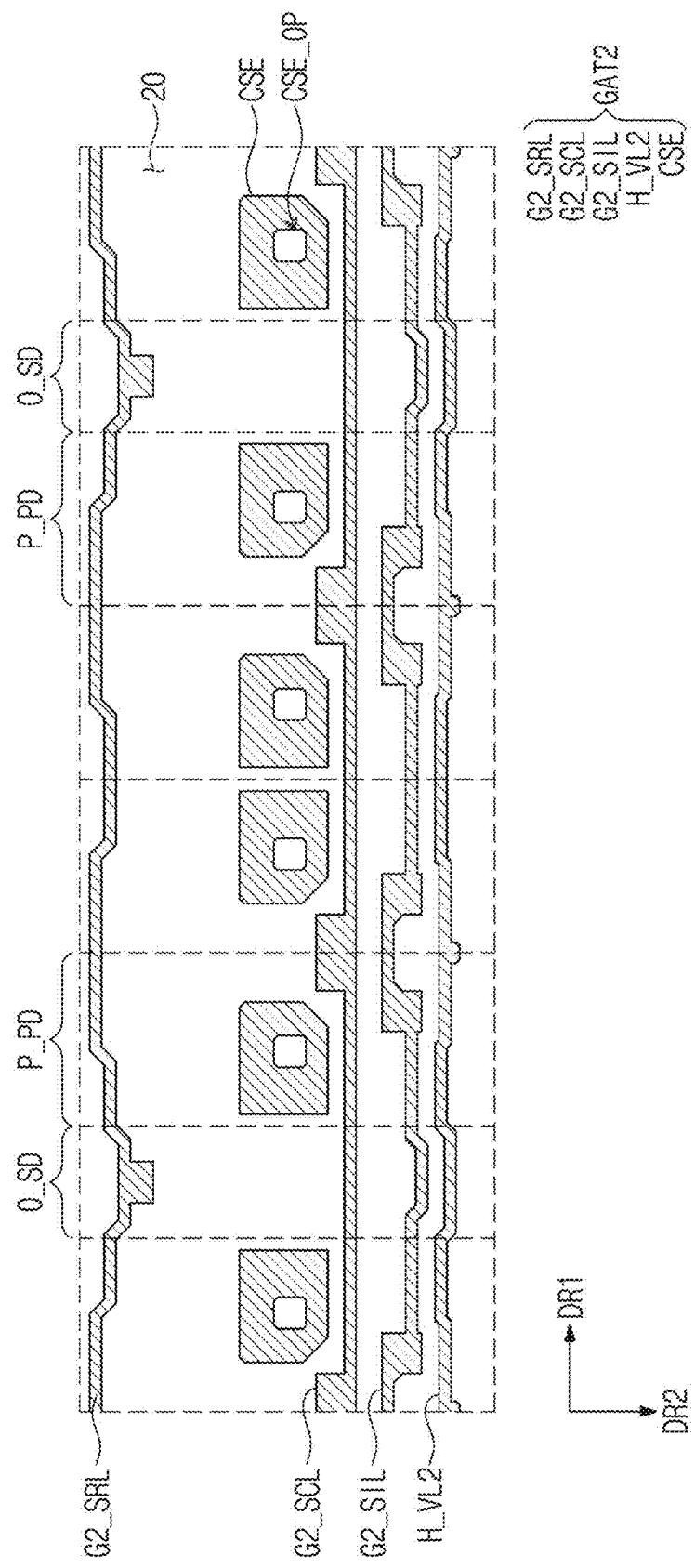

Referring to FIGS. 16A and 16B, the second insulating layer 20 may cover the first gate pattern layer GAT1a and may be disposed on the first insulating layer 10. A second gate pattern layer GAT2 may be disposed on the second insulating layer 20. The second gate pattern layer GAT2 may include metal, an alloy, conductive metal oxide, and/or a transparent conductive material.

The second gate pattern layer GAT2 may include a fourth gate wiring G2_SRL, a fifth gate wiring G2_SCL, a sixth gate wiring G2_SIL, a capacitor electrode CSE, and a horizontal drive voltage line H_VL2.

The second gate pattern layer GAT2 has the same structure as the second gate pattern layer GAT2 illustrated in FIG. 15D.

Figure 16C:
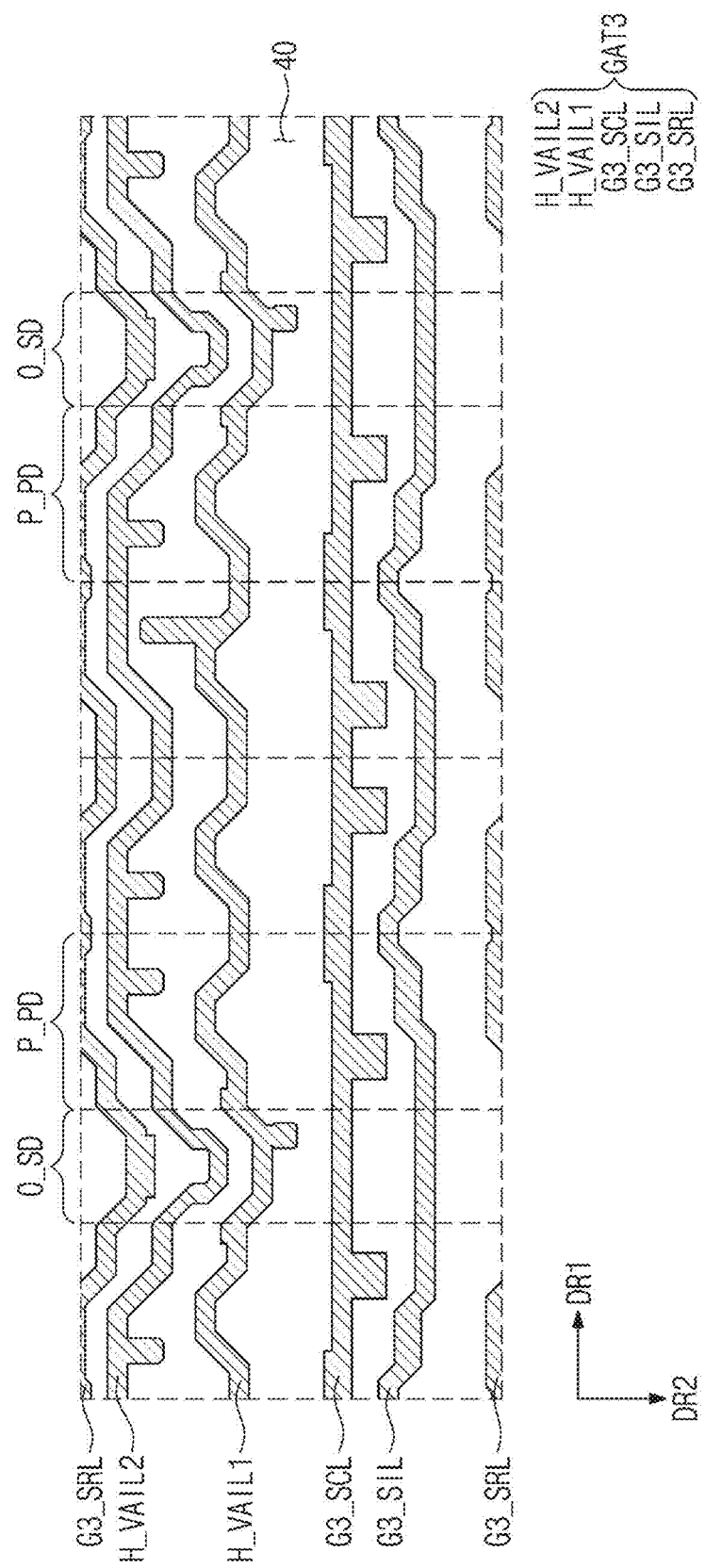

Referring to FIGS. 16B and 16C, the fourth insulating layer 40 may cover the second semiconductor pattern layer ACT2 (refer to FIG. 15E) and may be disposed on the third insulating layer 30. A third gate pattern layer GAT3 may be disposed on the fourth insulating layer 40. The third gate pattern layer GAT3 may include a seventh gate wiring G3_SRL, an eighth gate wiring G3_SCL, a ninth gate wiring G3_SIL, a second-first horizontal initialization voltage line H_VAIL1, and a second-second horizontal initialization voltage line H_VAIL2. The third gate pattern layer GAT3 has the same structure as the third gate pattern layer GAT3 illustrated in FIG. 15F.

Figure 16D:
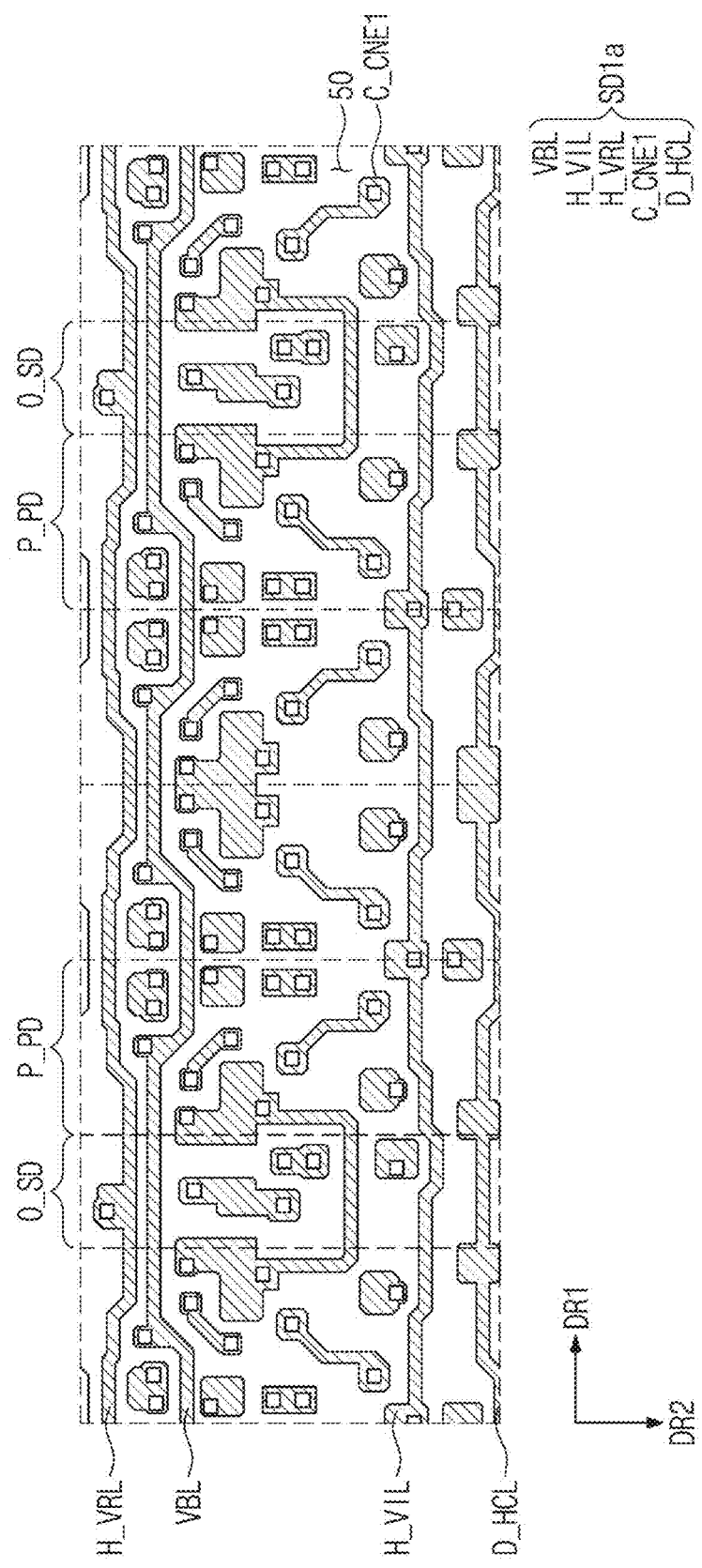

Referring to FIGS. 16C and 16D, the fifth insulating layer 50 may cover at least a portion of the third gate pattern layer GAT3 and may be disposed on the fourth insulating layer 40. A first data pattern layer SD1a may be disposed on the fifth insulating layer 50.

The first data pattern layer SD1a may include a horizontal reset voltage line H_VRL, a bias voltage line VBL, a first horizontal initialization voltage line H_VIL, and a plurality of first connecting electrode patterns C_CNE1.

The first data pattern layer SD1a may further include a horizontal data connecting wiring D_HCL. The horizontal data connecting wiring D_HCL may extend in the first direction DR1. The horizontal data connecting wiring D_HCL may correspond to the horizontal data connecting line H_DCL illustrated in FIG. 5. The horizontal data connecting wiring D_HCL may be electrically connected with the first and second data bridge electrodes D_BCE1 and D_BCE2 illustrated in FIG. 15H and the vertical data connecting wiring D3_VCL illustrated in FIG. 15I.

Figure 17A:
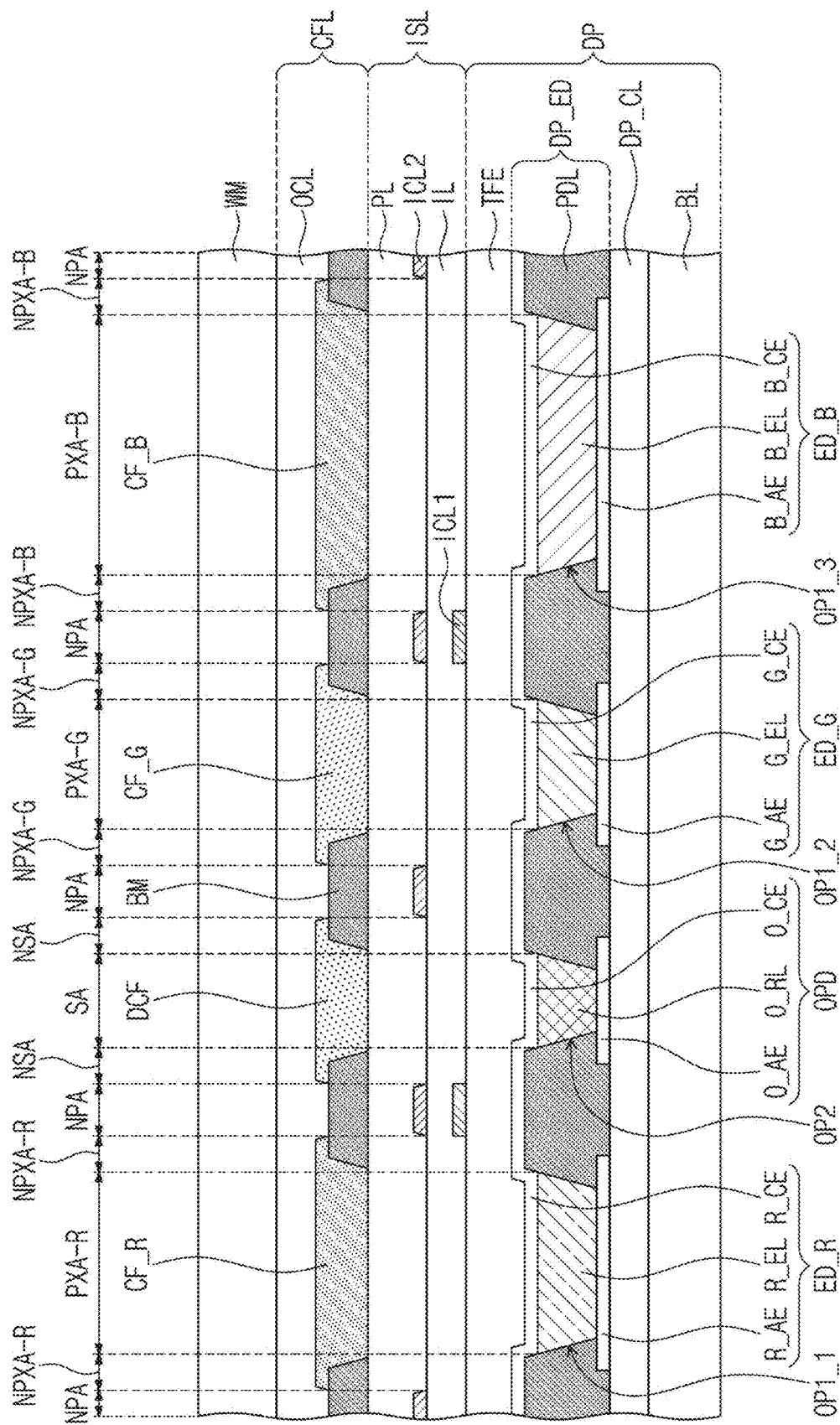
FIGS. 17A and 17B are sectional views illustrating light emitting elements and a light receiving element of the display panel according to one or more embodiments of the present disclosure.
Figure 17B:
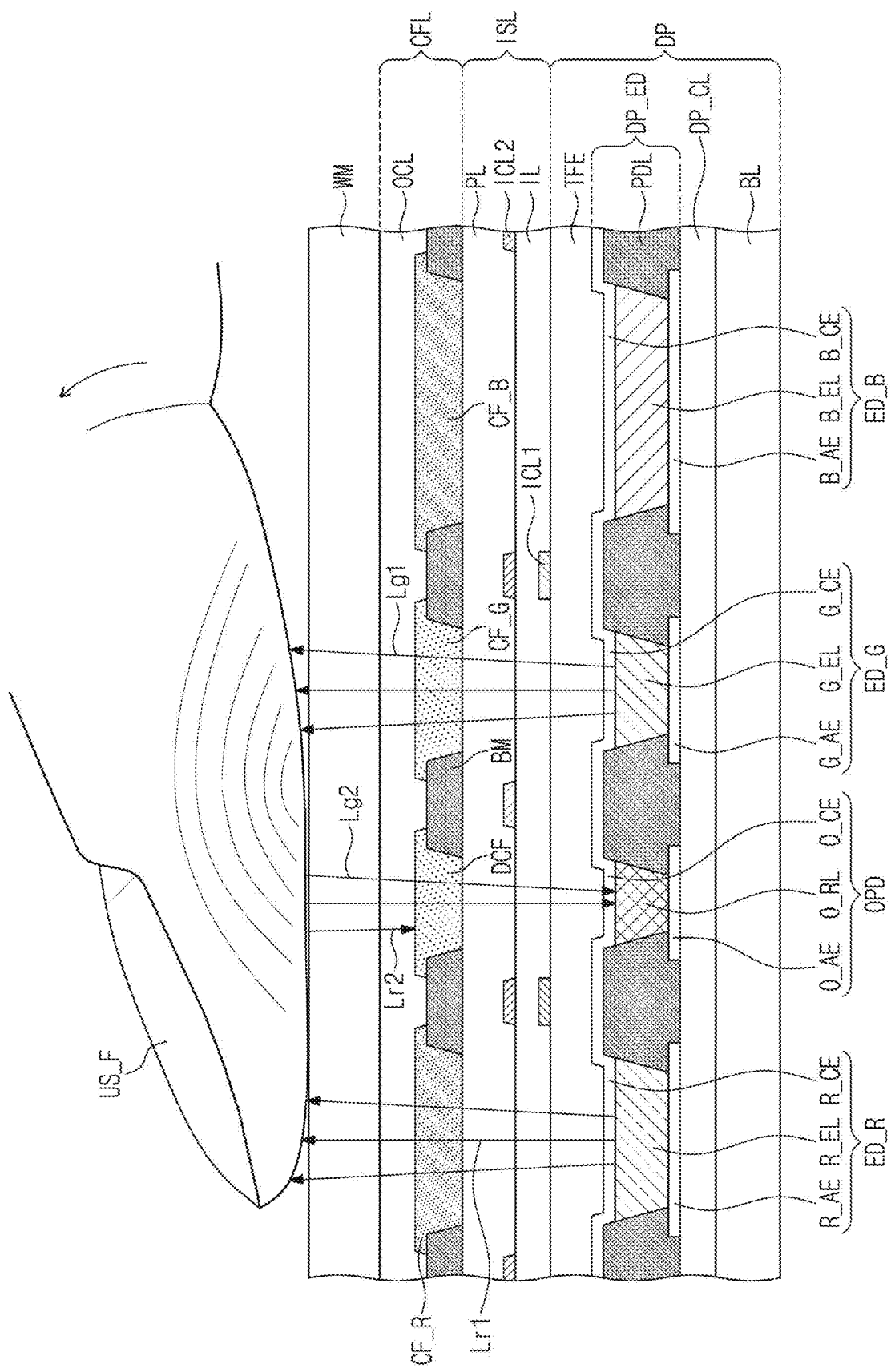

FIGS. 17A and 17B are sectional views illustrating light emitting elements and a light receiving element of the display panel according to one or more embodiments of the present disclosure.

Referring to FIGS. 17A and 17B, a first electrode layer is disposed on the circuit layer DP_CL. The pixel defining layer PDL is formed on the first electrode layer. The first electrode layer may include red, green, and blue anode electrodes R_AE, G_AE, and B_AE. First to third light emitting openings OP1_1, OP1_2, and OP1_3 of the pixel defining layer PDL expose at least portions of the red, green, and blue anode electrodes R_AE, G_AE, and B_AE, respectively. In one or more embodiments of the present disclosure, the pixel defining layer PDL may further include a black material. The pixel defining layer PDL may further include a black organic dye/pigment, such as carbon black, aniline black, and/or the like. The pixel defining layer PDL may be formed by mixing a blue organic material and a black organic material. The pixel defining layer PDL may further include a liquid-repellent organic material.

As illustrated in FIG. 17A, the display panel DP may include first to third emissive regions PXA-R, PXA-G, and PXA-B and first to third non-emissive regions NPXA-R, NPXA-G, and NPXA-B adjacent to the first to third emissive regions PXA-R, PXA-G, and PXA-B. The non-emissive regions NPXA-R, NPXA-G, and NPXA-B may be around (e.g., may surround) the corresponding emissive regions PXA-R, PXA-G, and PXA-B, respectively. In one or more embodiments, the first emissive region PXA-R is defined to correspond to a partial region of the red anode electrode R_AE exposed by the first light emitting opening OP1_1. The second emissive region PXA-G is defined to correspond to a partial region of the green anode electrode G_AE exposed by the second light emitting opening OP1_2. The third emissive region PXA-B is defined to correspond to a partial region of the blue anode electrode B_AE exposed by the third light emitting opening OP1_3. A non-pixel region NPA may be defined between the first to third non-emissive regions NPXA-R, NPXA-G, and NPXA-B.

An emissive layer may be disposed on the first electrode layer. The emissive layer may include red, green, and blue light emitting layers R_EL, G_EL, and B_EL. The red, green, and blue light emitting layers R_EL, G_EL, and B_EL may be disposed in regions corresponding to the first to third light emitting openings OP1_1, OP1_2, and OP1_3, respectively. The red, green, and blue light emitting layers R_EL, G_EL, and B_EL may be formed to be separated from one another. Each of the red, green, and blue light emitting layers R_EL, G_EL, and B_EL may include an organic material and/or an inorganic material. The red, green, and blue light emitting layers R_EL, G_EL, and B_EL may generate light beams having suitable colors (e.g., predetermined colors). For example, the red light emitting layer R_EL may generate red light, the green light emitting layer G_EL may generate green light, and the blue light emitting layer B_EL may generate blue light.

Although the patterned red, green, and blue light emitting layers R_EL, G_EL, and B_EL are illustrated in this embodiment, one emissive layer may be commonly disposed in the first to third emissive regions PXA_R, PXA_G, and PXA_B. In this case, the emissive layer may generate white light or blue light. In addition, the emissive layer may have a multi-layer structure called tandem.

Each of the red, green, and blue light emitting layers R_EL, G_EL, and B_EL may include a low molecular weight organic material or a high molecular weight organic material as a luminescent material. Alternatively, each of the red, green, and blue light emitting layers R_EL, G_EL, and B_EL may include a quantum-dot material as a luminescent material. A core of a quantum dot may be selected from Group II-VI compounds, Group III-V compounds, Group IV-VI compounds, Group IV elements, Group IV compounds, and/or combinations thereof.

A second electrode layer is disposed on the red, green, and blue light emitting layers R_EL, G_EL, and B_EL. The second electrode layer may include red, green, and blue cathode electrodes R_CE, G_CE, and B_CE. The red, green, and blue cathode electrodes R_CE, G_CE, and B_CE may be electrically connected with one another. In one or more embodiments of the present disclosure, the red, green, and blue cathode electrodes R_CE, G_CE, and B_CE may be integrally formed. In this case, the red, green, and blue cathode electrodes R_CE, G_CE, and B_CE may be commonly disposed in the first to third emissive regions PXA-R, PXA-G, and PXA-B, the first to third non-emissive regions NPXA-R, NPXA-G, and NPXA-B, and the non-pixel region NPA.

The element layer DP_ED may further include the light receiving element OPD. The light receiving element OPD may be a photo diode. The pixel defining layer PDL may further include a light receiving opening OP2 provided to correspond to the light receiving element OPD.

The light receiving element OPD may include a sensing anode electrode O_AE, a photoelectric conversion layer O_RL, and a sensing cathode electrode O_CE. The sensing anode electrode O_AE and the first electrode layer may be disposed on (e.g., at) the same layer. That is, the sensing anode electrode O_AE may be disposed on the circuit layer DP_CL and may be concurrently (e.g., simultaneously) formed through the same process as the red, green, and blue anode electrodes R_AE, G_AE, and B_AE.

The light receiving opening OP2 of the pixel defining layer PDL exposes at least a portion of the sensing anode electrode O_AE. The photoelectric conversion layer O_RL is disposed on the sensing anode electrode O_AE exposed by the light receiving opening OP2. The photoelectric conversion layer O_RL may include an organic photo sensing material. The sensing cathode electrode O_CE may be disposed on the photoelectric conversion layer O_RL. The sensing cathode electrode O_CE may be concurrently (e.g., simultaneously) formed through the same process as the red, green, and blue cathode electrodes R_CE, G_CE, and B_CE. In one or more embodiments of the present disclosure, the sensing cathode electrode O_CE may be integrally formed with the red, green, and blue cathode electrodes R_CE, G_CE, and B_CE to form the common cathode electrode C_CE (refer to FIG. 6).

The encapsulation layer TFE is disposed on the element layer DP_ED. The encapsulation layer TFE includes at least an inorganic layer and/or an organic layer. In one or more embodiments of the present disclosure, the encapsulation layer TFE may include two inorganic layers and an organic layer disposed therebetween. In one or more embodiments of the present disclosure, the encapsulation layer TFE may include a plurality of inorganic layers and a plurality of organic layers alternately stacked one above another.

The inorganic layers protect the red, green, and blue light emitting elements ED_R, ED_G, and ED_B and the light receiving element OPD from moisture/oxygen, and the organic layers protect the red, green, and blue light emitting elements ED_R, ED_G, and ED_B and the light receiving element OPD from foreign matter such as dust particles. The inorganic layers may include a silicon nitride layer, a silicon oxy nitride layer, a silicon oxide layer, a titanium oxide layer, and/or an aluminum oxide layer, but are not particularly limited thereto. The organic layers may include an acrylic organic layer, but are not particularly limited.

The display device DD includes the input sensing layer ISL disposed on the display panel DP and the color filter layer CFL disposed on the input sensing layer ISL.

The input sensing layer ISL may be directly disposed on the encapsulation layer TFE. The input sensing layer ISL includes a first conductive layer ICL1, an insulating layer IL, a second conductive layer ICL2, and a protective layer PL. The first conductive layer ICL1 may be disposed on the encapsulation layer TFE. Although FIGS. 17A and 17B illustrate the structure in which the first conductive layer ICL1 is directly disposed on the encapsulation layer TFE, the present disclosure is not limited thereto. The input sensing layer ISL may further include a base insulating layer disposed between the first conductive layer ICL1 and the encapsulation layer TFE. In this case, the encapsulation layer TFE may be covered by the base insulating layer, and the first conductive layer ICL1 may be disposed on the base insulating layer. In one or more embodiments of the present disclosure, the base insulating layer may include an inorganic insulating material.

The insulating layer IL may cover the first conductive layer ICL1. The second conductive layer ICL2 is disposed on the insulating layer IL. Although FIGS. 17A and 17B illustrate the structure in which the input sensing layer ISL includes the first and second conductive layers ICL1 and ICL2, the present disclosure is not limited thereto. For example, the input sensing layer ISL may include only one of the first and second conductive layers ICL1 and ICL2.

The protective layer PL may be disposed on the second conductive layer ICL2. The protective layer PL may include an organic insulating material. The protective layer PL may serve to protect the first and second conductive layers ICL1 and ICL2 from moisture/oxygen and may serve to protect the first and second conductive layers ICL1 and ICL2 from foreign matter.

The color filter layer CFL may be disposed on the input sensing layer ISL. The color filter layer CFL may be directly disposed on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. In one or more embodiments of the present disclosure, the first color may be red, the second color may be green, and the third color may be blue.

The color filter layer CFL may further include a dummy color filter DCF. In one or more embodiments of the present disclosure, when a region where the photoelectric conversion layer O_RL is disposed is defined as a sensing region SA and a region around the sensing region SA is defined as a non-sensing region NSA, the dummy color filter DCF may be disposed to correspond to the sensing region SA. The dummy color filter DCF may overlap the sensing region SA and the non-sensing region NSA. In one or more embodiments of the present disclosure, the dummy color filter DCF may have the same color as one of the first to third color filters CF_R, CF_G, and CF_B. In one or more embodiments of the present disclosure, the dummy color filter DCF may have the same green color as the second color filter CF_G.

The color filter layer CFL may further include a black matrix BM. The black matrix BM may be disposed to correspond to the non-pixel region NPA. The black matrix BM may be disposed to overlap the first and second conductive layers ICL1 and ICL2 in the third direction DR3 in the non-pixel region NPA. In one or more embodiments of the present disclosure, the black matrix BM may overlap the non-pixel region NPA and the first to third non-emissive regions NPXA-G, NPXA-B, and NPXA-R. The black matrix BM may not overlap the first to third emissive regions PXA-R, PXA-G, and PXA-B.

The color filter layer CFL may further include an over-coating layer OCL. The over-coating layer OCL may include an organic insulating material. The over-coating layer OCL may have a thickness sufficient to remove steps between the first to third color filters CF_R, CF_G, and CF_B. Without any specific limitation, the over-coating layer OCL may include any material that has a suitable thickness (e.g., a predetermined thickness) and is capable of flattening the upper surface of the color filter layer CFL. For example, the over-coating layer OCL may include an acrylate-based organic material.

Referring to FIG. 17B, when the display device DD (refer to FIG. 1) operates, the red, green, and blue light emitting elements ED_R, ED_G, and ED_B may output light. The red light emitting elements ED_R output red light in a red wavelength band, the green light emitting elements ED_G output green light in a green wavelength band, and the blue light emitting elements ED_B output blue light in a blue wavelength band.

In one or more embodiments of the present disclosure, the light receiving element OPD may receive light from specific light emitting elements (e.g., the green light emitting elements ED_G) from among the red, green, and blue light emitting elements ED_R, ED_G, and ED_B. That is, second light Lg1 may be output from the green light emitting elements ED_G, and the light receiving element OPD may receive second reflected light Lg2 obtained by reflection of the second light Lg1 by a user's fingerprint. The second light Lg1 and the second reflected light Lg2 may be green light in the green wavelength band. The dummy color filter DCF is disposed over the light receiving element OPD. The dummy color filter DCF may be green in color. Accordingly, the second reflected light Lg2 may pass through the dummy color filter DCF and may be incident to the light receiving element OPD.

In one or more embodiments, red light and blue light output from the red and blue light emitting elements ED_R and ED_B may also be reflected by the user's hand US_F. For example, when light obtained by reflection of red light Lr1 output from the red light emitting elements ED_R by the user's hand US_F is defined as first reflected light Lr2, the first reflected light Lr2 may fail to pass through the dummy color filter DCF and may be absorbed by the dummy color filer DCF. Accordingly, the first reflected light Lr2 cannot pass through the dummy color filter DCF and cannot be incident to the light receiving element OPD. Likewise, even though blue light is reflected by the user's hand US_F, the blue light may be absorbed by the dummy color filter DCF. Thus, only the second reflected light Lg2 may be provided to the light receiving element OPD.

As described above, portions of the data connecting lines for connecting the data lines and the driver chip and portions of the connecting lines for connecting the second readout lines and the sensor chips may be disposed in the display region. Accordingly, the area of the region occupied by the connecting lines in the non-display region may be reduced, and thus the area of dead space of the display panel may be reduced.

In addition, the voltage lines included in the display panel may be arranged in the mesh structure. Accordingly, voltages may be uniformly supplied to the entire display region of the display panel. In particular, the voltage lines connected to the sensor may be arranged in the mesh structure. Accordingly, deterioration in sensing accuracy due to a drop in the voltage applied to the sensor may be prevented.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a base layer having a display region and a non-display region;
a circuit layer on the base layer;
an element layer on the circuit layer, the element layer comprising light emitting elements and light receiving elements corresponding to the display region; and
a data driver electrically connected to the circuit layer,
wherein the circuit layer comprises:
pixel drive circuits connected to the light emitting elements;
sensor drive circuits connected to the light receiving elements;
readout lines connected to the sensor drive circuits;
first data lines connected to a first group of pixel drive circuits from among the pixel drive circuits and disposed in a first display region of the display region;
second data lines spaced from the first data lines in a first direction, connected to a second group of pixel drive circuits from among the pixel drive circuits, and disposed in a second display region of the display region; and
data connecting lines electrically connected with the second data lines, respectively, in the display region,
wherein the first data lines are connected to the data driver, and the second data lines are connected to the data driver through the data connecting lines, and
wherein the readout lines are disposed between the first data lines in the first display region, and are disposed between the second data lines in the second display region.

2. The display device of claim 1, wherein the data connecting lines comprise:
a plurality of vertical data connecting lines configured to extend along the first data lines; and
a plurality of horizontal data connecting lines configured to extend in the first direction, and
wherein the plurality of horizontal data connecting lines electrically connect the plurality of vertical data connecting lines to the second data lines.

3. The display device of claim 2, wherein the plurality of horizontal data connecting lines are at a layer different from a layer on which the plurality of vertical data connecting lines are located.

4. The display device of claim 3, wherein the plurality of horizontal data connecting lines comprises:
first horizontal data connecting lines configured to overlap the sensor drive circuits; and
second horizontal data connecting lines configured to overlap the pixel drive circuits and electrically connected with the first horizontal data connecting lines, and
wherein the first horizontal data connecting lines are at a layer different from a layer on which the second horizontal data connecting lines are located.

5. The display device of claim 3, wherein the plurality of vertical data connecting lines and the first data lines are at a same layer, and
wherein the plurality of vertical data connecting lines are at a layer different from a layer on which the readout lines are located.

6. The display device of claim 3, wherein the circuit layer further comprises:
a first data bridge electrode configured to electrically connect each of the plurality of horizontal data connecting lines with a corresponding vertical data connecting line from among the plurality of vertical data connecting lines; and
a second data bridge electrode configured to electrically connect each of the plurality of horizontal data connecting lines with a corresponding second data line from among the second data lines.

7. The display device of claim 6, wherein the first and second data bridge electrodes and the readout lines are at a same layer.

8. The display device of claim 2, wherein the readout lines comprise:
first readout lines connected to a first group of sensor drive circuits from among the sensor drive circuits; and
second readout lines spaced from the first readout lines in the first direction and connected to a second group of sensor drive circuits from among the sensor drive circuits, and
wherein the circuit layer further comprises readout connecting lines electrically connected with the second readout lines, respectively, in the display region.

9. The display device of claim 8, wherein the readout connecting lines comprise:
a plurality of vertical readout connecting lines configured to extend along the first readout lines; and
a plurality of horizontal readout connecting lines configured to extend in the first direction, and
wherein the plurality of horizontal readout connecting lines electrically connect the plurality of vertical readout connecting lines to the second readout lines.

10. The display device of claim 9, wherein the plurality of horizontal readout connecting lines are at a layer different from a layer on which the plurality of vertical readout connecting lines are located,
wherein the plurality of vertical readout connecting lines are at a layer different from a layer on which the second readout lines are located, and
wherein the plurality of vertical readout connecting lines, and the first and second data lines are at a same layer.

11. The display device of claim 10, wherein the circuit layer further comprises a bridge contact electrode configured to electrically connect each of the plurality of horizontal readout connecting lines with a corresponding vertical readout connecting line from among the plurality of vertical readout connecting lines.

12. The display device of claim 11, wherein the bridge contact electrode and the second readout lines are disposed on the same layer.

13. The display device of claim 9, wherein the plurality of horizontal readout connecting lines and the plurality of horizontal data connecting lines are at a same layer, and
wherein the plurality of vertical readout connecting lines and the plurality of vertical data connecting lines are at a same layer.

14. The display device of claim 1, wherein the circuit layer further comprises:
a first drive voltage line connected to the pixel drive circuits;
a second drive voltage line connected to the light emitting elements and the light receiving elements; and
a reset voltage line connected to the sensor drive circuits.

15. The display device of claim 14, wherein the readout lines, the first drive voltage line, and the reset voltage line are at a same layer.

16. The display device of claim 15, further comprising:
a shielding reset wiring overlapping the reset voltage line, wherein the shielding reset wiring, and the first and second data lines are at a same layer.

17. The display device of claim 14, wherein the second drive voltage line comprises:
a horizontal drive voltage line extending in the first direction; and
a vertical drive voltage line extending in a second direction crossing the first direction, and
wherein the vertical drive voltage line is at a layer different from a layer on which the horizontal drive voltage line is located.

18. The display device of claim 1, wherein the circuit layer further comprises:
a first initialization voltage line connected to the pixel drive circuits and configured to apply a first initialization voltage; and
a second initialization voltage line connected to the pixel drive circuits and configured to apply a second initialization voltage.

19. The display device of claim 18, wherein the first initialization voltage line comprises:
a first horizontal initialization voltage line extending in the first direction; and
a first vertical initialization voltage line extending in a second direction crossing the first direction, wherein the first vertical initialization voltage line and the first horizontal initialization voltage line are at different layers.

20. The display device of claim 19, wherein the second initialization voltage line comprises:
a second horizontal initialization voltage line extending in the first direction; and
a second vertical initialization voltage line extending in the second direction, wherein the second vertical initialization voltage line is at a layer different from a layer on which the second horizontal initialization voltage line is located.

21. The display device of claim 18, wherein the light emitting elements comprise:
a first light emitting element configured to output a first color light;
a second light emitting element configured to output a second color light; and
a third light emitting element configured to output a third color light, and
wherein the second initialization voltage line comprises:
a second-first initialization voltage line connected to at least one of the first to third light emitting elements and configured to apply a second-first initialization voltage; and
a second-second initialization voltage line connected to other ones of the first to third light emitting elements and configured to apply a second-second initialization voltage.

22. The display device of claim 21, wherein the second-first initialization voltage has a voltage level different from a voltage level of the second-second initialization voltage.

23. The display device of claim 18, wherein each of the sensor drive circuits comprises:
a reset transistor comprising a first electrode configured to receive a reset voltage, a second electrode connected with a first sensing node, and a third electrode configured to receive a reset control signal;
an amplifying transistor comprising a first electrode configured to receive a sensor drive voltage, a second electrode connected with a second sensing node, and a third electrode connected with the first sensing node; and
an output transistor comprising a first electrode connected with the second sensing node, a second electrode connected with a corresponding readout line from among the readout lines, and a third electrode configured to receive an output control signal.

24. The display device of claim 23, wherein the second initialization voltage line is connected to the first electrode of the amplifying transistor and applies the second initialization voltage as the sensor drive voltage.

25. An electronic device comprising:
a display panel including a display region and a non-display region adjacent to the display region;
a driver chip connected to the display panel; and
a sensor chip connected to the display panel,
wherein the display panel comprises:
light emitting elements;
light receiving elements;
pixel drive circuits connected to the light emitting elements;
sensor drive circuits connected to the light receiving elements;
readout lines connected to the sensor drive circuits and the sensor chip;
first data lines connected to a first group of pixel drive circuits from among the pixel drive circuits and disposed in a first display region of the display region;
second data lines spaced from the first data lines in a first direction, connected to a second group of pixel drive circuits from among the pixel drive circuits, and disposed in a second display region of the display region; and
data connecting lines electrically connected with the second data lines, respectively, in the display region,
wherein the first data lines are connected to the driver chip, and the second data lines are connected to the driver chip through the data connecting lines, and
wherein the readout lines are disposed between the first data lines in the first display region and are disposed between the second data lines in the second display region.

26. The electronic device of claim 25, wherein the driver chip and the sensor chip are adjacent to one side of the display region.

27. The electronic device of claim 25, wherein the data connecting lines comprise:
a plurality of vertical data connecting lines extending along the first data lines; and
a plurality of horizontal data connecting lines extending in the first direction, and
wherein the plurality of horizontal data connecting lines electrically connect the plurality of vertical data connecting lines to the second data lines.

28. The electronic device of claim 27, wherein the display panel further comprises:
a first data bridge electrode configured to electrically connect each of the plurality of horizontal data connecting lines with a corresponding vertical data connecting line from among the plurality of vertical data connecting lines; and
a second data bridge electrode configured to electrically connect each of the plurality of horizontal data connecting lines with a corresponding second data line from among the second data lines.

29. The electronic device of claim 25, wherein the readout lines comprise:
- first readout lines connected to a first group of sensor drive circuits from among the sensor drive circuits; and
- second readout lines spaced from the first readout lines in the first direction and connected to a second group of sensor drive circuits from among the sensor drive circuits, and
- wherein the display panel further comprises connecting lines electrically connected with the second readout lines, respectively, in the display region.

30. The electronic device of claim 29, wherein the connecting lines comprise:
- a plurality of vertical connecting lines extending along the first readout lines; and
- a plurality of horizontal connecting lines extending in the first direction, and
- wherein the plurality of horizontal connecting lines electrically connect the plurality of vertical connecting lines to the second readout lines.

31. The electronic device of claim 30, wherein the display panel further comprises a bridge contact electrode configured to electrically connect each of the plurality of horizontal connecting lines with a corresponding vertical connecting line from among the plurality of vertical connecting lines.

* * * * *